(12) United States Patent
Tanaka et al.

(10) Patent No.: US 8,054,683 B2
(45) Date of Patent: Nov. 8, 2011

(54) SEMICONDUCTOR MEMORY DEVICE INCLUDING CHARGE STORAGE LAYER AND CONTROL GATE

(75) Inventors: Rieko Tanaka, Yokohama (JP); Takumi Abe, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/563,566

(22) Filed: Sep. 21, 2009

(65) Prior Publication Data

US 2010/0034020 A1 Feb. 11, 2010

(30) Foreign Application Priority Data

Oct. 8, 2008 (JP) ................................. 2008-262050

(51) Int. Cl.
*G11C 16/04* (2006.01)

(52) U.S. Cl. ......... 365/185.03; 365/185.21; 365/185.23; 365/185.01; 365/185.12; 365/185.26

(58) Field of Classification Search ............. 365/185.03, 365/185.21, 185.23, 185.01, 185.12, 185.26
See application file for complete search history.

(56) References Cited

U.S. PATENT DOCUMENTS 7,443,757 B2 10/2008 Cernea et al.

2006/0244013 A1* 11/2006 Matsunaga et al. ........... 257/209
2008/0205163 A1 8/2008 Park et al.
2009/0067236 A1 3/2009 Isobe et al.

FOREIGN PATENT DOCUMENTS

JP 2002-280388 9/2002

OTHER PUBLICATIONS

U.S. Appl. No. 12/885,066, filed Sep. 17, 2010, Shiino, et al.

\* cited by examiner

*Primary Examiner* — Thong Q Le
(74) *Attorney, Agent, or Firm* — Oblon, Spivak, McClelland, Maier & Neustadt, L.L.P.

(57) ABSTRACT

A semiconductor memory device includes a plurality of memory cells, signal lines, and a control unit. Each of the plurality of memory cells includes a charge storage layer. Each of the plurality of memory cells includes a control gate and is configured to hold two-or-higher-level data. Each of signal lines is electrically connected with a gate or one end of a current path of each of the memory cells. Each of signal lines has a line width which differs depending on each interval between the memory cells adjacent to each other. The control unit controls a voltage applied to each of the signal lines in accordance with the line width of each of the signal lines.

24 Claims, 42 Drawing Sheets

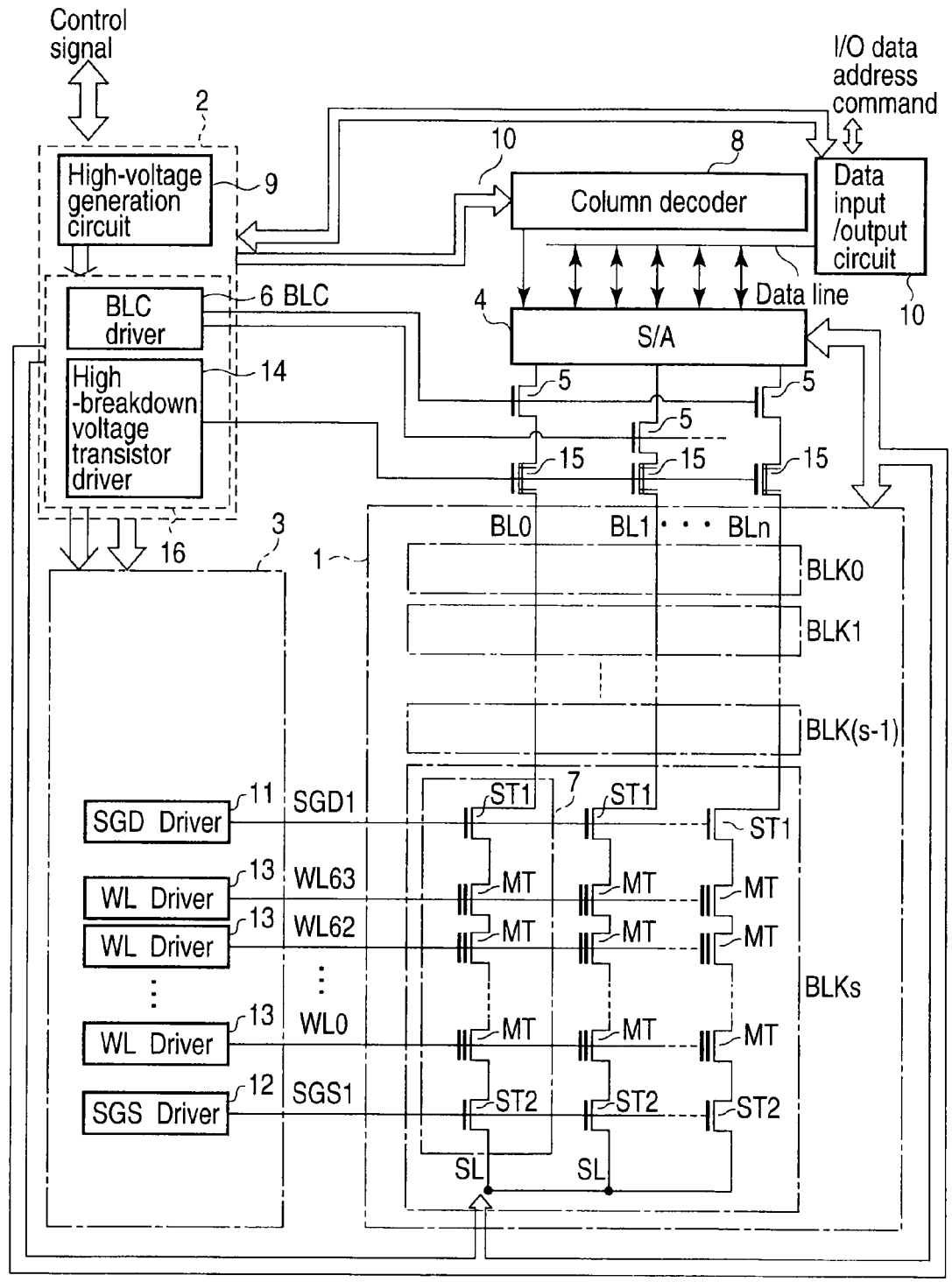
F I G. 1

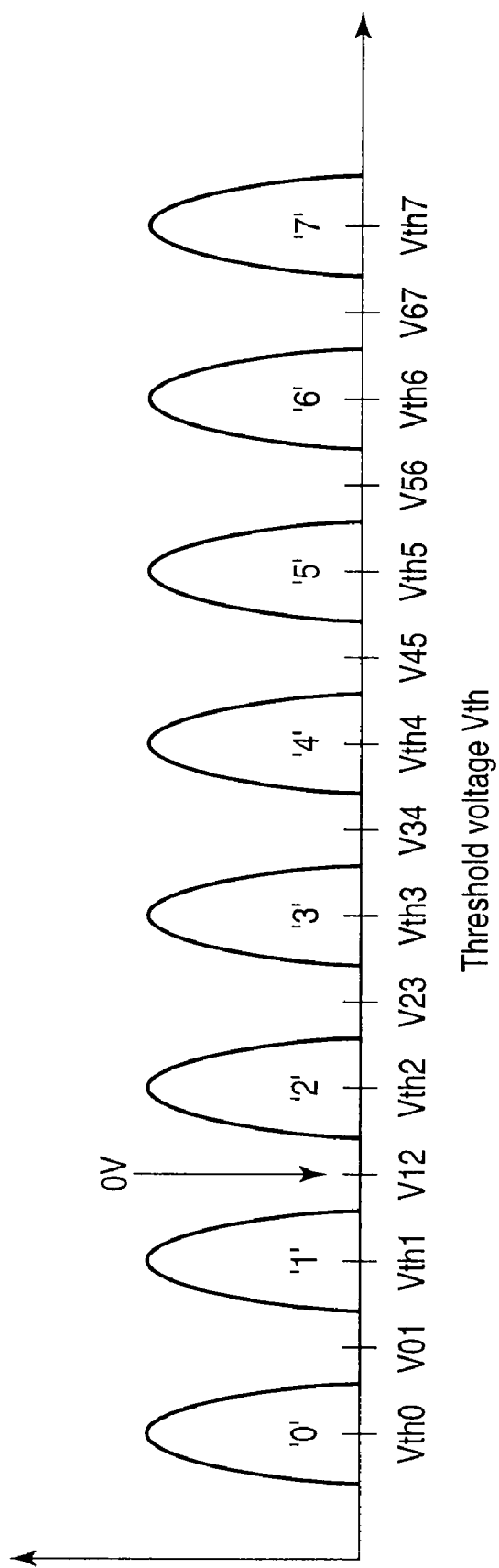
F I G. 2

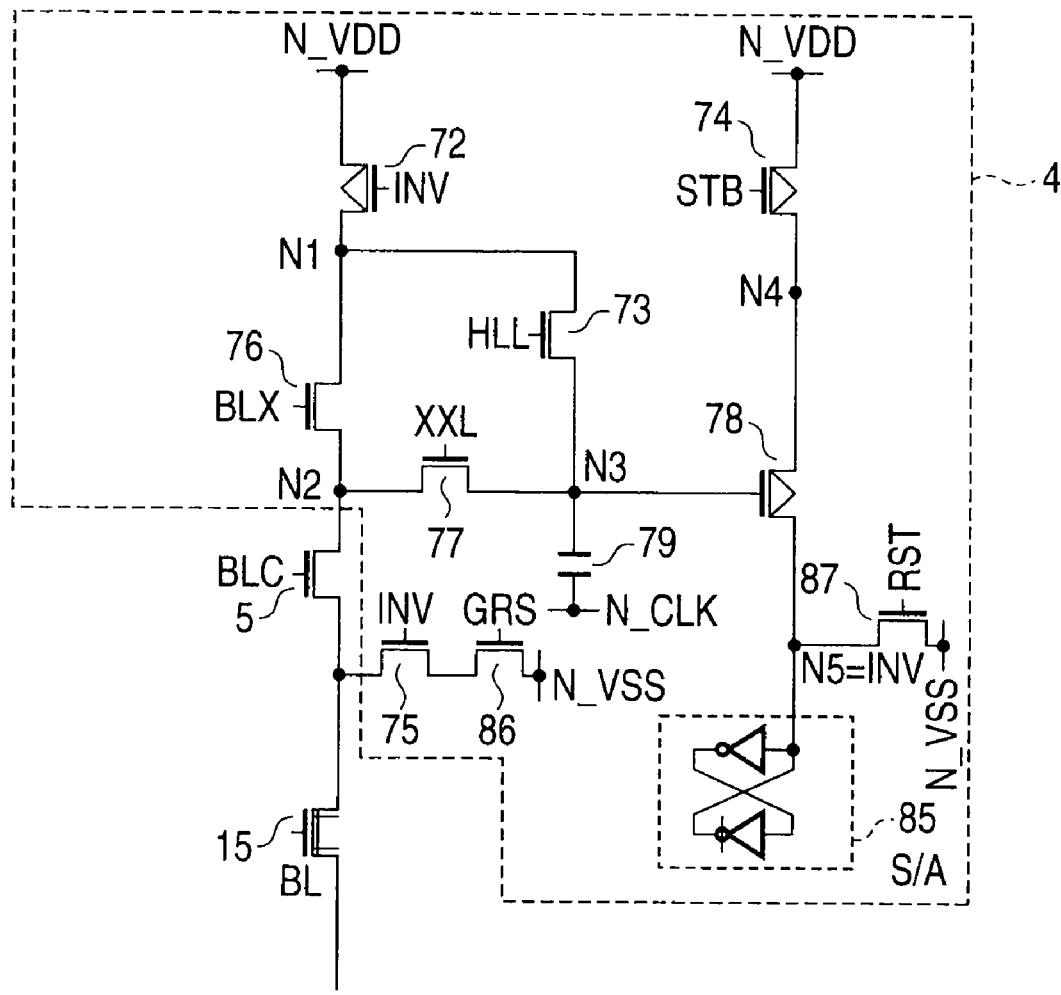
F I G. 6

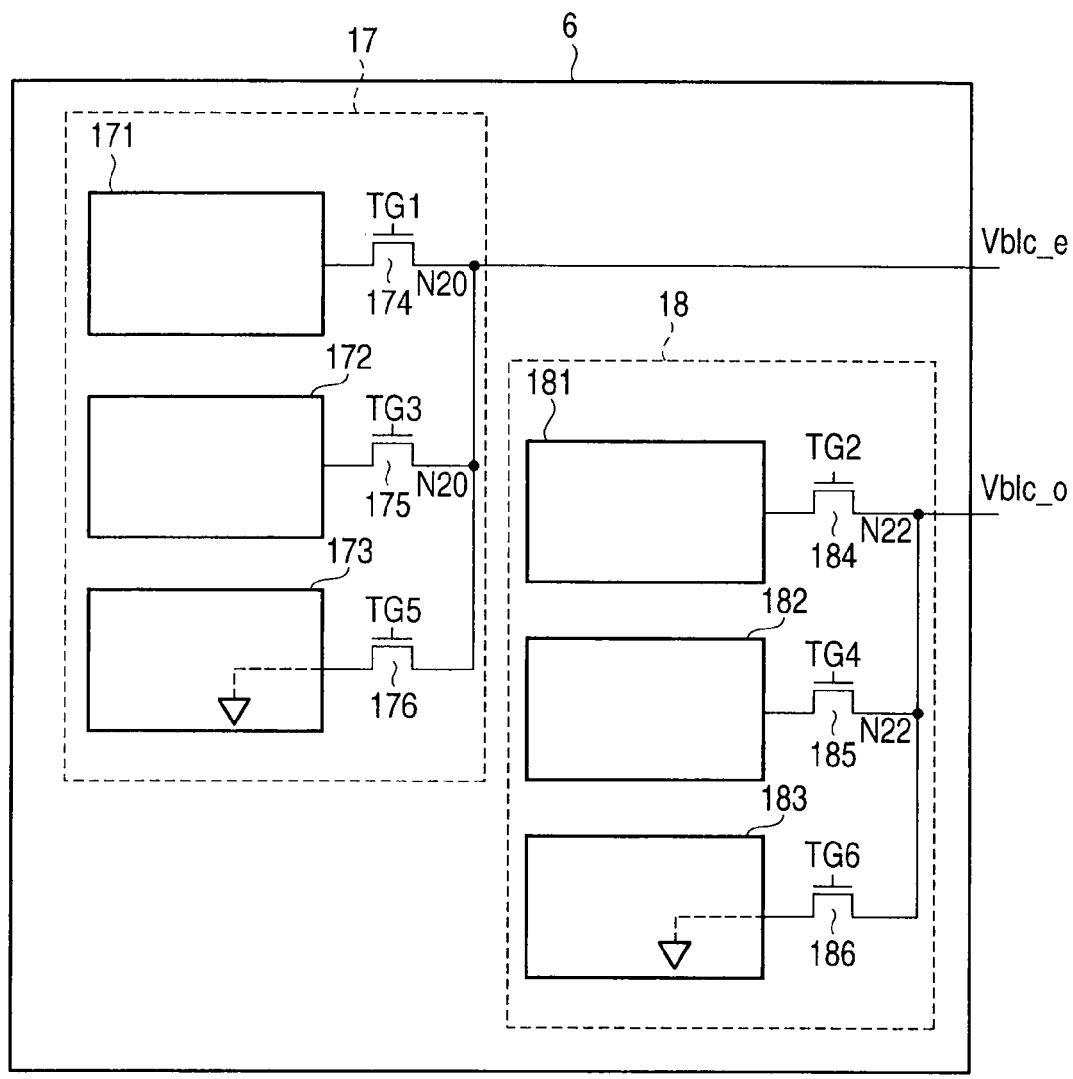
F I G. 7

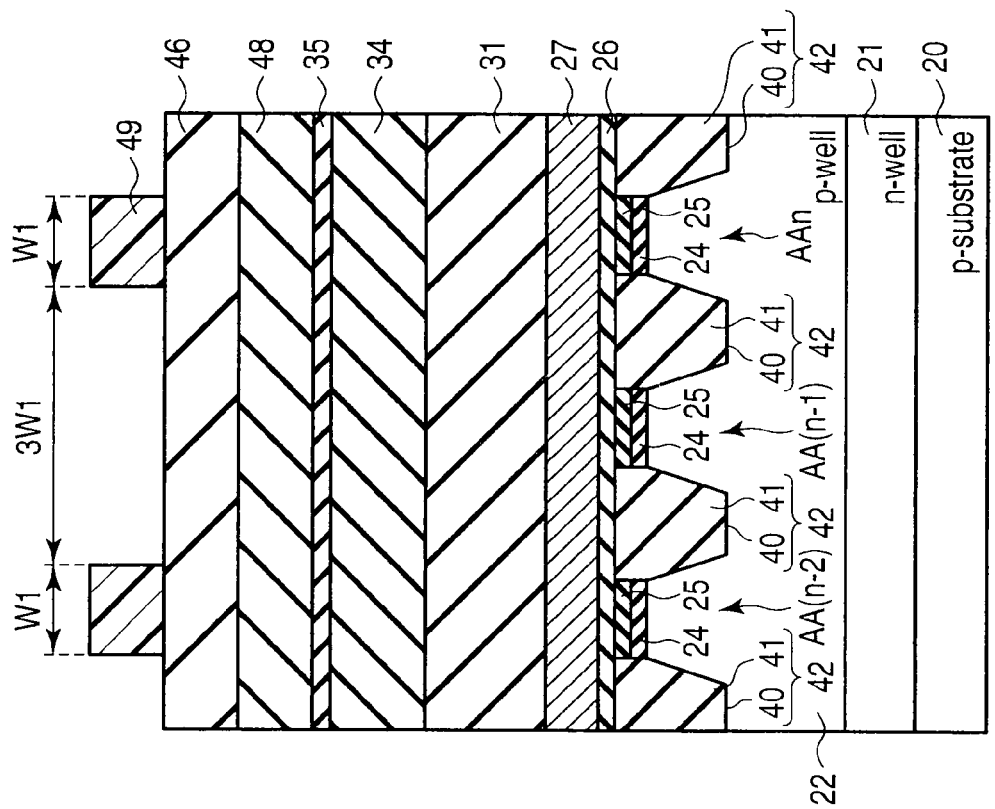
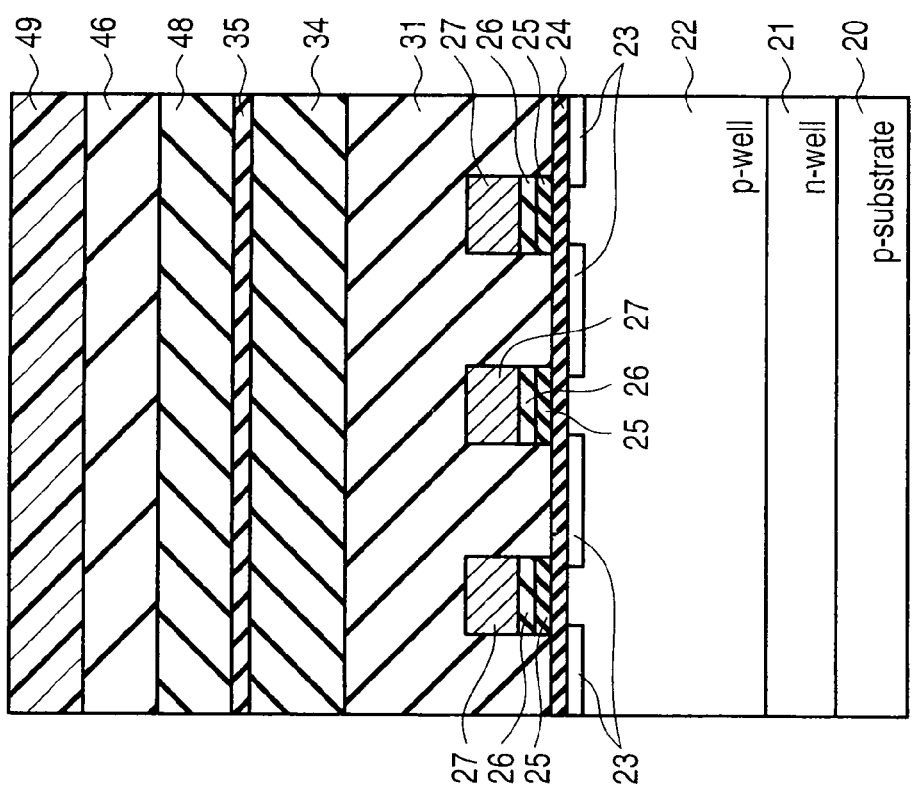
FIG. 11A
FIG. 11B

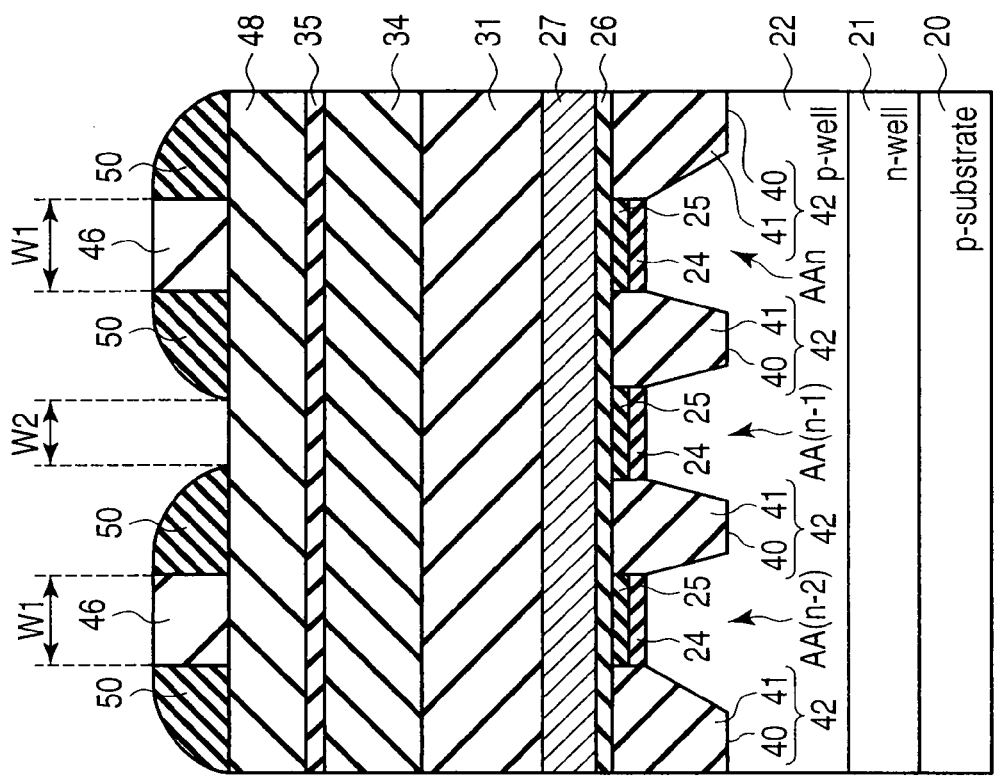
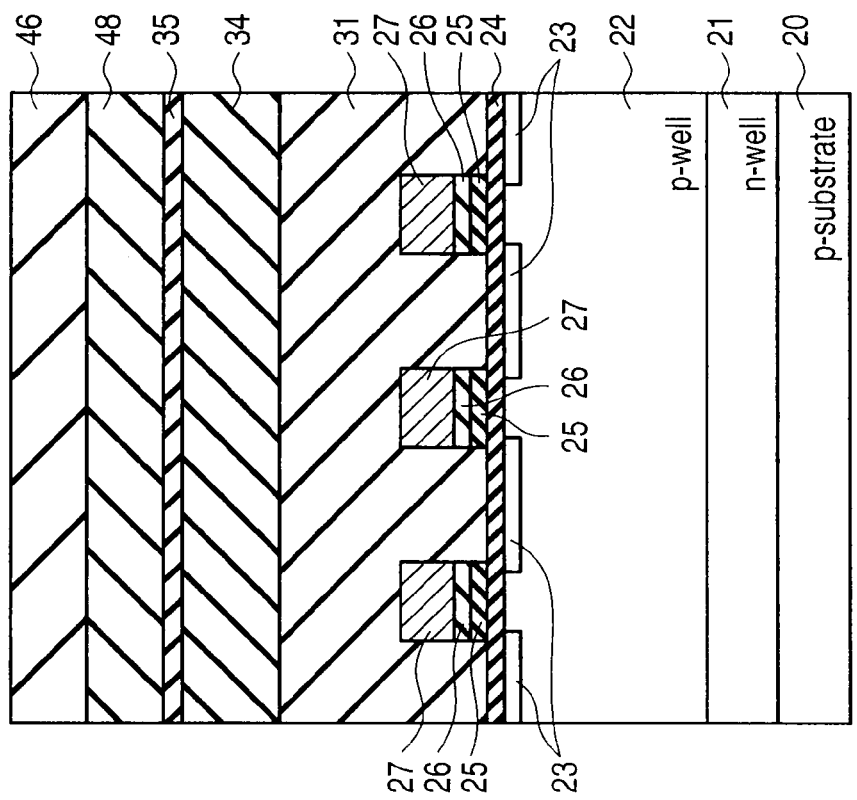

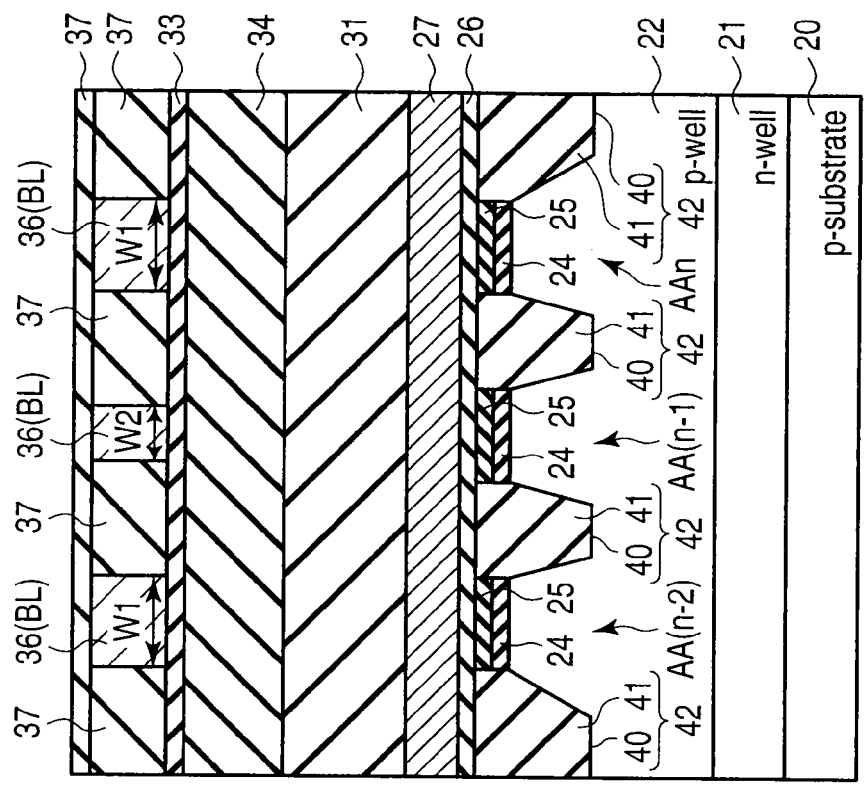
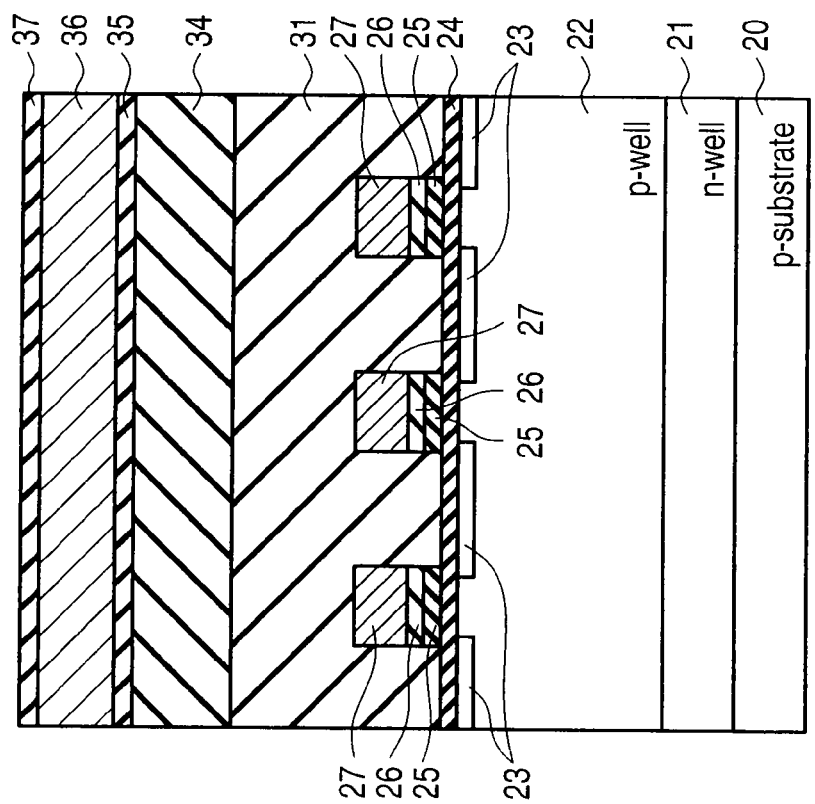
FIG. 16B
FIG. 16A

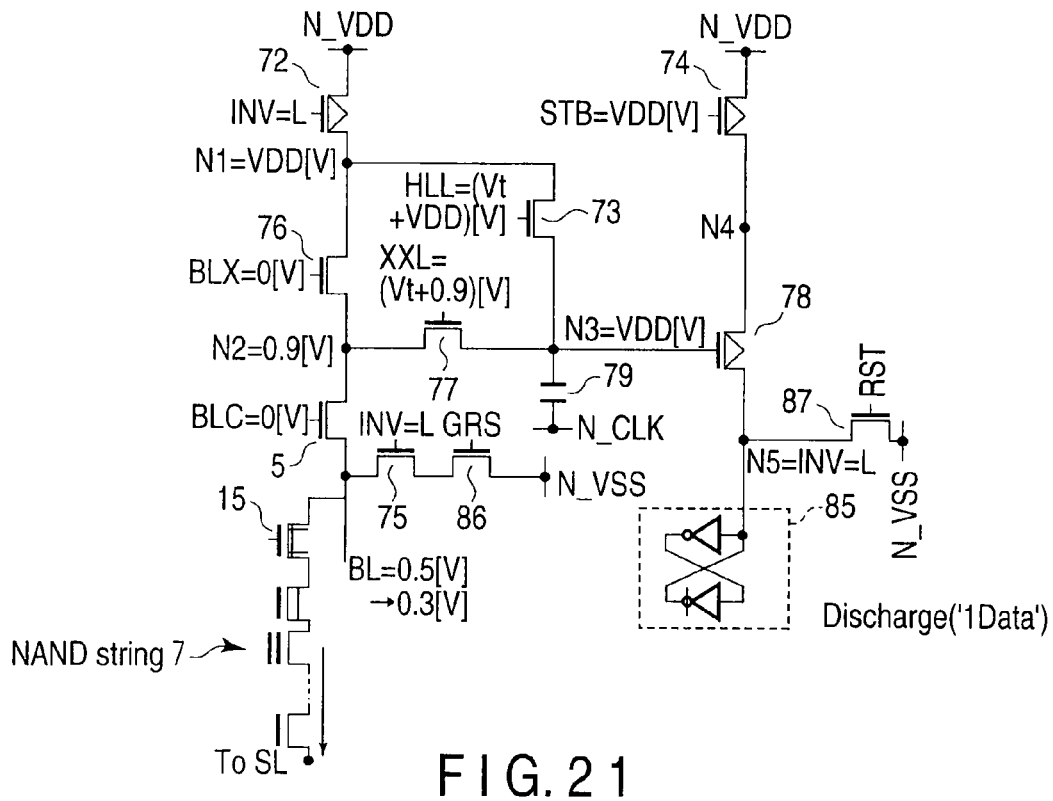
F I G. 21
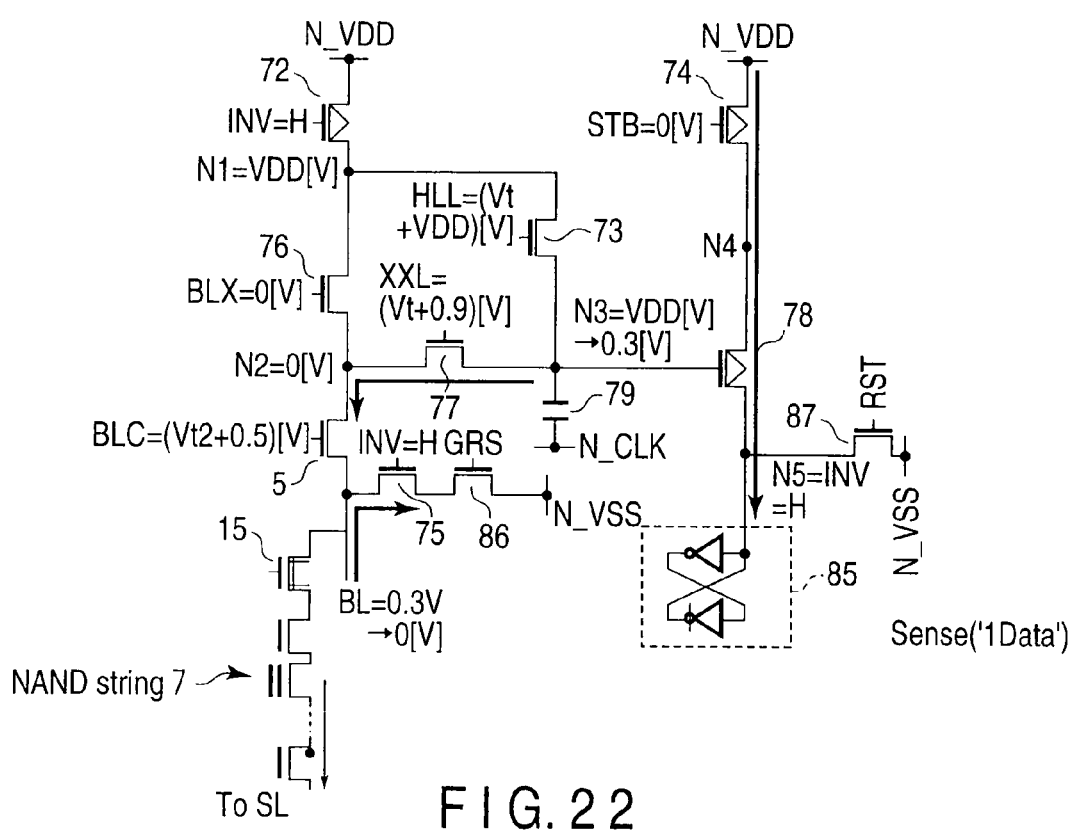
F I G. 22

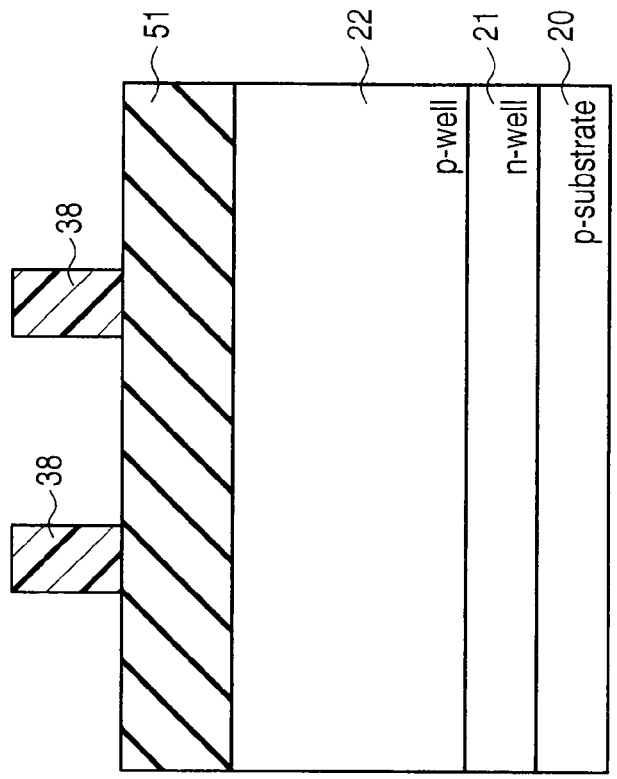
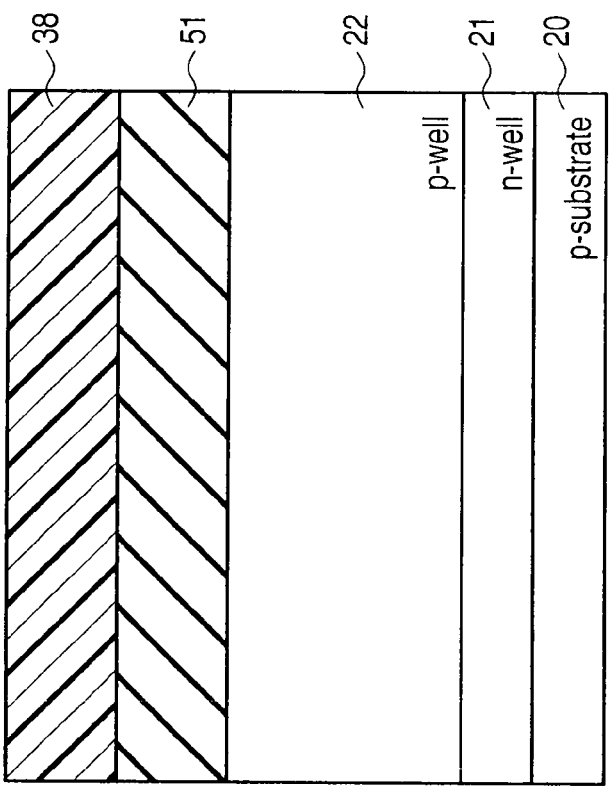
FIG. 26A
FIG. 26B

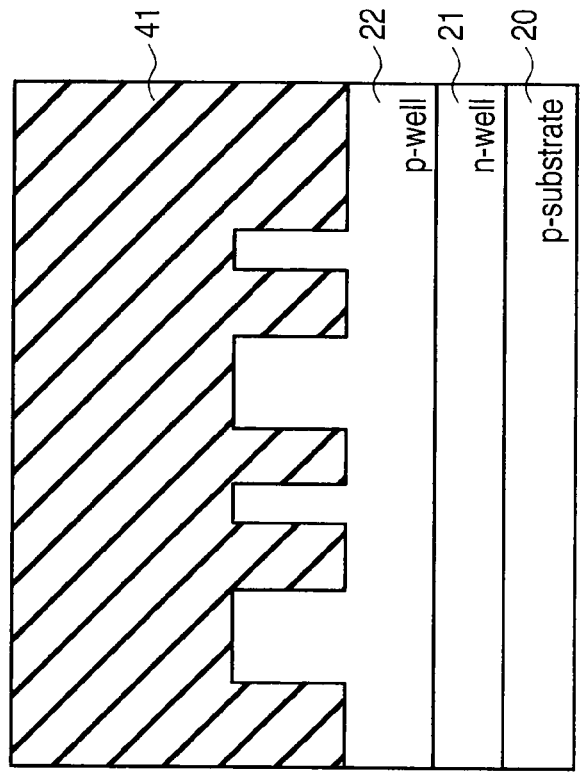
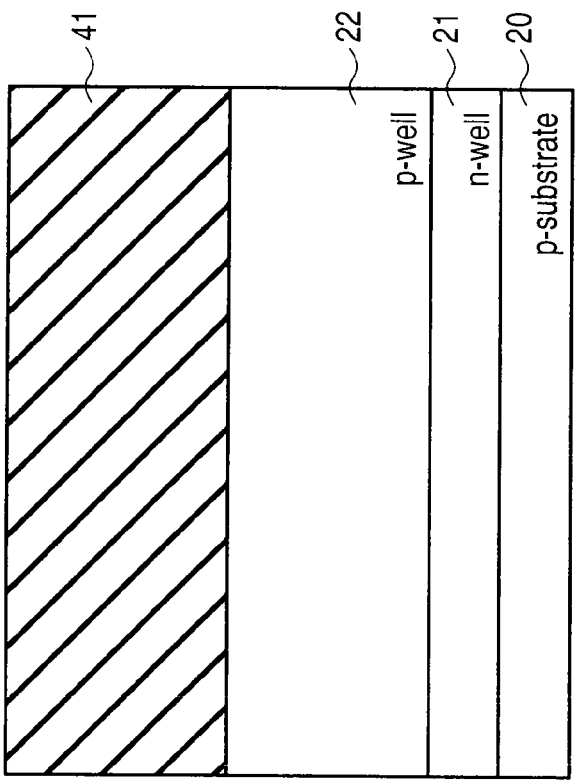
FIG. 31B
FIG. 31A

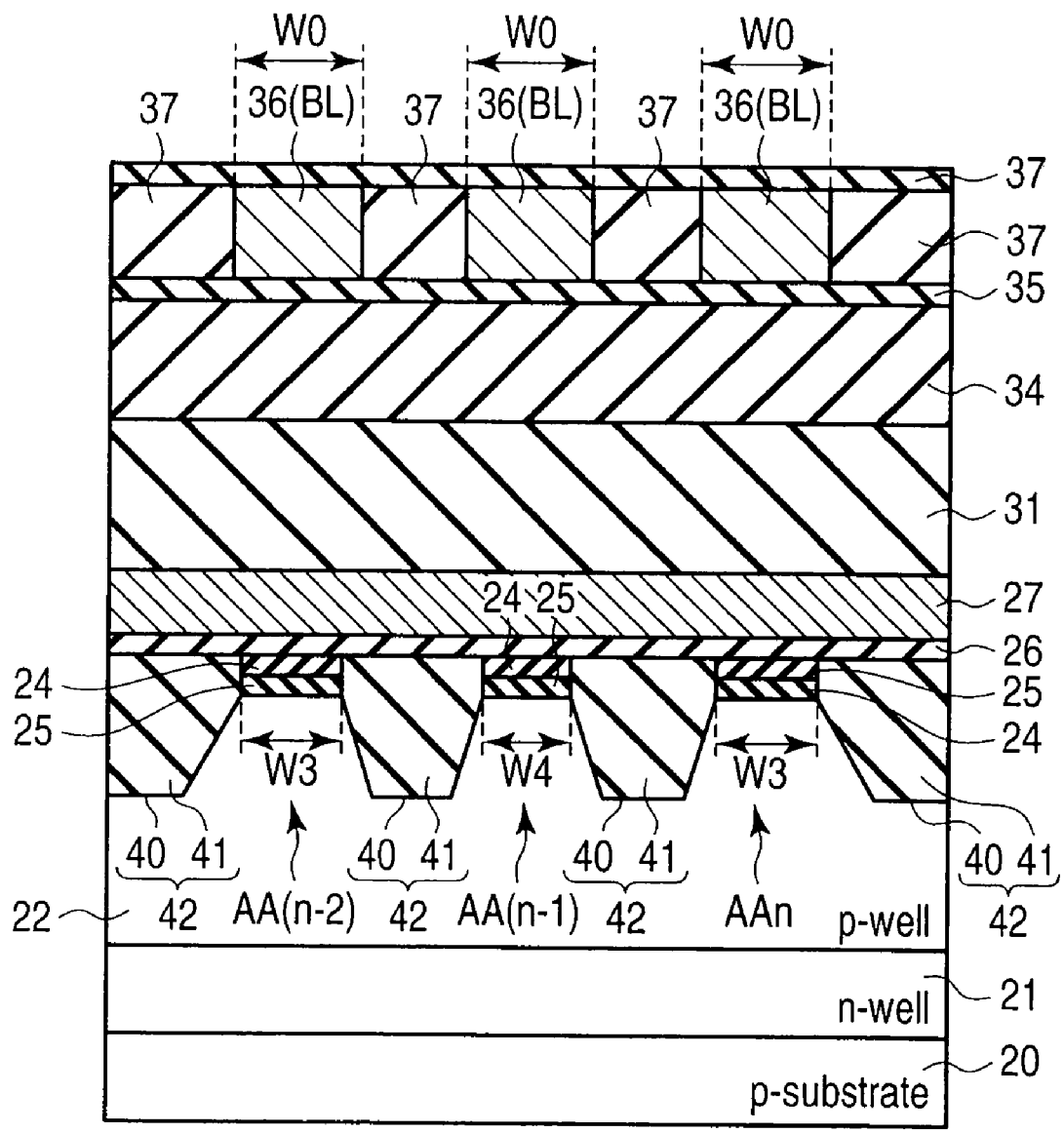
F I G. 3 5

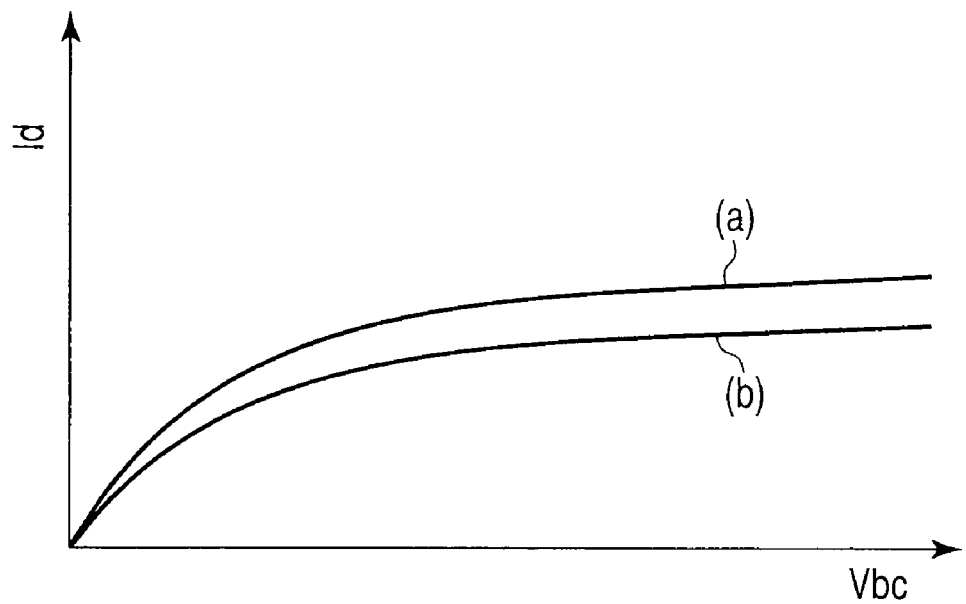
F I G. 3 6
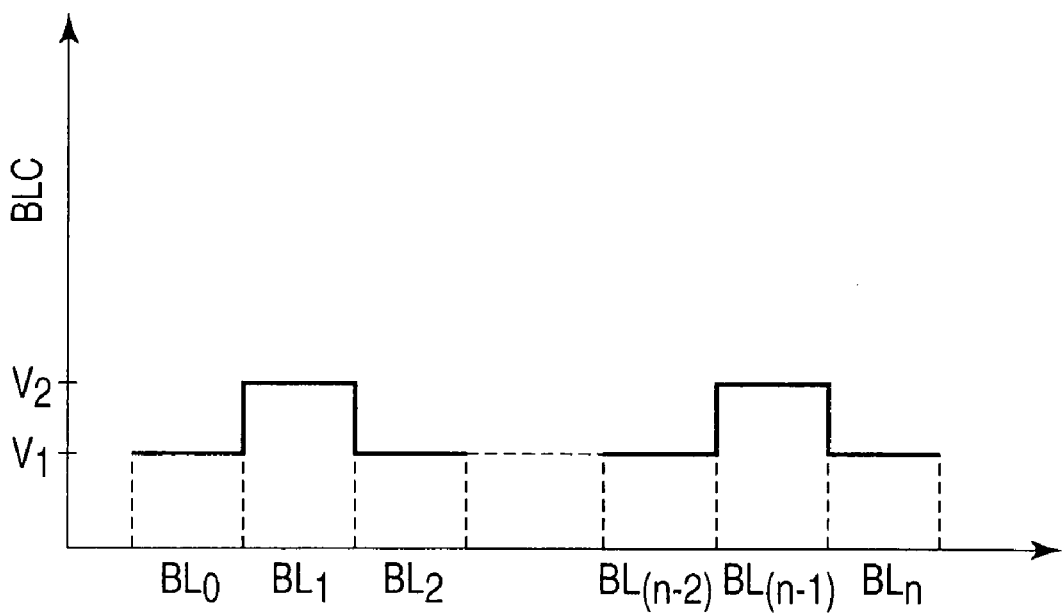
F I G. 3 7

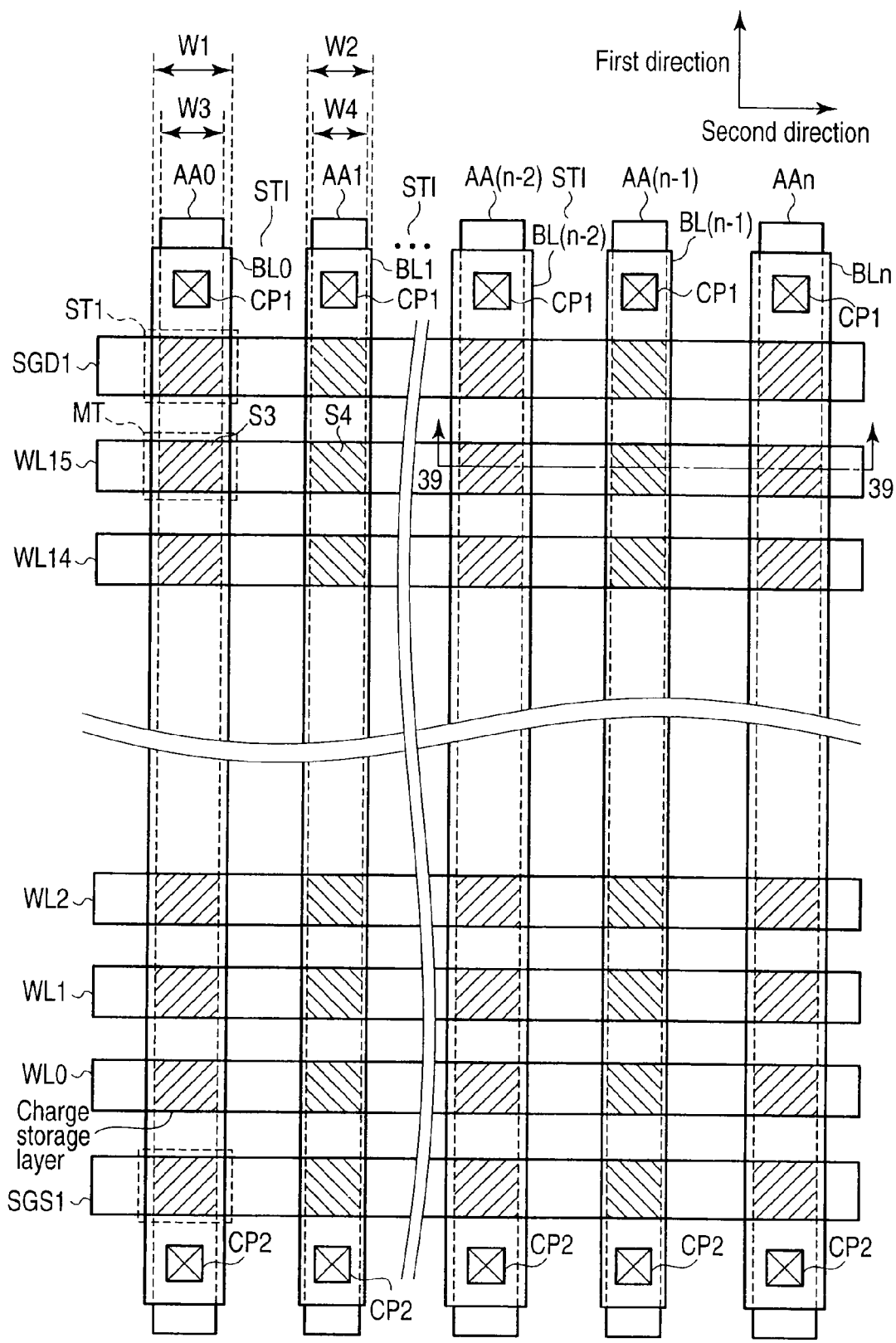
F I G. 38

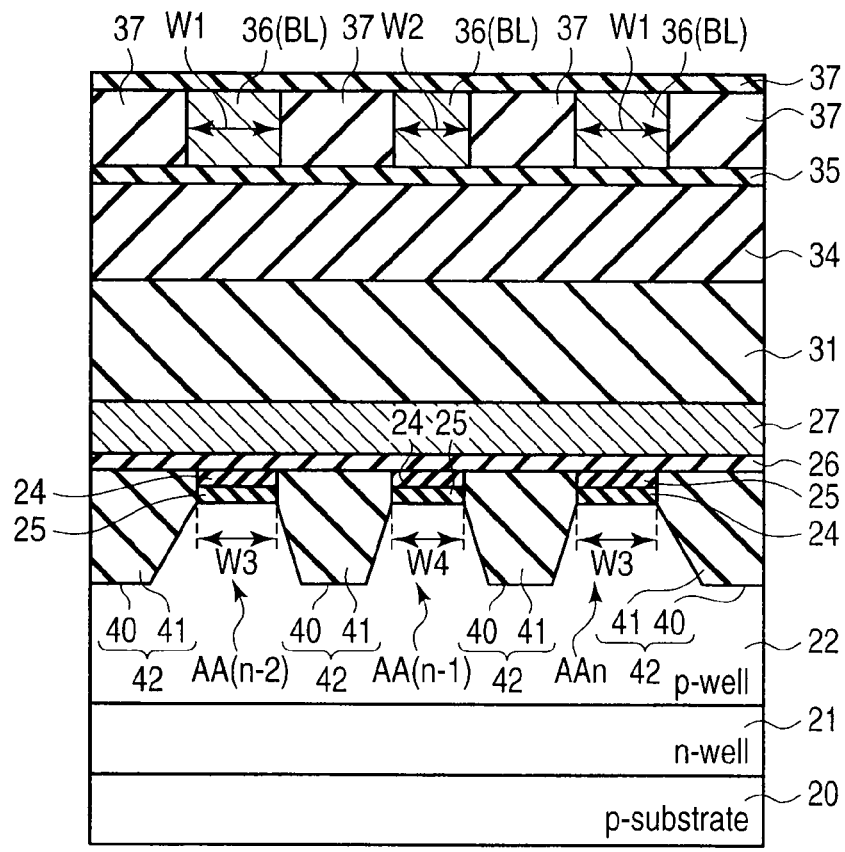
F I G. 3 9
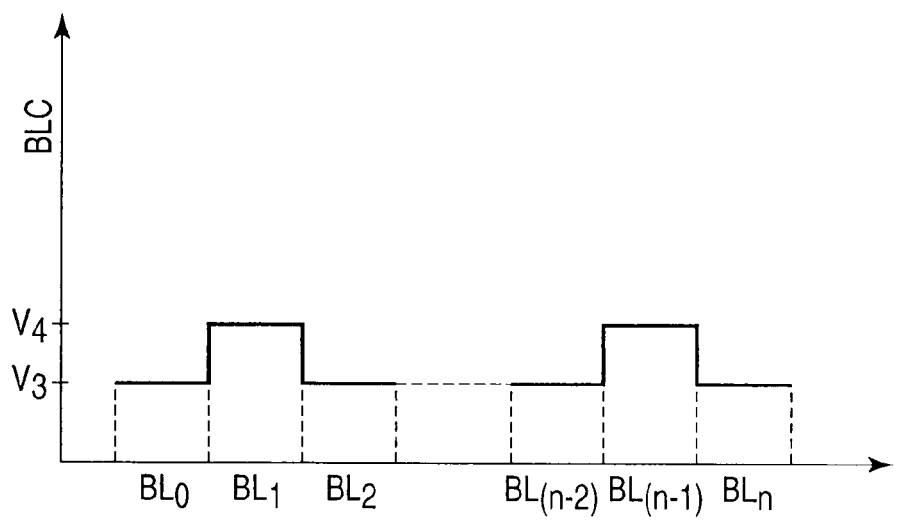
F I G. 4 0

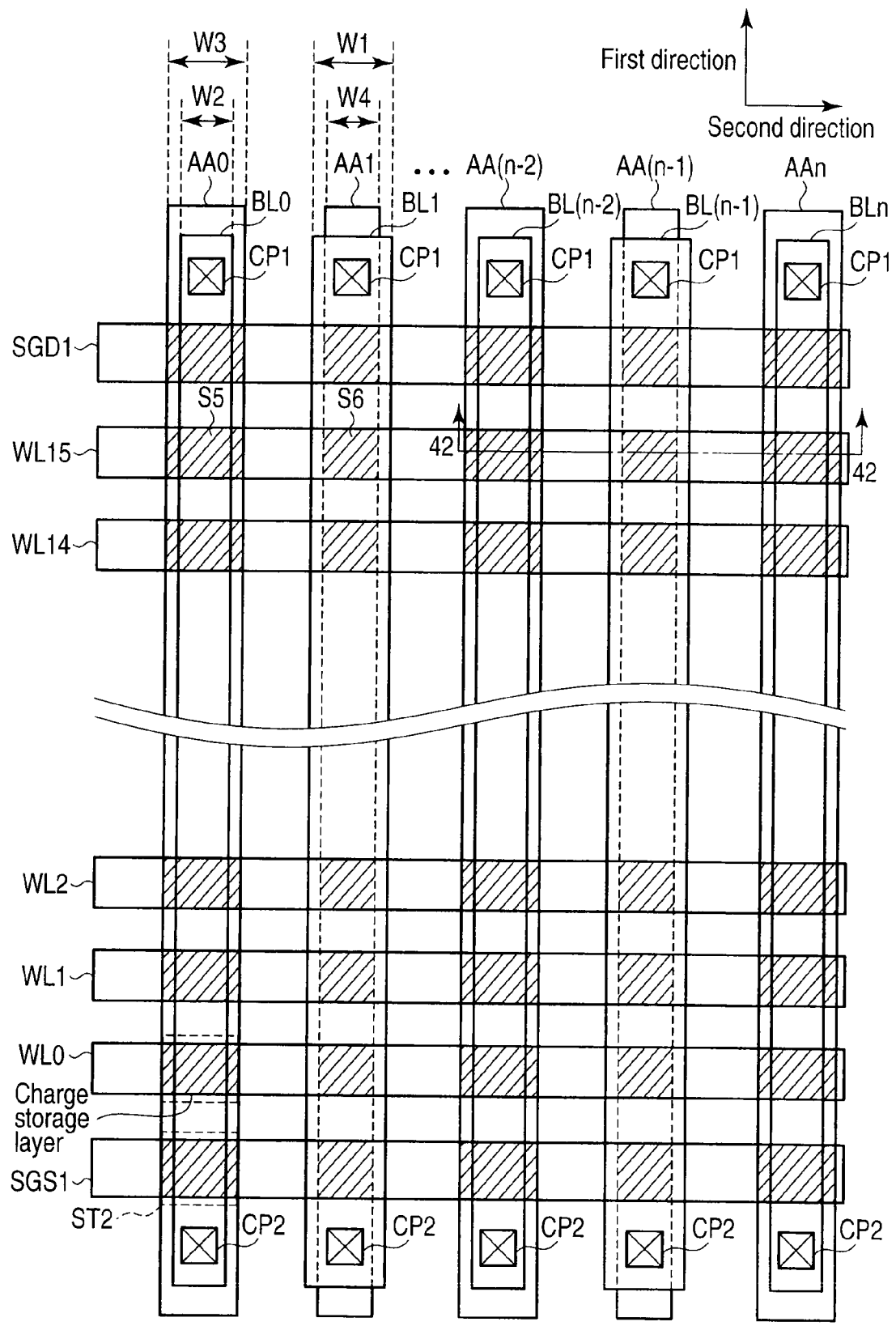
F I G. 41

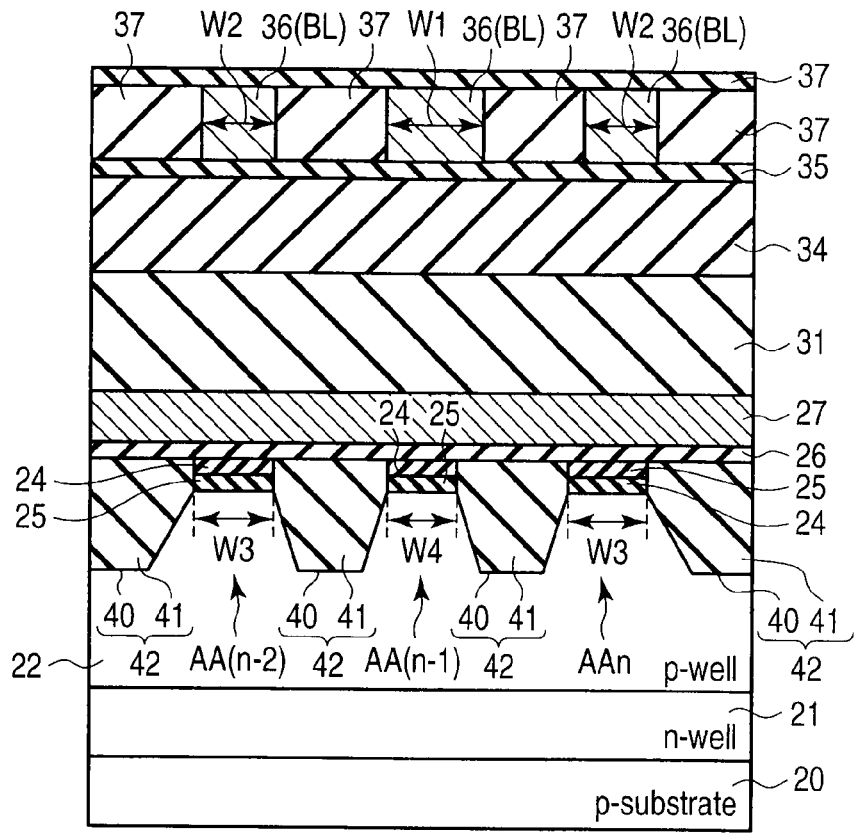
F I G. 4 2
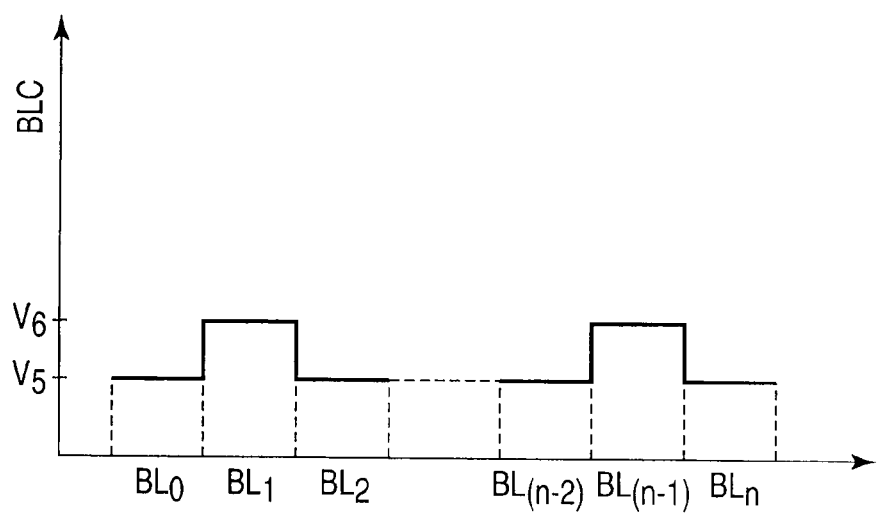
F I G. 4 3

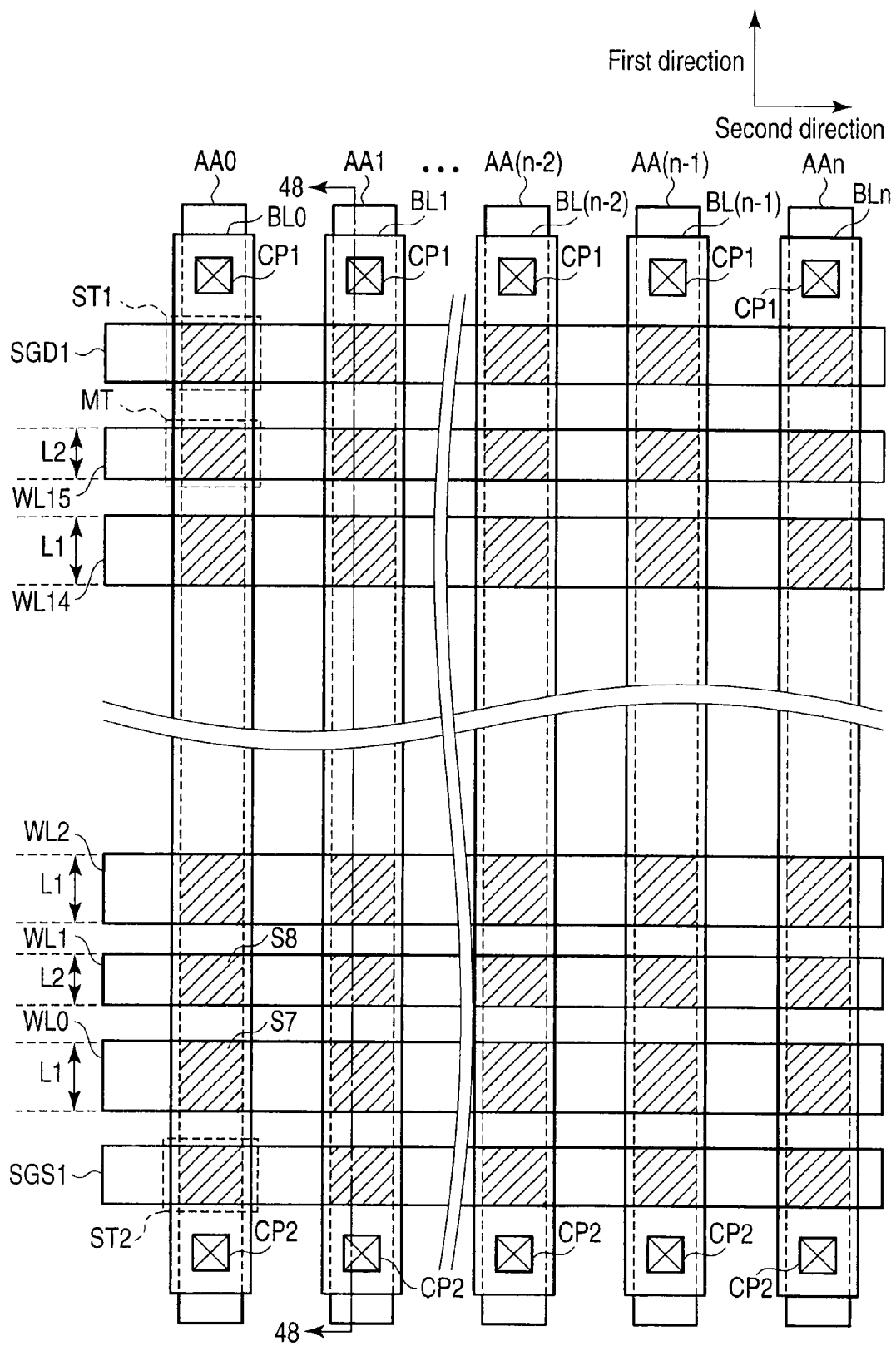
F I G. 47

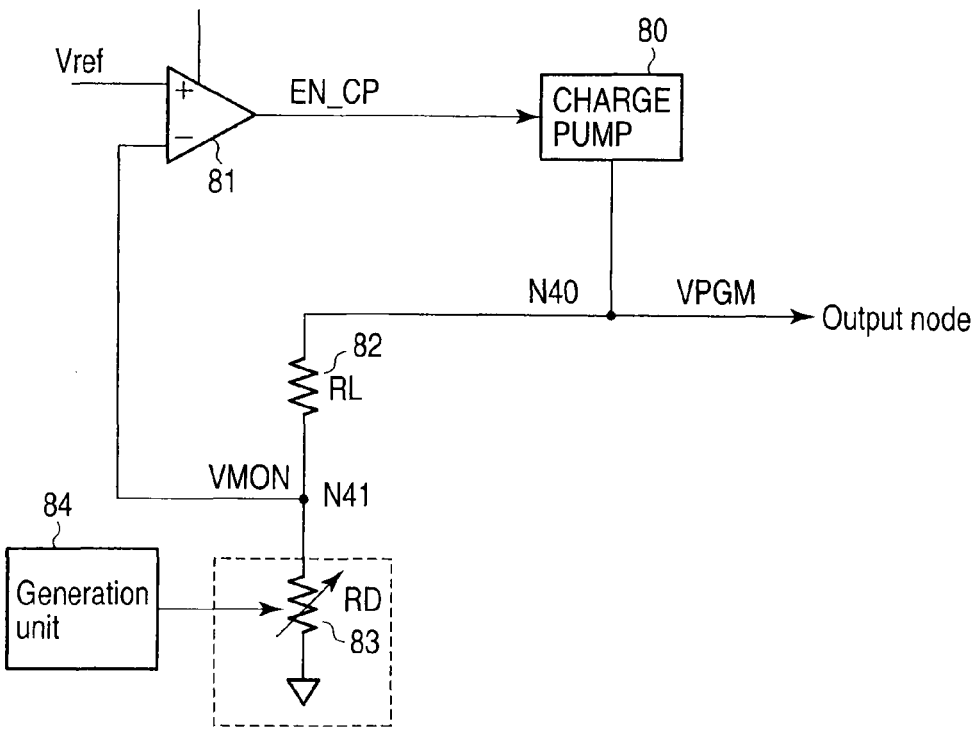
F I G. 49
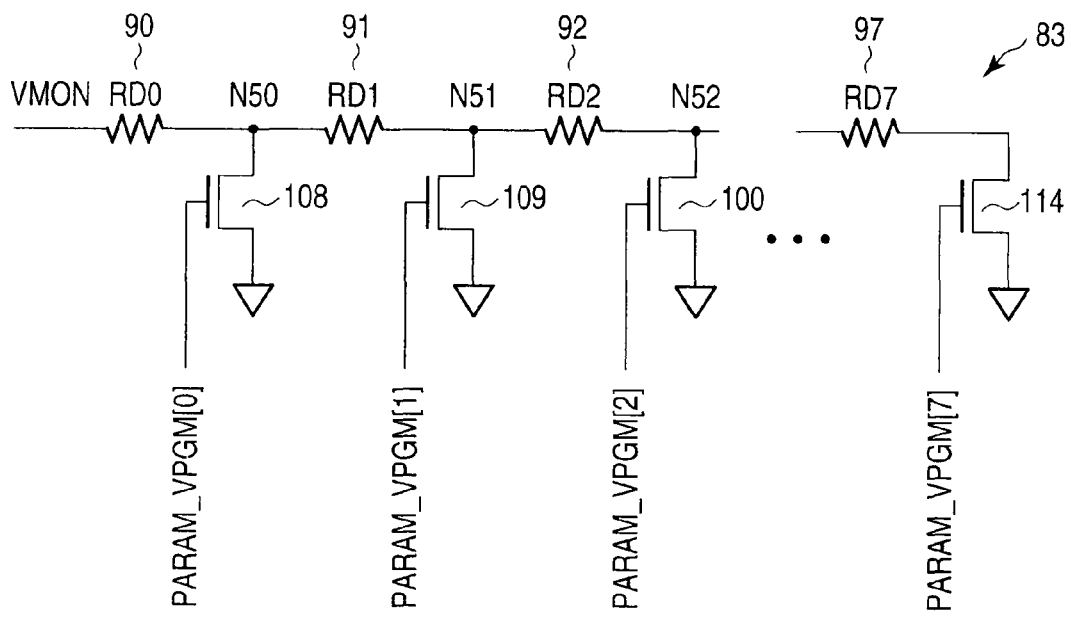
F I G. 50

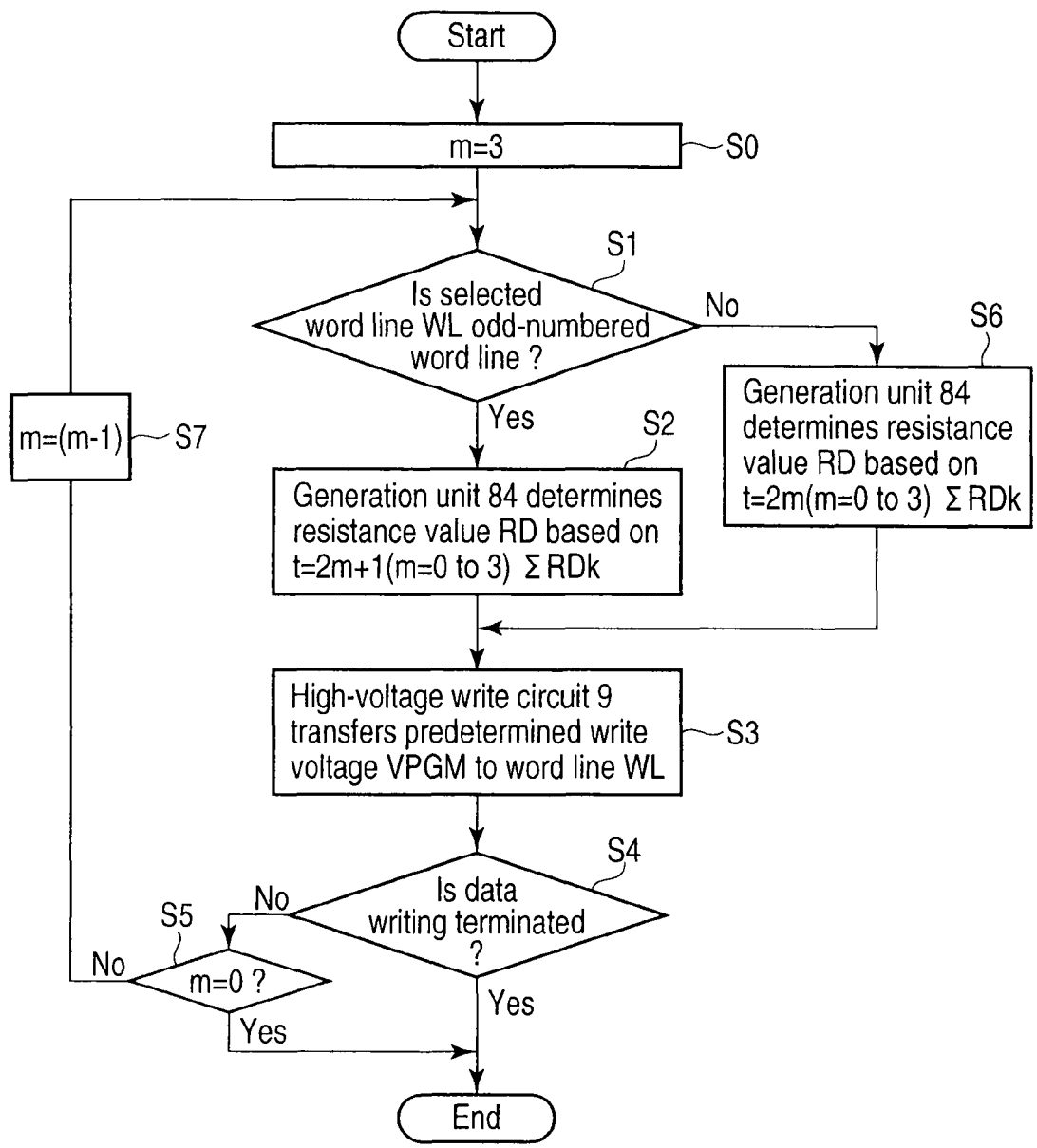
F I G. 5 2

SEMICONDUCTOR MEMORY DEVICE INCLUDING CHARGE STORAGE LAYER AND CONTROL GATE

CROSS-REFERENCE TO RELATED APPLICATIONS

This application is based upon and claims the benefit of priority from prior Japanese Patent Application No. 2008-262050, filed Oct. 8, 2008, the entire contents of which are incorporated herein by reference.

BACKGROUND OF THE INVENTION

1. Field of the Invention

The present invention relates to a semiconductor memory device. For example, the present invention relates to a voltage control method for bit lines in a read operation and a voltage control method for word lines in a write operation.

2. Description of the Related Art

In recent years, with an increase in information amount, increasing an NAND flash memory capacity is often demanded. With this demand, miniaturization of metal wiring lines including bit lines or word lines has advanced, and a line width thereof has reached a limit of a photolithography resolution.

Thus, a sidewall processing technique that enables forming a line width smaller than that of the resolution involved in photolithography is adopted. JP-A 2002-280388 (KOKAI) discloses that using the sidewall processing technology enables forming a line width that is approximately a half of a line width as a minimum processing dimension formed by using the lithography technology.

BRIEF SUMMARY OF THE INVENTION

A semiconductor memory device according to an aspect of the invention includes, a plurality of memory cells each of which includes a charge storage layer and a control gate and is configured to hold two-or-higher-level data;

signal lines each of which is electrically connected to a gate or one end of a current path of each of the memory cells and has a line width which differs depending on each interval between the memory cells adjacent to each other; and a control unit which controls a voltage applied to each of the signal lines in accordance with the line width of each of the signal lines.

BRIEF DESCRIPTION OF THE SEVERAL VIEWS OF THE DRAWING

FIG. 1 is a block diagram showing an NAND type flash memory according to a first embodiment of the present invention;

FIG. 2 is a threshold distribution chart of a memory cell transistor according to the first embodiment;

FIG. 6 is a circuit diagram of a sense amplifier included in a semiconductor memory device according to the first embodiment;

FIG. 7 and FIG. 8 are circuit diagrams of a bit line driver included in the semiconductor memory device according to the first embodiment;

FIG. 11A and FIG. 11B are cross-sectional views showing a third manufacturing step of the semiconductor memory device according to the first embodiment;

FIG. 12A and FIG. 12B are cross-sectional views showing a fourth manufacturing step of the semiconductor memory device according to the first embodiment;

FIG. 16A and FIG. 16B are cross-sectional views showing an eighth manufacturing step of the semiconductor memory device according to the first embodiment;

FIGS. 20 to 22 are circuit diagrams of a sense amplifier according to a second embodiment of the present invention, where FIG. 20 is a view showing a precharge operation at the time of data reading, FIG. 21 is a view showing a discharge operation, and FIG. 22 is a view showing an sensing operation;

FIG. 26A and FIG. 26B are cross-sectional views showing a second manufacturing step of the semiconductor memory device according to the third embodiment;

FIG. 31A and FIG. 31B are cross-sectional views showing a seventh manufacturing step of the semiconductor memory device according to the third embodiment;

FIG. 35 is a cross-sectional view taken along a line 35-35 in FIG. 34;

FIG. 36 shows I-V characteristics of a memory cell transistor MT according to the third embodiment;

FIG. 37 is a graph of a signal BLC output from a bit line driver included in a semiconductor memory device according to the third embodiment;

FIG. 38 is a plan view of a memory cell array included in an NAND type flash memory according to the third embodiment;

FIG. 39 is a cross-sectional view taken along a line 39-39 in FIG. 38;

FIG. 40 is a graph of a signal BLC output from a bit line driver included in a semiconductor memory device according to the third embodiment;

FIG. 41 is a plan view of a memory cell array included in an NAND type flash memory according to the third embodiment;

FIG. 42 is a cross-sectional view taken along a line 42-42 in FIG. 41;

FIG. 43 is a graph of a signal BLC output from a bit line driver included in a semiconductor memory device according to the third embodiment;

FIG. 47 is a plan view of a memory cell array included in an NAND type flash memory according to a fourth embodiment of the present invention;

FIG. 49 is a circuit diagram of a high-voltage generation circuit included in a semiconductor memory device according to the fourth embodiment;

FIG. 50 is a circuit diagram of a resistance group included in the high-voltage generation circuit according to the fourth embodiment;

FIG. 52 is a flowchart of a control unit included in the semiconductor memory device according to the fourth embodiment.

DETAILED DESCRIPTION OF THE INVENTION

Figure 3:
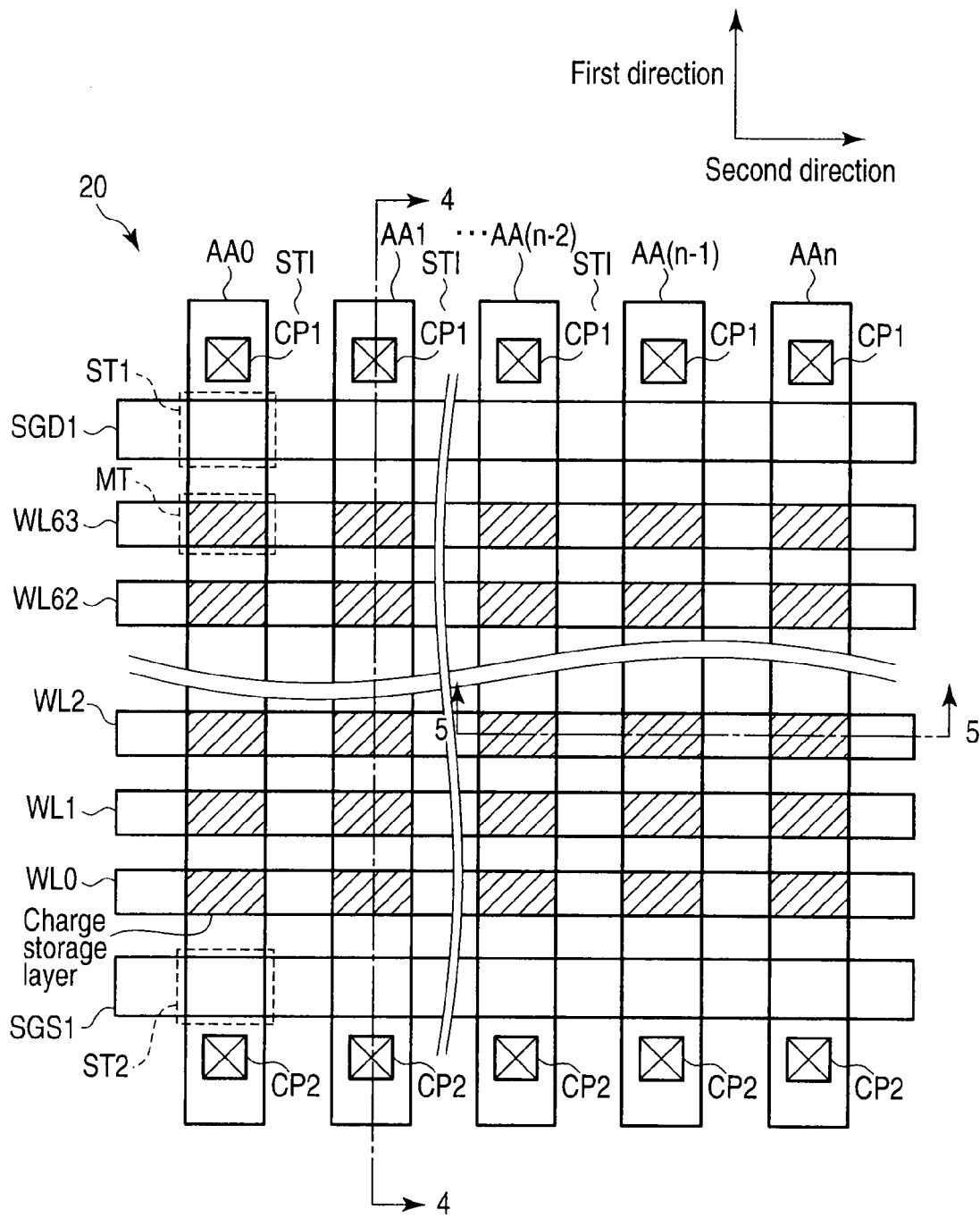
FIG. 3 is a plan view of a memory cell array included in the NAND type flash memory according to the first embodiment.

Embodiments according to the present invention will now be described hereinafter with reference to the accompanying drawings. In this description, like reference numerals denote like parts throughout the drawings.

First Embodiment

A semiconductor memory device according to a first embodiment of the present invention will now be described with reference to FIG. 1. FIG. 1 is a block diagram of an NAND type flash memory according to this embodiment.

<Configuration of NAND Type Flash Memory>

As shown in the drawing, the NAND type flash memory includes a memory cell array 1, a control unit 2, a row decoder 3, a sense amplifier 4, an n-channel MOS transistor 5, a column decoder 8, a data input/output circuit 10, and a high-breakdown voltage n-channel MOS transistor 15. The memory cell array 1 will be first described.

<Configuration Example of Memory Cell Array 1>

The memory cell array 1 includes a plurality of nonvolatile memory cell transistors MT that can hold data. Further, the memory cell transistor MT is an n-channel MOS transistor equipped with, e.g., a stacked gate including a charge storage layer and a control gate. The control gate of the memory cell transistor MT functions as a word line, a drain of the same is electrically connected with a bit line, and a source of the same is electrically connected with a source line. Furthermore, the memory cell array 1 is constituted of blocks BLK0 to BLKs (s is a natural number) each including the plurality of nonvolatile memory cell transistors MT.

As shown in the drawing, each of the blocks BLK0 to BLKs includes a plurality of NAND strings 7 each having the nonvolatile memory cell transistors MT connected in series. Each of the NAND strings 7 includes, e.g., 64 memory cell transistors MT and selective transistors ST1 and ST2. The memory cell transistor MT has an MONOS structure having a charge storage layer (e.g., an insulating film) formed on a semiconductor substrate through a gate insulating film, an insulating film (which will be referred to as a block layer hereinafter) which is formed on the charge storage layer and has a higher dielectric constant than that of the charge storage layer, and a control gate electrode formed on the block layer. It is to be noted that the number of the memory cell transistors MT is not restricted to 64, and it may be, e.g., 128, 256, or 512, and this number is not restricted. Moreover, the memory cell transistors MT adjacent to each other share a source and a drain. Additionally, the memory cell transistors MT are arranged such that current paths thereof are connected in series between the selection transistors ST1 and ST2. A drain region of the memory cell transistor MT connected in series on one end side is connected with a source region of the selective transistor ST1, and a source region of the same on the other end side is connected with a drain region of the selective transistor ST2.

Control gate electrodes of the memory cell transistors MT in the same row are connected with one of word lines WL0 to WL63 in common, and gate electrodes of the selective transistors ST1 or ST2 of the memory cell transistors MT in the same row are connected with a selective gate line SGD1 or SGS1 in common. It is to be noted that the word lines WL0 to WL63 may be simply referred to as word lines WL hereinafter when the word lines WL0 to WL63 are not distinguished for convenience of explanation. Further, drains of the selective transistors ST1 in the same column in the memory cell array are connected with one of bit lines BL0 to BLn in common. The bit lines BL0 to BLn will be likewise collectively referred to as bit lines BL when these bit lines are not distinguished from each other (n: a natural number). Sources of the selective transistors ST2 are connected with a source line SL in common. It is to be noted that both the selective transistors ST1 and ST2 are not necessarily required, and one of them alone may be provided as long as the NAND string 7 can be selected. It is to be noted that the bit line BLn is arranged as an even-numbered bit line and each subsequent bit line BL arranged as an even-number bit line is determined as a bit line BL2(j−1). On the other hand, it is to be noted that a bit line BL(n−1) is arranged as an odd-numbered bit line and each subsequent bit line BL arranged as an odd-numbered bit line is a bit line BL(2j−1) (j: a natural number).

Further, data is collectively written into the plurality of memory cell transistors MT connected with the same word line WL, and this unit is called a page. Furthermore, data in the plurality of NAND strings 7 is collectively erased in blocks BLK.

<Threshold Distribution of Memory Cell Transistor MT>

A threshold distribution of the memory cell transistor MT will now be described with reference to FIG. 2. FIG. 2 is a graph in which an abscissa represents a threshold distribution and an ordinate represents an existing probability of the memory cell transistor MT.

As shown in the drawing, each memory cell transistor MT can hold, e.g., 8-level data (3-bit data). That is, the memory cell transistor MT can hold eight types of data, i.e., "0", "1", "2", "3", "4", "5", "6", and "7" in descending order of threshold voltages Vth. A threshold voltage Vth0 of the data "0" in the memory cell transistor MT has a relationship of Vth0<V01. A threshold voltage Vth1 of the data "1" has a relationship of V01<Vth1<V12. A threshold voltage Vth2 of the data "2" has a relationship of V12<Vth2<V23. A threshold voltage Vth3 of the data "3" has a relationship of V23<Vth3<V34. A threshold voltage Vth4 of the data "4" has a relationship of V34<Vth4<V45. A threshold voltage Vth5 of the data "5" has a relationship of V45<Vth5<V56. A threshold voltage Vth6 of the data "6" has a relationship of V56<Vth6<V67. Further, a threshold voltage Vth7 of the data "7" has a relationship of V67<Vth7.

Furthermore, the voltage V12 is, e.g., 0V. That is, the threshold voltages Vth0 and Vth1 of the data "0" and the data "1" have negative values, and the threshold voltages Vth2 to Vth7 of the data "2" to "7" have positive values. Moreover, of the data "0" to "7", read levels of the data "0" and "1" have negative values, and read levels of the data "2" or above have positive values. Additionally, when reading data, a voltage corresponding to the read level is applied to a space between the gate and the source of the memory cell transistor MT.

As explained above, in the memory cell transistor MT, the three-bit data of each of "0" to "7" can be maintained in accordance with a threshold value. This threshold voltage fluctuates by injecting electric charges into the charge storage layer.

It is to be noted that the read level that provides 0 V is not restricted to Vth2 and may be the voltage Vth3 or Vth4, and it is good enough for at least one read level to take a negative value. Additionally, the data which can be maintained in the memory cell transistor MT is not restricted to the 8-level data. For example, it may be 2-level data (1-bit data), 4-level data (2-bit data), or 16-level data (4-bit data).

<Planar Configuration of Memory Cell Array 1>

A planar configuration of the memory cell array 1 having the above-described configuration will now be described with reference to FIG. 3. FIG. 3 is a plan view of the blocks BLK0 to BLKs.

As shown in FIG. 3, a plurality of stripe-like active areas AA0 to AAn that are parallel to a first direction are provided in a p-type semiconductor substrate 20 along a second direction orthogonal to the first direction. It is to be noted that the active areas AA0 to AAn may be simply referred to as active areas AA hereinafter for convenience of explanation. It is to be noted that the active area AAn is arranged as an even-numbered active area like the bit lines BL in this embodiment, and the subsequent even-numbered active area AA is an active area AA2(j−1). On the other hand, it is assumed that the active area AA(n−1) is an odd-numbered active area, and a subsequent odd-numbered active area AA is an active area AA(2j−1). That is, the bit line BLn is formed on the active area AAn, and the bit line BL(n−1) is formed on the active area AA(n−1). Further, an element isolation region STI is formed between the active areas AA adjacent to each other, and this element isolation region STI electrically separates the active areas AA from each other. The stripe-like word lines WL and the select gate lines SGD1 and SGS1 which are parallel to the second direction are formed on the p-type semiconductor substrate 20 to get across the plurality of active areas AA. The charge storage layer is provided in a region where the word line WL crosses the active area AA. Further, the memory cell transistor MT is provided in a region where the word line WL crosses the active area AA, and the selective transistor ST1 or ST2 is provided in each region where the select gate line SGD1 or SGS1 crosses the active area AA. In the active areas AA between the word lines WL which are adjacent to each other in the first direction, between the select gate lines, and between the word line WL and the select gate line, an impurity diffusion layer that becomes a source region or a drain region of the memory cell transistor MT and the selective transistor ST1 or ST2 is formed.

The impurity diffusion layer formed in the active area AA between the select gate lines SGD1 which are adjacent to each other in the first direction functions as a drain region of each selective transistor ST1. Furthermore, a contact plug CP1 is formed on this drain region. The contact plug CPU1 is connected with each of the stripe-like bit lines BL (not shown) provided along the first direction. Furthermore, a line width of each bit line BL has a value W1 or W2. Specifically, for example, the even-numbered bit lines BL2(j−1) have the line width W1 and the odd-numbered bit lines BL(2j−1) have the line width W2 in this embodiment.

Moreover, W1>W2 is achieved in this embodiment. That is, the even-numbered bit lines BL2(j−1) (which may be simply referred to as bit lines BL2(j−1) hereinafter) and the odd-numbered bit lines BL(2j−1) (which may be simply referred to as bit lines BL(2j−1) hereinafter) have the different line widths W. It is to be noted that, when the line widths W1 and W2 are not distinguished from each other, they are generically called the line widths W. Moreover, the impurity diffusion layer formed in the active area AA between the select gate lines SGS1 which are adjacent to each other in the first direction functions as a source region of each selective transistor ST2. Additionally, a contact plug CP2 is formed on this source region. The contact plug CP2 is connected with the non-illustrated source line SL.

<Cross-sectional Configuration of Memory Cell Array 1>

Figure 4:
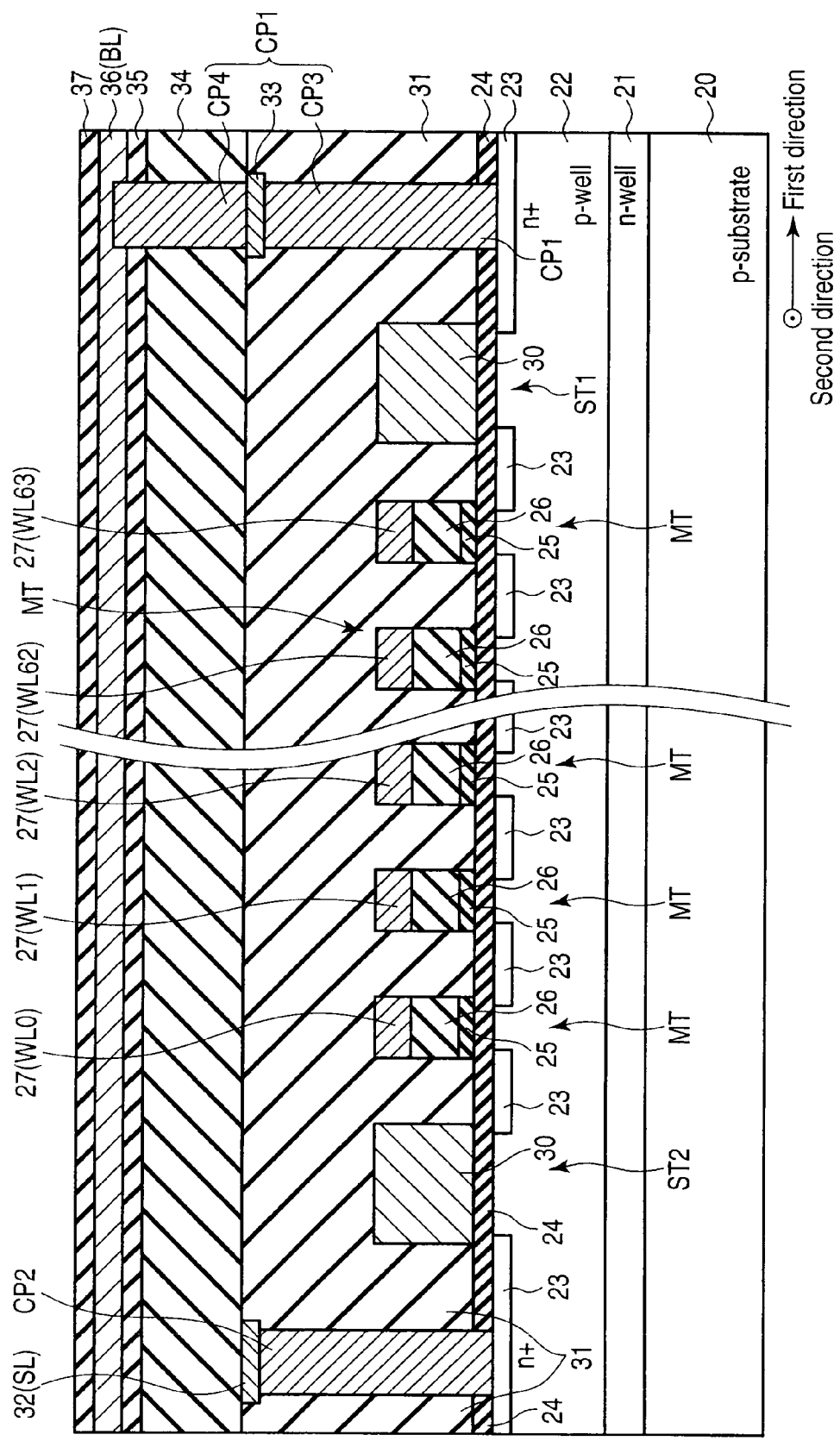
FIG. 4 is a cross-sectional view taken along a line 4-4 in FIG. 3.
Figure 5:
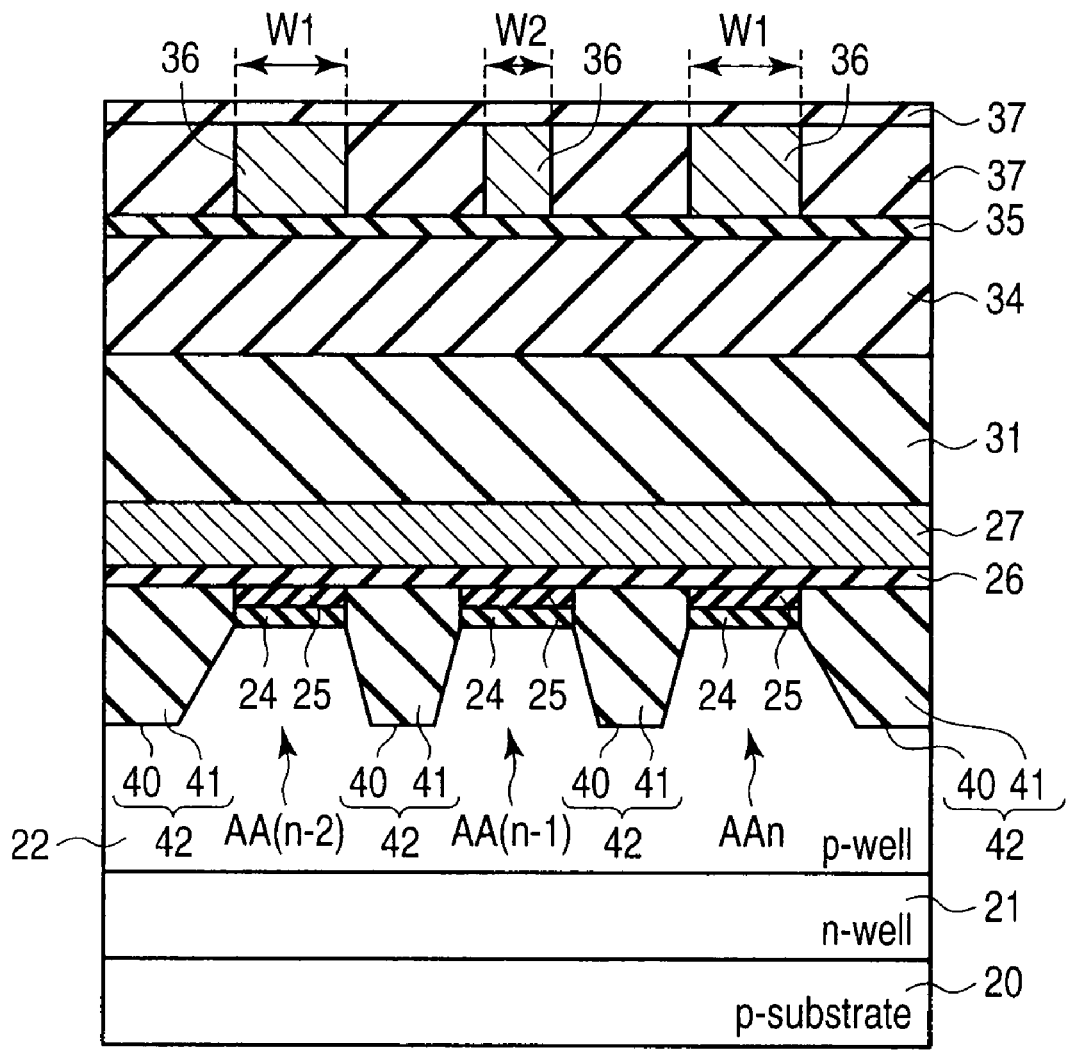
FIG. 5 is a cross-sectional view taken along a line 5-5 in FIG. 3.

Cross-sectional configurations of the blocks BLK0 to BLKs having the above-explained structures will now be described with reference to FIGS. 4 and 5. FIG. 4 is a cross-sectional view of the NAND string 7 taken along a line 4-4 in FIG. 3, and FIG. 5 is a cross-sectional view of the NAND strings 7 taken along a line 5-5 in FIG. 3. That is, two or more active areas AA can suffice in this embodiment, but FIG. 5 shows cross sections of the active areas AA(n−2) to AAn in particular for convenience sake.

As shown in FIGS. 4 and 5, an n-type well region 21 is formed in a surface region of the p-type semiconductor substrate 20, and a p-type well region 22 is formed on the n-type well region 21. Additionally, a plurality of trenches 40 are formed in the p-type well region 22 along the second direction. An insulating film 41, e.g., a silicon oxide film is buried in each trench 40. The trench 40 and the insulating film 41 form an element isolation region 42. Further, a region between the element isolation regions 42 which are adjacent to each other becomes the active area AA. Further, the active areas AA adjacent to each other are separated from each other by the element isolation region 42. Furthermore, a gate insulating film 24 consisting of, e.g., a silicon oxide film that functions as a gate insulating film is formed on each active area AA, and a gate electrode of the memory cell transistor MT or the selective transistor ST1 or ST2 is formed on the gate insulating film 24. The gate insulating film 24 in the memory cell transistor MT functions as a tunnel film that electrons tunnel.

The gate electrode of the memory cell transistor MT has a laminated structure. That is, it includes an insulating film 25 formed on the gate insulating film 24, an insulating film 26 formed on the insulating film 25, and a polysilicon layer 27 formed on the insulating film 26. The insulating film 25 functions as a charge storage layer that stores electric charges. The insulating film 26 functions as a block layer that confines electric charges to the insulating film 25, and it is formed by using a material having a dielectric constant higher than that of a material used for the insulating film 25. Furthermore, the polysilicon layer 27 functions as a control gate (the word line WL). The insulating films 25 and 26 and the polysilicon layer 27 in the memory cell transistor MT may be referred to as the charge storage layer 25, a block layer 26, and the control gate 27. It is to be noted that an upper portion or all of the polysilicon layer 27 may be silicided to realize a low resistance of each word line. Moreover, in this embodiment, the charge storage layer 25 is divided in accordance with each memory cell transistor MT, and the block layers 26 and the control gates 27 are connected to each other between the memory cell transistors MT which are adjacent to each other in the word line direction to be shared by these memory cell transistors MT. That is, the block layers 26 of the memory cell transistors MT get across the element isolation regions 42 adjacent to each other and are connected with each other between the active areas AA adjacent to each other to be shared by these active areas AA in a direction along the word lines. It is to be noted the charge storage layers 25 may be connected between the memory cell transistors MT adjacent to each other in some cases.

Further, in this embodiment, each charge storage layer 25 is formed in such a manner that its upper surface becomes level with an upper surface of each element isolation region 42. Furthermore, a plane that a bottom surface of the block layer 26 on the element isolation region 42 and an upper surface of the element isolation region 42 are in contact with each other is level with an upper surface of the charge storage layer 25 on the active area AA, namely, they are placed on the same plane. It is to be noted that the upper surface of the charge storage layer 25 does not have to necessarily match with the upper surface of the element isolation region 42.

The gate electrode of the selective transistor ST1 or ST2 includes a polysilicon layer 30. The polysilicon layer 30 may be referred to as a gate electrode 30 hereinafter. It is to be noted that an upper portion or all of the polysilicon layer 30 may be silicided to realize a low resistance of the gate electrode. In the selective transistors ST1 and ST2, the gate electrodes 30 adjacent to each other in the second direction are connected in common. Moreover, the gate electrode 30 functions as the select gate line SGS1 or SGD1.

Additionally, an $n^+$-type impurity diffusion layer 23 is formed in a surface of the p-type semiconductor substrate 20 placed between the gate electrodes. The $n^+$-type impurity diffusion layer 23 is shared by the transistors adjacent to each other and functions as a source (S) or a drain (D). Further, a region between the source and the drain adjacent to each other (a region immediately below the gate electrode) functions as a channel region that becomes an electron transfer region. The gate electrodes, the $n^+$-type impurity diffusion layers 23, and the channel regions form the memory cell transistors MT and the selective transistors ST1 and ST2.

Furthermore, an interlayer insulating film 31 is formed on the p-type semiconductor substrate 20 to cover the memory cell transistors MT and the selective transistors ST1 and ST2. A contact plug CP2 which reaches the impurity diffusion layer (the source) 23 of the selective transistor ST2 on the source side is formed in the interlayer insulating film 31. Moreover, a metal wiring layer 32 connected with the contact plug CP2 is formed in a surface of the interlayer insulating film 31. The metal wiring layer 32 functions as a part of the source line SL. Additionally, a contact plug CP3 which reaches the impurity diffusion layer (the drain) 23 of the selective transistor ST1 on the drain side is formed in the interlayer insulating film 31. Further, a metal wiring layer 33 connected with the contact plug CP3 is formed in the surface of the interlayer insulating film 31.

An interlayer insulating film 34 is formed on the interlayer insulating film 31 by using, e.g., a silicon oxide film as a material. An insulating film 35 is formed on the interlayer insulating film 34. A material having a higher dielectric constant than the interlayer insulating film 34, e.g., a silicon nitride film is used as a material to form the insulating film 35. A metal wiring layer 36 is formed on the insulating film 35 by using, e.g., a sidewall processing technology. The metal wiring layer 36 functions as a bit line BL. Furthermore, each metal wiring layer 36 that functions as the bit line BL has a line width W1 or W2, and the line widths W are alternately formed. That is, as explained above in this embodiment, the bit line BL2(j−1) has the line width W1, and the bit line BL(2j−1) has the line width W2. A contact plug CP4 having an upper surface that is in contact with the metal wiring layer 36 and a bottom surface that is in contact with the metal wiring layer 33 is formed in the insulating film 34 and the interlayer insulating film 31. That is, an upper portion of the contact plug CP4 is formed to enter the metal wiring layer 36. Further, the contact plug CP3, the metal wiring layer 33, and the contact plug CP4 function as the contact plug CP1 in FIG. 2. It is to be noted that the upper surface of the contact plug CP4 is higher than the upper surface of the insulating film 35 as an example in this embodiment, but it does not have to be higher. Furthermore, an interlayer insulating film 37 is formed on the insulating film 35 and the metal wiring layer 36 by using, e.g., a silicon oxide film as a material. The interlayer insulating film 37 fills a region between the bit lines BL adjacent to each other.

<Data Input/Output Circuit 10>

Again referring to FIG. 1, the data input/output circuit 10 will now be described. The data input/output circuit 10 outputs an address and a command supplied from a host through a non-illustrated I/O terminal to the control unit 2. Moreover, the data input/output circuit 10 outputs write data to the sense amplifier 4 through a data line. Additionally, when outputting data to the host, the data input/output circuit 10 accepts a command from the control unit 2, receives data amplified by the sense amplifier 4 through the data line, and then outputs the data to the host through the I/O terminal.

<Sense Amplifier 4>

The sense amplifier 4 will now be explained. The sense amplifier 4 senses and amplifies data read to the bit line BL from the memory cell transistor MT at the time of reading the data. Additionally, at the time of writing data, a voltage associated with write data is supplied to the corresponding bit line BL.

Further, the sense amplifier 4 according to this embodiment functions as a voltage detection type (a sensing scheme using this technique may be referred to as voltage sensing hereinafter) or a current detection type (a sensing scheme using this technique may be referred to as current sensing hereinafter) by switching data read modes.

When the sense amplifier 4 functions as the voltage detection type, the sense amplifier 4 precharges the bit line BL to a predetermined voltage, then discharges the bit line BL by using the NAND string 7 selected by the row decoder 3, and senses a discharge state of this bit line BL. That is, the sense amplifier 4 amplifies a voltage in the bit line BL to sense data in the memory cell transistor MT.

Furthermore, when the sense amplifier 4 functions as the current detection type, the sense amplifier 4 senses a current flowed by the memory cell transistor MT included in the NAND string 7 through the bit line BL. That is, the sense amplifier 4 directly senses the current flowed by the memory cell transistor MT while maintaining the voltage in the bit line BL constant. Moreover, a current of the bit line BL is determined based on data in the memory cell transistor MT. Therefore, a judgment on "1" or "0" in the sense amplifier 4 connected with the bit line BL is finally determined by a difference in value of the current flowed by the memory cell transistor MT.

A configuration of the sense amplifier 4 that functions as the voltage detection type or the current detection type will now be described with reference to FIG. 6.

<Configuration Example of Sense Amplifier 4>

FIG. 6 shows an example of a circuit diagram of the sense amplifier 4 that functions as the voltage detection type or the current detection type. As shown in the drawing, the sense amplifier 4 includes n-channel MOS transistors 73, 75, 76, 77, 86, and 87, p-channel MOS transistors 72, 74, and 78, a capacitor element 79, and a latch circuit 85.

One end of the current path of the MOS transistor 72 is connected with a node N_VDD, the other end of the same is connected with a node N1, and a signal INV is supplied to a gate of the MOS transistor 72. It is to be noted that the signal INV is connected with a later-explained node N5. That is, in a state of the node N5, the signal INV which is supplied to the gate of the MOS transistor 72 is determined. One end of a current path of the MOS transistor 76 is connected with the node N1, the other end of the same is connected with a node N2, and a signal BLX is supplied to a gate of the MOS transistor 76. The node N2 is connected with the bit line BL through the MOS transistor 5 and a current path of the MOS transistor 15.

One end of a current path of the MOS transistor 73 is connected with the node N1, the other end of the same is connected with a node N3, and a signal HLL is supplied to a gate of the MOS transistor 73. One end of a current path of the MOS transistor 77 is connected with the node N2, the other end of the same is connected with the node N3, and a signal XXL is supplied to a gate of the MOS transistor 77. The node N3 is connected with the node N_VDD through the MOS transistors 72 and 73. Additionally, a potential at the node N3 is set to a voltage Vn3.

One electrode of the capacitor element 79 is connected with the node N3, and the other electrode is connected with a node N_CLK. It is to be noted that a capacitance of the capacitor element 79 on the node N3 side is determined as C2.

One end of a current path of the MOS transistor 74 is connected with the node N_VDD, the other end of the same is connected with a node N4, and a signal STB is supplied to a gate of the MOS transistor 74. One end of a current path of the MOS transistor 78 is connected with the node N4, the other end of the same is connected with the latch circuit 85 through the node N5, and a gate of the MOS transistor 78 is connected with the node N3. Additionally, a drain end of the MOS transistor 87 is connected with the node N5, a source end of the MOS transistor 87 is connected with a node N_VSS, and a signal RST is supplied to a gate of the MOS transistor 87.

One end of the MOS transistor 75 is connected with the bit line BL, and the signal INV is supplied to a gate of the MOS transistor 75. It is to be noted that the signal INV is connected with the node N5 like the MOS transistor 72. That is, the signal INV which is supplied to the gate of the MOS transistor 75 is determined by the state of the node N5. One end of the MOS transistor 86 is connected with the other end of the MOS transistor 75, and the other end of the same is connected with the node N_VSS, and a signal GRS is supplied to a gate of the MOS transistor 86.

It is to be noted that the node N_VDD functions as a power supply voltage node of the sense amplifier 4 and, e.g., a voltage VDD is supplied to this node. Further, for example, a voltage CLK is supplied to the node N_CLK. The voltage CLK is, e.g., a ground potential (0 V).

Furthermore, the MOS transistors 5, 73, 76, and 77 in the sense amplifier 4 having the above-described configuration operate in accordance with a mode, i.e., the voltage detection type or the current detection type. It is to be noted that the detail of the data read operation when the sense amplifier 4 functions as the voltage detection type will be explained later.

It is to be noted that the sense amplifier 4 functions as the current detection type in this embodiment.

<Configuration Example of Control Unit 2>

The control unit 2 will now be described. The control unit 2 controls the operation of the entire NAND type flash memory. That is, it executes an operation sequence in a write operation, a read operation, or an erase operation of data based on the address and the command supplied from the non-illustrated host through the data input/output circuit 10. Furthermore, the control unit 2 generates a block selection signal/column selection signal based on the address and the operation sequence. The control unit 2 outputs the block selection signal to the row decoder 3. The block selection signal is a signal which urges the row decoder 3 to select one of the plurality of memory block BLK0 to BLKs when performing reading, writing, or erasing data. Moreover, the control unit 2 outputs the column selection signal to the column decoder 8. The column selection signal is a signal that is used to select a column direction of the column decoder 8.

Additionally, the control unit 2 receives a control signal supplied from a non-illustrated memory controller. Further, the control unit 2 determines whether a signal supplied to the data input/output circuit 10 from the host through the non-illustrated I/O terminal is an address or data by using the supplied control signal.

Furthermore, the control unit 2 includes a high-voltage generation circuit 9 and a core driver 16. Moreover, the core driver 16 includes a BLC driver 6 and a high-breakdown voltage transistor driver 14.

The high-voltage generation circuit 9 generates a voltage required for the write operation, the read operation, and the erase operation of data. Additionally, a desired voltage generated by the high-voltage generation circuit 9 is supplied to, e.g., the row decoder 3, the sense amplifier 4, and the memory cell array 1 in the NAND type flash memory through the core driver 16. It is to be noted that supply to the memory cell array 1 means supply to a source line driver connected with the source line SL in the memory cell array 1 and a well region in which the memory cell array 1 is formed.

The BLC driver 6 applies a required voltage to the gate of the n-channel MOS transistor 5.

Further, the high-breakdown voltage transistor driver 14 applies a voltage of, e.g., 8 [V] to the gate of the n-channel MOS transistor 15. It is to be noted that the MOS transistor 15 is a high-breakdown voltage enhancement type n-channel MOS transistor in which a gate insulating film is formed with a larger film thickness than that in the MOS transistor 5.

<MOS Transistor 5>

Each n-channel MOS transistor 5 connects the bit line BL with the sense amplifier 4. That is, one end of a current path of each MOS transistor 5 is connected with the corresponding bit line BL through the MOS transistor 15, and the other end of the current path of the same is connected with the corresponding sense amplifier 4. Furthermore, the signal BLC generated by the BLC driver 6 is supplied to the gate of each MOS transistor 5. It is to be noted that a threshold value of the MOS transistor 5 is determined as Vt2.

<MOS Transistor 15>

Each n-channel MOS transistor 15 connects the bit line BL to the sense amplifier 4 through the MOS transistor 5 associated with the MOS transistor 15. That is, one end of a current path of each MOS transistor 15 is connected with the sense amplifier 4 through the corresponding MOS transistor 5, and the other end of the current path of the same is connected with the corresponding bit line BL. Moreover, a voltage of, e.g., 8 [V] generated by the high-breakdown voltage transistor driver 14 is supplied to a gate of each MOS transistor 15. When the voltage of 8 [V] is supplied by the high-breakdown voltage transistor driver 14, the MOS transistor 15 is turned on, thereby electrically connecting the bit line BL to the sense amplifier 4. It is to be noted that the MOS transistor 5 is in an ON state at this moment.

Moreover, when erasing data in particular, the core driver 16 supplies a high voltage of, e.g., approximately 20 [V] to the p-type well region 22 formed on the surface of the p-type semiconductor substrate 20 of the memory cell array 1. At this time, turning off the MOS transistor 15 prevents the voltage of approximately 20 [V] supplied to the p-type well region 22 from being transmitted to the sense amplifier 4 through the contact plug CP1 and the bit line BL.

<Configuration Example of BLC Driver 6>

A configuration Example of the BLC driver 6 included in the control unit 2 will now be described with reference to FIG. 7. FIG. 7 is a circuit diagram of the BLC driver 6. Further, the BLC driver 6 includes a BLC_e driver 17 and a BLC_o driver 18. Furthermore, the BLC_e driver 17 outputs a voltage Vblc_e as a signal BLC_e which should be applied to the gate of the MOS transistor 5 connected with the bit line BL2(j−1). Moreover, the BLC driver 18 outputs a voltage Vblc_o as a signal BLC_o which should be applied to the gate of the MOS transistor 5 connected with the bit line (2j−1).

The BLC_e driver 17 includes BLC_e drivers 171 to 173 and MOS transistors 174 to 176. Additionally, the BLC_e driver 171 is connected with one end of a current path of the MOS transistor 174, a node N20 is connected with the other end of the same, and a signal TG1 is supplied to a gate of the MOS transistor 174. It is to be noted that the control unit 2 supplies one of an "L" level and an "H" level as the signal TG1. Further, when the signal TG1 is at the "H" level, the MOS transistor 174 enters the ON state. Furthermore, the BLC_e driver 171 outputs the voltage Vblc_e (e.g., 4 [V]) supplied from the high-voltage generation circuit 9 as a signal BLC_e through the MOS transistor 174 and the node N20.

Moreover, the BLC_e driver 172 is connected with one end of a current path of the MOS transistor 175, a node N20 is connected with the other end of the same, and a signal TG3 is supplied to a gate of the MOS transistor 175. It is to be noted that the control unit 2 supplies one of the "L" level and the "H" level as the signal TG3. Additionally, when the signal TG3 is at the "H" level, the MOS transistor 175 enters the ON state. Further, the BLC_e driver 172 outputs the voltage Vblc_e required to read data by, e.g., the sense amplifier 4 as the signal BLC_e through the MOS transistor 175 and the node N20.

Furthermore, the BLC_e driver 173 is connected with one end of a current path of the MOS transistor 176, the node N20 is connected with the other end of the same, and a signal TG5 is supplied to a gate of the MOS transistor 176. It is to be noted the control unit 2 supplies one of the "L" level and the "H" level as the signal TG5. Further, when the signal TG5 is at the "H" level, the MOS transistor 176 enters the ON state. Furthermore, the BLC_e driver 173 outputs, e.g., the voltage Vblc_e (e.g., 0 [V] that becomes a ground potential) as the signal BLC_e through the MOS transistor 176 and the node N20.

The BLC_o driver 18 includes BLC_o drivers 181 to 183 and MOS transistors 184 to 186. Furthermore, the BLC_o driver 181 is connected with one end of a current path of the MOS transistor 184, a node N22 is connected with the other end of the same, and a signal TG2 is supplied to a gate of the MOS transistor 184. It is to be noted that the control unit 2 supplies one of the "L" level and the "H" level as the signal TG2. Moreover, when the signal TG2 is at the "H" level, the MOS transistor 184 enters the ON state. Additionally, the BLC_o driver 181 outputs a voltage Vblc_o (e.g., 4 [V]) supplied from the high-voltage generation circuit 9 as the signal BLC_o through the MOS transistor 184 and the node N22.

Further, the BLC_o driver 182 is connected with one end of a current path of the MOS transistor 185, the node N22 is connected with the other end of the same, and a signal TG4 is supplied to a gate of the MOS transistor 185. It is to be noted that the control unit 2 supplies one of the "L" level and the "H" level as the signal TG4. Furthermore, when the signal TG4 is at the "H" level, the MOS transistor 185 enters the ON state. Moreover, the BLC_o driver 182 outputs the voltage Vblc_o required to read data by, e.g., the sense amplifier 4 as the signal BLC_o through the MOS transistor 185 and the node N22.

Additionally, the BLC_o driver 183 is connected with one end of a current path of the MOS transistor 186, the node N22 is connected with the other end, and a signal TG6 is supplied to a gate of the MOS transistor 186. It is to be noted that the control unit 2 supplies one of the "L" level and the "H" level as the signal TG6. Further, when the signal TG6 is at the "H" level, the MOS transistor 183 enters the ON state. Furthermore, the BLC_o driver 183 outputs, e.g., the voltage Vblc_o (e.g., 0 [V] that becomes a ground potential) as the signal BLC_o through the MOS transistor 186 and the node N22.

Figure 8:
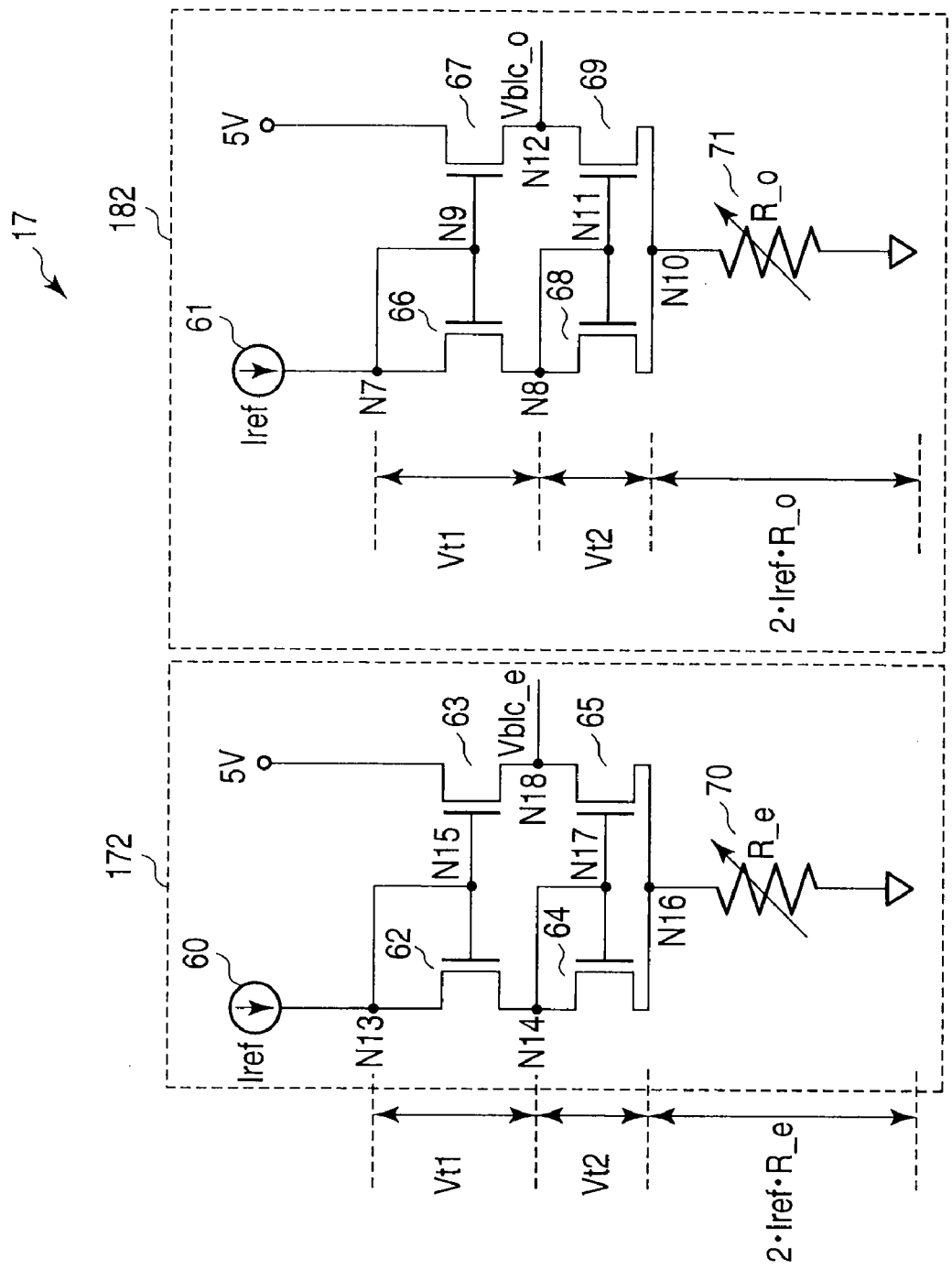
Figure 9B:
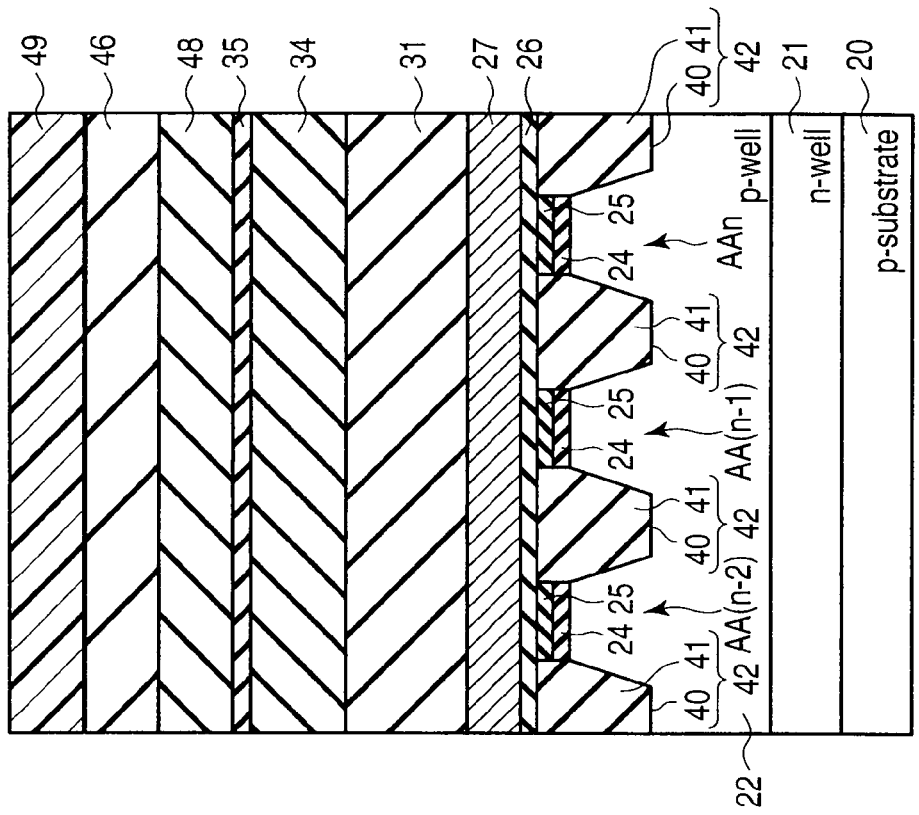
FIG. 9A and FIG. 9B are cross-sectional views showing a first manufacturing step of the semiconductor memory device according to the first embodiment.
Figure 9A:
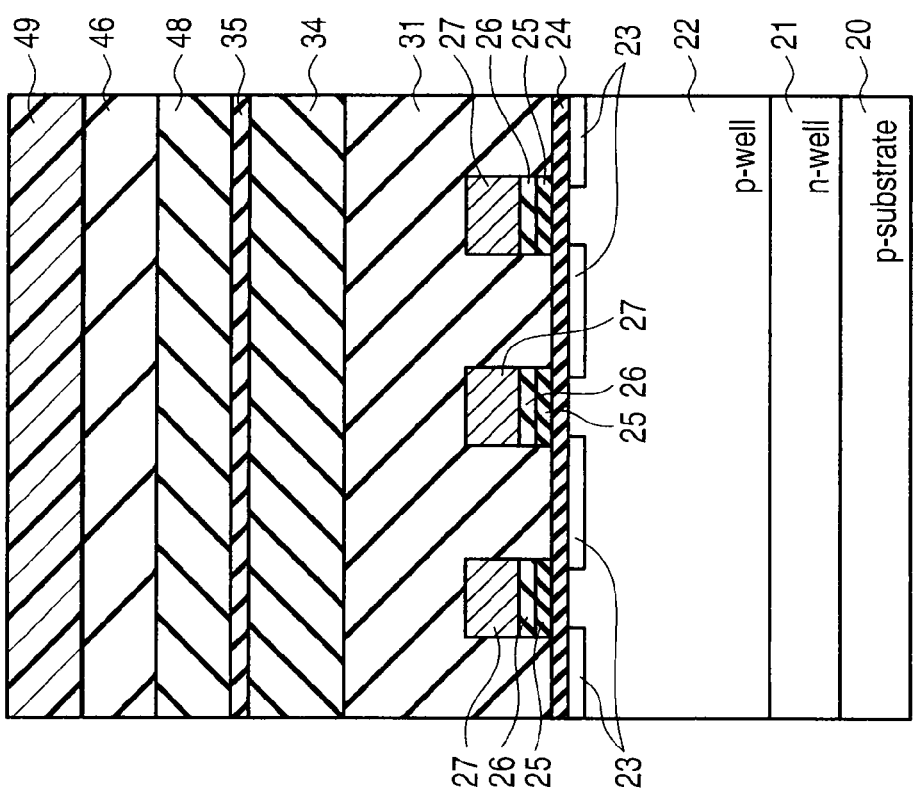

It is to be noted that configurations of the BLC_e driver 172 and the BLC_o driver 182 will be described in this embodiment in particular with reference to FIG. 8. FIG. 8 is a circuit diagram of the BLC_e driver 172 and the BLC_o driver 182. The BLC_e driver 172 will be referred to as a first driver circuit 172, and the BLC_o driver 182 will be referred to as a second driver circuit 182 hereinafter. It is to be noted that the signal BLC_e and the signal BLC_o will be simply referred to as signals BLC when these signals are not distinguished from each other.

As explained above, the first driver circuit 172 is a driver circuit associated with the bit line BL2(j−1) and generates the signal BLC_e which should be applied to the gate of the MOS transistor 5 connected with the bit line BL2(j−1). Further, the second driver circuit 182 is a driver circuit associated with the bit line BL(2j−1), and it generates a voltage which should be applied to the gate of the MOS transistor 5 connected with the bit line BL(2j−1) and outputs the generated voltage as the signal BLC_o.

The first driver circuit 172 will be first explained. As shown in the drawing, the first driver circuit 172 includes a current source 60, n-channel MOS transistors 62 to 65, and a resistance element 70. An output node of the current source 60 is connected with one end of a current path of the MOS transistor 62. A connection node between the current source 60 and the one end of the current path of the MOS transistor 62 will be referred to as a node N13 hereinafter. Furthermore, a voltage generated by a non-illustrated booster circuit is supplied to the current source 60. The other end of the current path of the MOS transistor 62 is connected with a node N14, and a gate of the same is connected with a node N15. Further, the node N13 and the node N15 are electrically connected with each other. Moreover, a threshold value of the MOS transistor 62 is Vt1. Additionally, one end of a current path of the MOS transistor 64 is connected with the node N14, the other end of the same is connected with a node N16, and a gate of the MOS transistor 64 is connected with a node N17. Further, the node N14 and the node N17 are electrically connected with each other. It is to e noted that a threshold value of the MOS transistor 64 is Vt2 equal to the threshold value of the MOS transistor 5. Furthermore, one end of the resistance element 70 is connected with the node N16, and the other end is grounded. Moreover, one end of a current path of the MOS transistor 63 is connected with a non-illustrated voltage generation circuit, the other end is connected with a node N18, and a gate of the MOS transistor 63 is connected with the node N15. Additionally, a threshold value of the MOS transistor 63 is Vt1 which is equal to that of the MOS transistor 62. One end of a current path of the MOS transistor 65 is connected with the node N18, the other end is connected with the node N16, and a gate of the MOS transistor 65 is connected with the node N17. That is, the other ends of the current paths of the MOS transistors 64 and 65 are common at the node N16. Further, a threshold value of the MOS transistor 65 is Vt2 which is equal to that of each of the MOS transistor 64 and the MOS transistor 5.

Furthermore, the MOS transistors 62 to 65 have the same characteristics. Moreover, the MOS transistors 62 and 63 form a current mirror circuit, and the MOS transistors 64 and 65 form a current mirror circuit. That is, since a current Iref output from the current source 60 flows through the MOS transistors 63 and 65, a current 2·Iref flows through the resistance element 70 whose one end is connected with the node N16. Namely, since a resistance value of the resistance element 70 is R_e, a potential at the node N16 is 2·Iref·R_e.

Additionally, since the threshold value of the MOS transistor 65 is Vt2, a potential at the node N18 is a voltage (Vt2+2·Iref·R_e) which is obtained by adding the threshold value Vt2 to the potential at the node N16.

Further, the node N18 is connected with the gate of the MOS transistor 5 connected with the non-illustrated bit line BL2(j−1) through the current path of the MOS transistor 175, and the node N20. That is, assuming that the signal BLC_e applied to the gate of the MOS transistor 5 from the node N20 corresponds to the voltage Vblc_e, the voltage Vblc_e at each of the node N20 is the voltage (Vt2+2·Iref·R_e). Furthermore, since a threshold value of the MOS transistor 5 is Vt2, a maximum potential that can be transferred by the MOS transistor 5 connected with the bit line BL2(j−1) corresponds to a voltage drop caused by the resistance element 70, i.e., the potential at the node N16. It is to be noted that the resistance element 70 is variable. Therefore, the voltage Vblc_e can be changed depending on the resistance value R_e.

The second driver circuit 182 will now be described. The second driver 182 includes a current source 61, n-channel MOS transistors 66 to 69, and a resistance element 71. As shown in the drawing, an output node of the current source 61 is connected with one end of a current path of the MOS transistor 66. A connection node between the current source 61 and the one end of the current path of the MOS transistor 66 will be referred to as a node N7 hereinafter. A voltage generated by a non-illustrated booster circuit is supplied to the current source 61. The other end of the current path of the MOS transistor 66 is connected with the node N8, and a gate of the MOS transistor 66 is connected with a node N9. Furthermore, the node N7 and the node N9 are electrically connected with each other. It is to be noted that a threshold value of the MOS transistor 66 is Vt1. Moreover, one end of a current path of the MOS transistor 68 is connected with the node N8, the other end of the same is connected with a node N10, and a gate of the MOS transistor 68 is connected with a node N11. Additionally, the node N8 and the node N11 are electrically connected with each other. It is to be noted that a threshold value of the MOS transistor 68 is Vt2. Further, one end of the resistance element 71 is connected with the node N10, and the other end of the same is grounded. Furthermore, one end of a current path of the MOS transistor 67 is connected with a non-illustrated voltage generation circuit, the other end of the same is connected with a node N12, and a gate of the MOS transistor 67 is connected with the node N9. Furthermore, a threshold value of the MOS transistor 67 is Vt1 which is equal to that of the MOS transistor 66. Moreover, one end of a current path of the MOS transistor 69 is connected with a node N12, the other end of the same is connected with the node N10, and a gate of the MOS transistor 69 is connected with the node N11. That is, the other ends of the current paths of the MOS transistors 68 and 69 are in common at the node N10. Additionally, a threshold value of the MOS transistor 69 is Vt2 equal to the threshold value of each of the MOS transistor 68 and the MOS transistor 5.

Further, the MOS transistors 66 and 69 have the same characteristics. Furthermore, the MOS transistors 66 and 67 form a current mirror circuit, and the MOS transistors 68 and 69 form a current mirror circuit. That is, a current Iref output from the current source 61 flows through channels of the MOS transistors 67 and 69, and a current 2·Iref flows through the resistance element 71 having one end connected with the node N10. That is, since a resistance value of the resistance element 71 is R_o, a potential at the node N10 is 2·Iref·R_o. Moreover, since the threshold value of the MOS transistor 69 is Vt2, a potential at the node N12 is Vt2+2·Iref·R_o obtained by adding the threshold value Vt2 to the potential at the node N10.

Additionally, the node N12 is connected with the gate of the MOS transistor 5 connected with the non-illustrated bit line BL(2j−1) through the current path of the MOS transistor 185, and the node N22. That is, the voltage Vblc_o that becomes a voltage (Vt2+2·Iref·R_o) is applied as the signal BLC_o to the gate of the MOS transistor 5 from the node N22. Further, since the threshold value of the MOS transistor 5 is Vt2, a potential that can be transferred by the MOS transistor 5 connected with the bit line BL(2l−1) corresponds to a voltage drop caused by the resistance element 71, i.e., the potential at the node N10.

It is to be noted that the voltage applied to one end of the current path of each of the MOS transistors 63 and 67 is, e.g., 5 [V], and it may be supplied from the outside of the semiconductor device.

<Configuration Example of Column Decoder 8>

The column decoder 8 selects a column direction of the memory cell array 1 based on a column selection signal supplied from the control unit 2. Furthermore, data input/output through the data line is transferred by supplying the column selection signal to the sense amplifier 4.

<Configuration Example of Row Decoder 3>

The row decoder 3 will now be described. The row decoder 3 selects one of the blocks BLK0 to BLKs based on the block selection signal supplied from the control unit 2 at the time of a write operation, a read operation, and an erase operation for data. Moreover, the row decoder 3 applies a voltage to the select gate lines SGD1 and SGS1, and the word lines WL0 to WL63 based on a row address supplied from the control unit 2.

As shown in FIG. 1, the row decoder 3 includes select gate line drivers 11 and 12 provided in accordance with each of the select gate lines SGD1 and SGS1 and word line drivers 13 provided in accordance with each word line WL.

The select gate line driver 11 transfers a necessary voltage to the gate of the selective transistor ST1 through the select gate line SGD1 in accordance with a result of decoding a row address (a page address). That is, the select gate line driver 11 transfers each necessary voltage to the gate of the selective transistor ST1 through the select gate line SGD1 at the time of writing, reading, erasing, and verification in writing and erasing in the memory cell transistor MT.

The select gate line driver 12 transfers each necessary voltage to the gate of the selective transistor ST2 through the select gate line SGS1 at the time of writing or reading data, or verification of data obtained from the series of such operations.

The word line driver 13 will now be described. The word line driver 13 selects the word line WL of a selected block in accordance with a result of decoding a page address and transfers the necessary voltage supplied from the core driver 16 to the control gate of the memory cell transistor MT through the selected word line WL.

<Manufacturing Process of NAND Flash Memory>

A manufacturing process of an NAND flash memory according to this embodiment will now be described while paying attention to a manufacturing process of the bit line BL in particular with reference to FIGS. 9A, and 9B to FIGS. 16A and 16B. It is to be noted that the bit line BL is manufactured based on a Damascene method after forming a desired trench by using a sidewall processing technology (a sidewall transfer process) in order to reduce a line width of the bit line BL. That is, a pattern corresponding to a lithography resolution limit or below is formed. It is to be noted that an example where an insulating film 50 that functions as a later-described sidewall is formed with a larger width than a width W1 of an insulating film 46 will be explained hereinafter in relation to the manufacturing process.

FIGS. 9A and 9B to FIGS. 16A and 16B are cross-sectional views sequentially showing the manufacturing process of the memory cell array 1 according to this embodiment, FIGS. 9A to 16A show a cross section of the memory cell transistor MT in a direction of the bit line BL, and FIGS. 9B to 16B show a cross-sectional configuration of the memory cell transistor MT in a direction of the word line WL.

First, the memory cell transistor MT is formed on the semiconductor substrate 20 by a known method, and then the interlayer insulating film 31 is formed on the semiconductor substrate 20 to cover the memory cell transistor MT.

Subsequently, the interlayer insulating film 34 is formed on the interlayer insulating film 31. Further, the insulating film 35 is formed on the interlayer insulating film 34. The insulating film 35 is formed by using a material having a dielectric constant higher than that of the interlayer insulating film 34. Subsequently, an interlayer insulating film 48 is formed on the insulating film 35, and the insulating film 46 is formed on the interlayer insulating film 48 by using, e.g., a silicon nitride film as a material. Furthermore, a photoresist 49 is formed on the insulating film 46 to obtain FIGS. 9A and 9B.

Figure 10A:
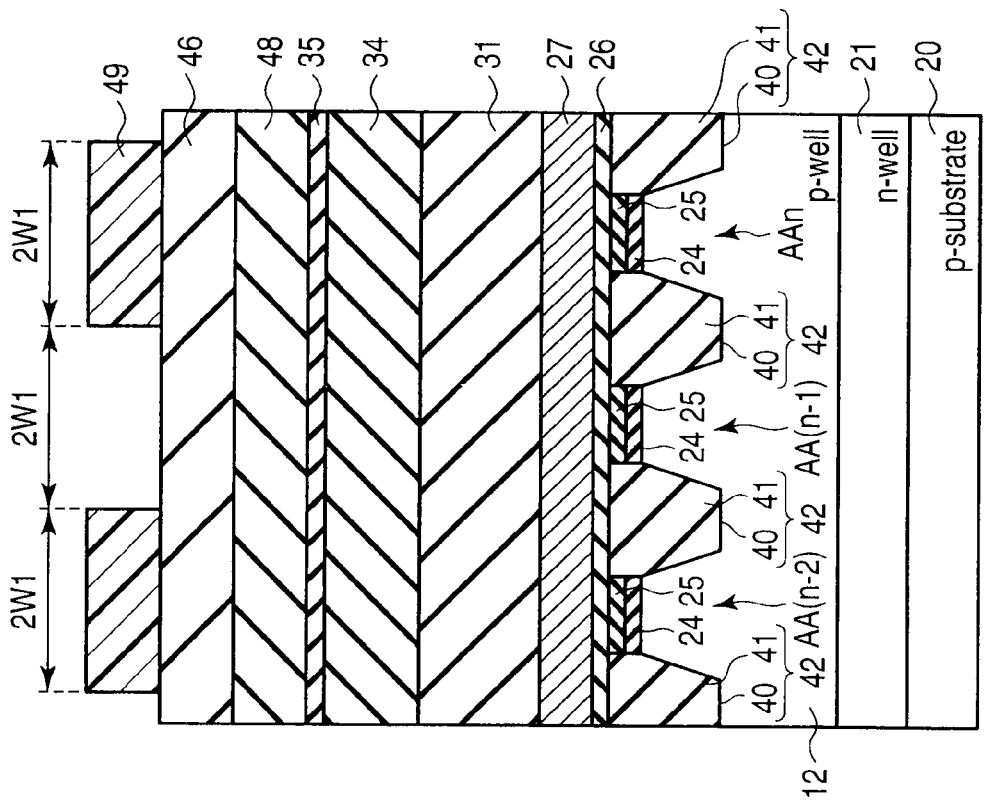
FIG. 10A and FIG. 10B are cross-sectional views showing a second manufacturing step of the semiconductor memory device according to the first embodiment.
Figure 10B:
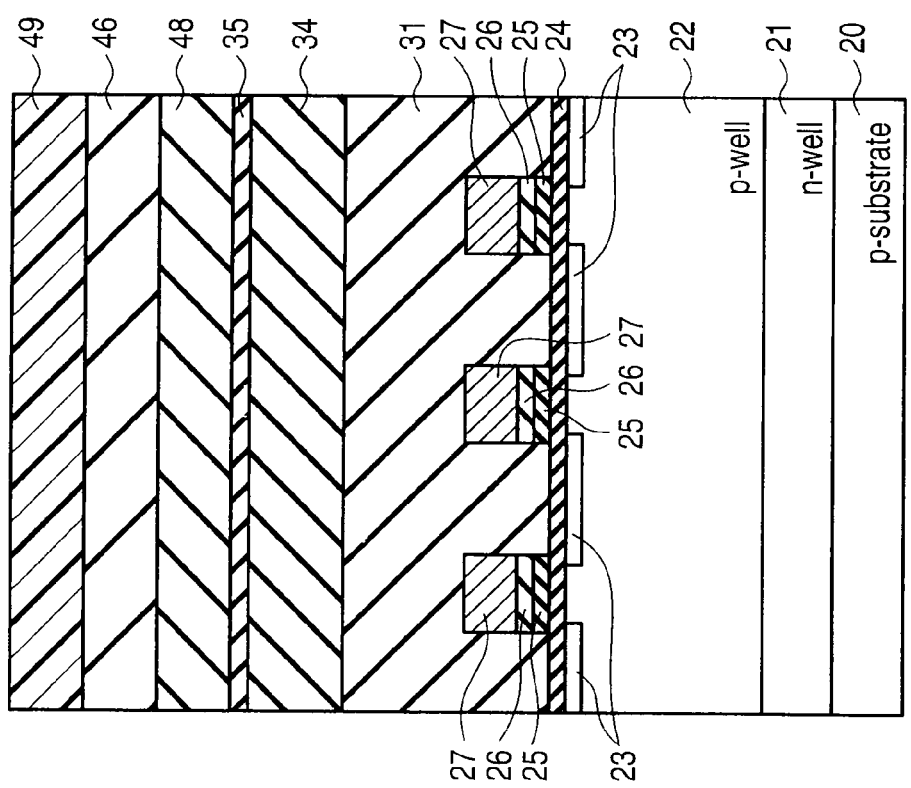

Then, as shown in FIGS. 10A and 10B, the photoresist 49 is developed into a desired pattern by a photolithography method, thereby forming the photoresist 49 having a desired pattern shape. At this time, the photoresist 49 has a line width which is double a minimum processing dimension. That is, assuming that the minimum processing dimension of the photoresist is W1, the line width shown in FIG. 10B is 2·W1. Furthermore, when a region where the photoresist 49 is formed is determined as a line and a region where the photoresist 49 is not formed is a space, a ratio of the line and the space is 1:1, namely, the space is 2·W1.

Then, as shown in FIGS. 11A and 11B, the photoresist 49 is subjected to slimming processing based on anisotropic etching to thin the photoresist 49 until a width which is equal to or below the photolithography resolution limit is obtained. As a result, the line width of the photoresist 49 becomes W1. Consequently, the space is widened to 3·W1. That is, the ratio of the line and the space becomes 1:3.

Thereafter, the insulating film 46 is etched with the photoresist 49 being used as a mask, thereby removing the photoresist 49.

Then, as shown in FIGS. 12A and 12B, the insulating film 50 consisting of, e.g., a silicon insulating film is deposited to cover the insulating film 46 by a CVD (Chemical Vapor Deposition) method or the like. Thereafter, the insulating film 46 is used as a stopper to polish the insulating film 50 by, e.g., a CMP (Chemical Mechanical Polishing) method. Moreover, as described above, a width of the insulating film 50 placed at a sidewall portion of the insulating film 46 becomes larger than W1. Therefore, a part between the insulating films 50 formed as sidewalls of the insulating film 46, i.e., the space becomes W2 (<W1). It is to be noted that widths of the insulating films 50 formed on both the sidewalls of the insulating film 46 are uniform.

Figure 13B:
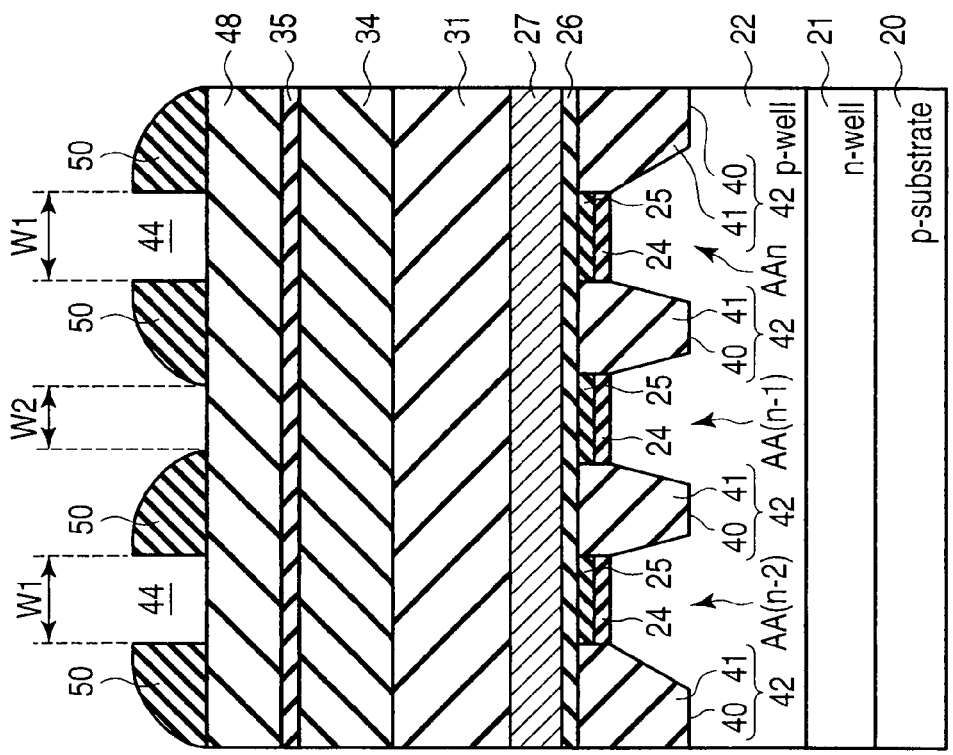
FIG. 13A and FIG. 13B are cross-sectional views showing a fifth manufacturing step of the semiconductor memory device according to the first embodiment.
Figure 13A:
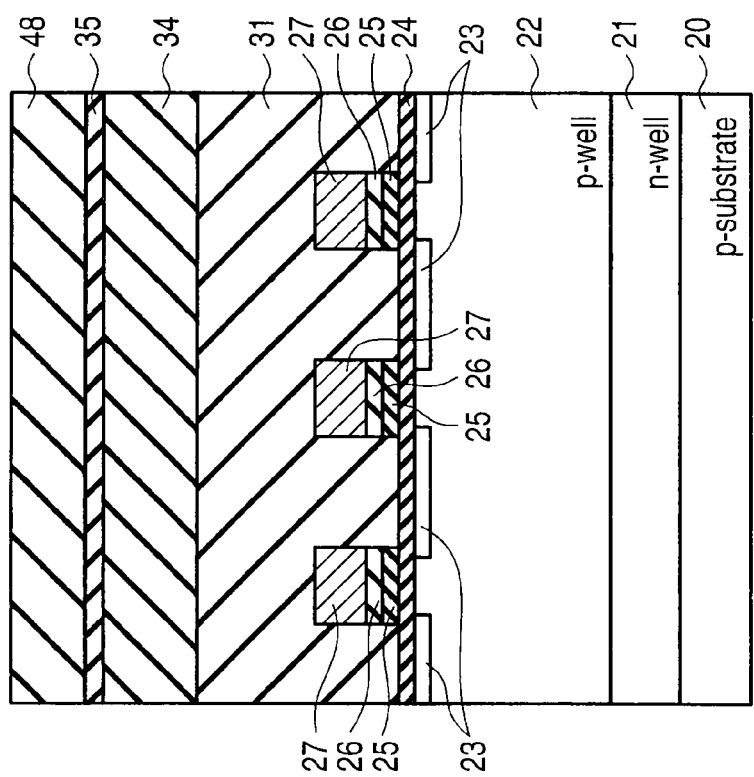
Figure 14B:
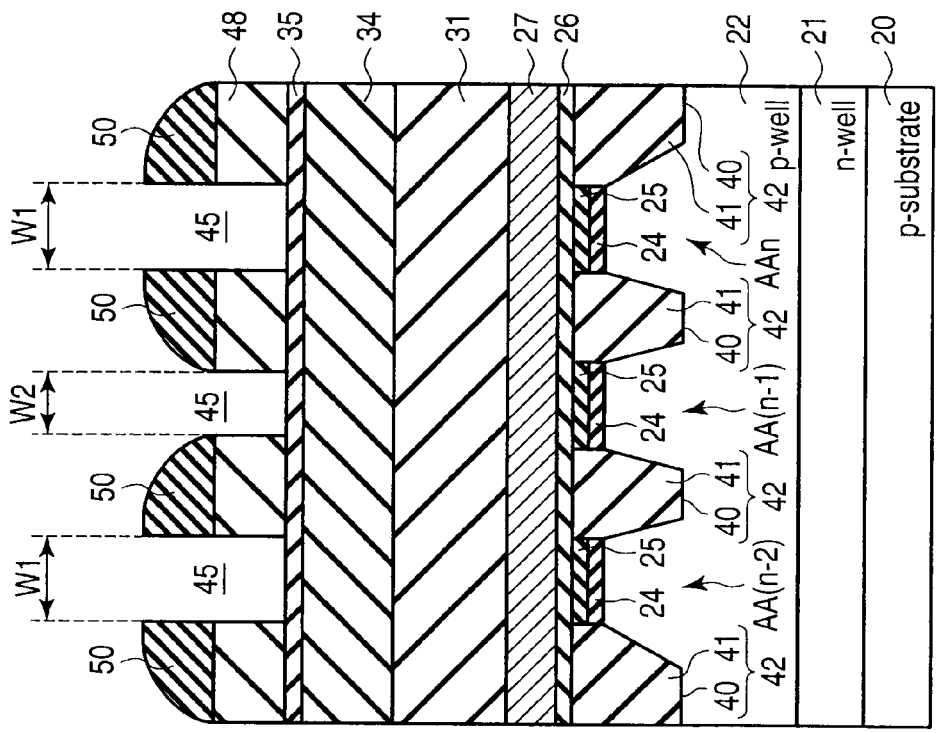
FIG. 14A and FIG. 14B are cross-sectional views showing a sixth manufacturing step of the semiconductor memory device according to the first embodiment.
Figure 14A:
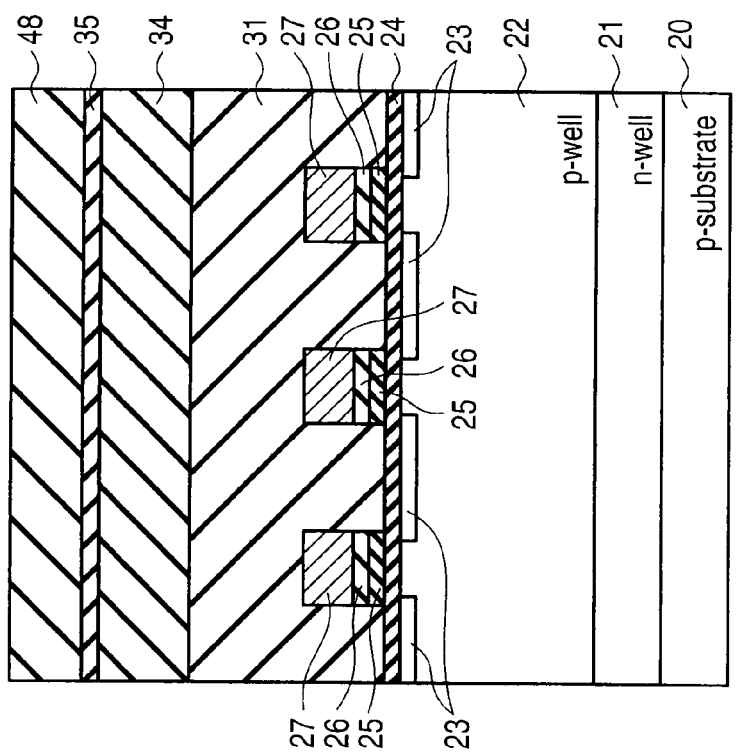

Subsequently, as shown in FIGS. 13A and 13B, the insulating film 46 alone is removed by using, e.g., wet etching to form each trench 44. Then, the insulating film 50 is used as a mask to etch the interlayer insulating film 48 by using an anisotropic etching technology such as RIE. As a result, a surface of the insulating film 35 is exposed. Consequently, each trench 45 can be obtained as shown in FIG. 14B.

Figure 15B:
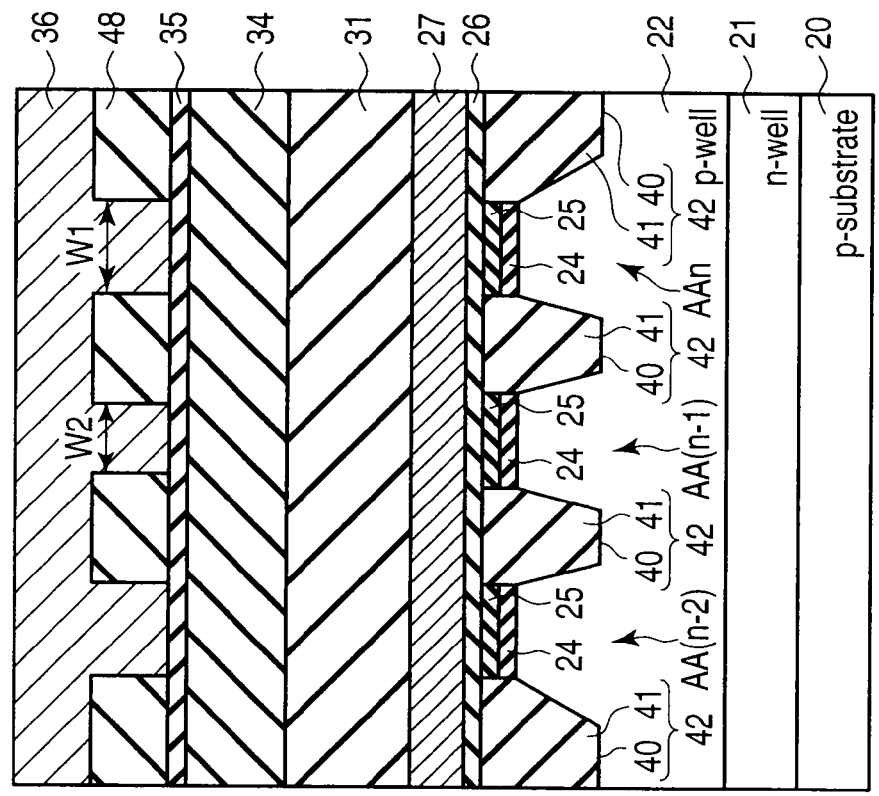
FIG. 15A and FIG. 15B are cross-sectional views showing a seventh manufacturing step of the semiconductor memory device according to the first embodiment.
Figure 15A:
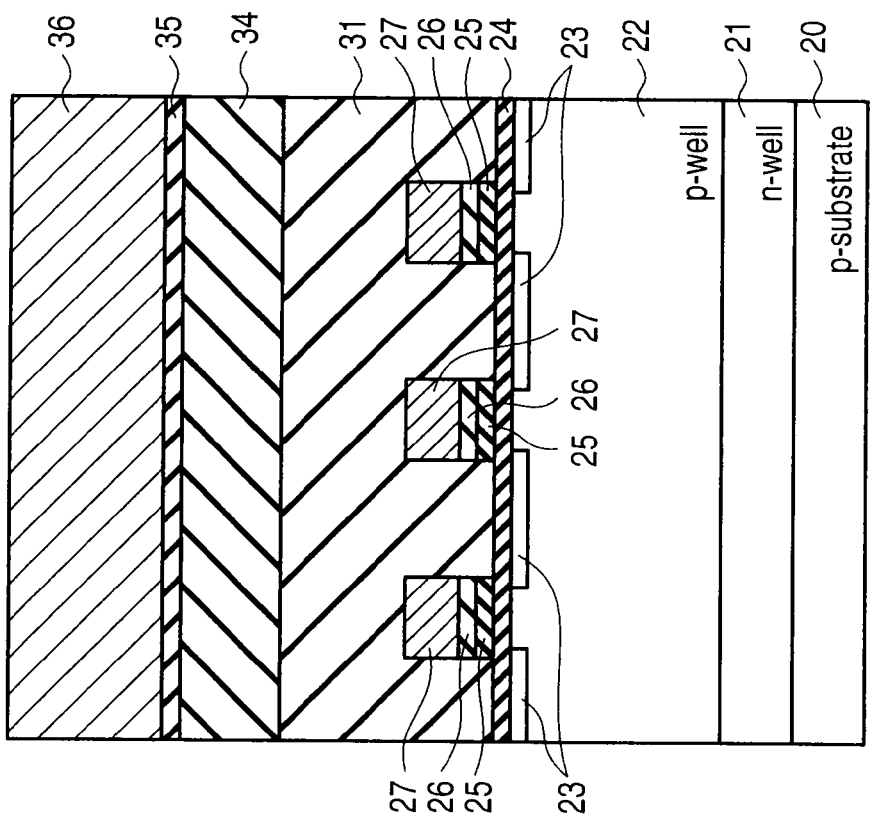

Then, as shown in FIGS. 15A and 15B, the insulating film 50 is removed by, e.g., wet etching, and then a metal film 36 is formed in each trench 45 to fill the spaces between the interlayer insulating films 48.

Moreover, the metal film 36 is polished and an upper surface thereof is flattened by, e.g., the CMP (Chemical Mechanical Polishing) method using each interlayer insulating film 48 as a stopper, and the metal film 36 is left in each trench 45 alone. Thereafter, an insulating film 37 is formed on the metal films 36 and the interlayer insulating films 48, thereby obtaining FIGS. 16A and 16B.

With the above-described manufacturing steps, the NAND flash memory is brought to completion. It is to be noted that W1 and W2 are alternately formed as the line widths of the bit lines BL. Here, it is assumed that the line width of the bit line BL2(j−1) is W1 and the line width of the bit line BL(2j−1) is W2. That is, the bit line BL2(j−1) and the bit line BL(2j−1) are alternately formed. At this time, assuming that a resistance value of the bit line BL2(j−1) per unit length is R1 and a resistance value of the bit line BL(2j−1) per unit length is R2, a relationship R2>R1 is achieved. It is to be noted that the example where the width of the insulating film 50 that functions as the sidewall is larger than the width W1 of the insulating film 46 in the manufacturing process has been described above, but the width of the insulating film 50 may be smaller than the width W1 of the insulating film 46. That is, the line width of the bit line BL2(j−1) is W1, whereas the line width of the bit line BL(2j−1) is, e.g., W3 larger than W1. Additionally, assuming that a resistance value of the bit line BL2(j−1) per unit length is R1 and a resistance value of the bit line BL(2j−1) per unit length is R3 at this moment, R3<R1 is achieved for the resistance R3. It is to be noted that an example where the width of the insulating film 50 that functions as the sidewall is larger than the width W1 of the insulating film 46 will be described in the embodiment.

An operation of the word line driver 13 at the time of reading will now be explained.

<Operation of Word Line Driver 13 in Reading>

In a read operation, the word line driver 13 associated with a selected word line transfers a voltage VCGR to the selected word line WL. On the other hand, the word line driver 13 associated with a non-selected word line transfers, e.g., a voltage VREAD to the non-selected word line WL.

The voltage VREAD is a voltage that is used to turn on the memory cell transistor MT irrespective of data in the memory cell transistor MT. The voltage VCGR is changed in accordance with data to be read.

For example, when the selected word line WL is a word line WL31, the word line driver 13 associated with the selected word line WL 31 transfers the voltage VCGR to the selected word line WL31. On the other hand, the word line drivers 13 associated with non-selected word lines WL0 to WL30 and non-selected word lines WL32 to WL63 transfer the voltage VREAD to the non-selected word lines WL0 to WL30 and the non-selected word lines WL32 to WL63. Additionally, when the memory cell transistor MT connected with the selected word line WL31 is turned on, an electrically conductive state is achieved between the bit line BL and the source line SL. That is, a current flows from the bit line BL to the source line SL. On the other hand, when the memory cell transistor MT is in an OFF state, an electrically non-conductive state is achieved between the bit line BL and the source line SL. That is, a current does not flow from the bit line BL to the source line SL. With the above-described operations, data is collectively read in regard to all the bit lines. It is to be noted that the voltage VCGR corresponds to the voltages V01 to V67 described in conjunction with FIG. 2.

<Operation of Word Line Driver 13 in Writing>

In a write operation, the word line driver 13 associated with the selected word line WL transfers a voltage VPGM to the selected word line WL. On the other hand, the word line driver 13 associated with the non-selected word line WL transfers, e.g., VPASS to the non-selected word line WL.

The voltage VPASS is a voltage that is used to turn on the memory cell transistor MT irrespective of data in the memory cell transistor MT. Further, the voltage VPGM is a high voltage that is required when injecting electrons into the charge storage layer based on FN tunneling.

<Read Operation of NAND Type Flash Memory>

A read operation of the thus configured NAND type flash memory will now be described while taking a situation where the word line WL31 in the block BLKs in FIG. 1 is a selected word line as an example.

First, the sense amplifier 4 precharges all the bit lines BL through the current paths of the MOS transistors 5.

Furthermore, the row decoder 3 selects, e.g., the block BLKs based on a block selection signal supplied from the control unit 2. Moreover, the row decoder 3 selects the word line WL31 based on a row address supplied from the control unit 2 and applies the read voltage VCGR to the selected word line WL31. Additionally, the row decoder 3 applies, e.g., the voltage VREAD to the non-selected word lines WL0 to WL30 and the non-selected word line WL32 to WL63. Further, the row decoder 3 applies the voltage Vsc to the select gates SGD1 and SGS1. It is to be noted that the voltage Vsc is, e.g., 4.0 [V].

The voltage VREAD is a voltage that turns on the memory cell transistor MT irrespective of data as explained above. Furthermore, the voltage VCGR is a voltage that is applied to the memory cell transistor MT as a read target as explained above, and it is changed in accordance with data to be read. The voltage Vsc applied to the select gate lines SGD1 and SGS1 is a voltage that can turn on the selective transistors ST1 and ST2.

As a result, the memory cell transistors MT connected with the non-selected word lines WL0 to WL30 and the non-selected word lines WL32 to WL63 are turned on, thereby forming channels. Moreover, the selective transistors ST1 and ST2 are also turned on.

Additionally, when the memory cell transistor MT connected with the selected word line WL31 is turned on, the electrically conductive state is achieved between the bit line BL and the source line SL. That is, a current flows from the bit line BL to the source line SL. As a result, the sense amplifier 4 senses a drain current Id flowing through the bit line BL to determine read data as "1". On the other hand, when the memory cell transistor MT is in the OFF state, the electrically non-conductive state is achieved between the bit line BL and the source line SL. That is, the current rarely flows from the bit line BL to the source line SL. Therefore, the sense amplifier 4 determines the read data as "0". With the above-described operations, data is collectively read in relation to all the bit lines BL.

Further, the sense amplifier 4 according to this embodiment senses a fluctuation in the current flowing through all the bit lines BL connected with the sense amplifier 4. That is, the sense amplifier 4 employs a scheme of collectively reading data with respect to all the bit lines BL.

<Write Operation of NAND Flash Memory>

A write operation of the NAND type flash memory having the above-described configuration will now be described hereinafter while taking a situation where the word line WL31 in FIG. 1 is a selected word line as an example.

At the time of writing data, write data is transferred to the bit line BL. That is, when increasing a threshold value of the memory cell transistor MT by injecting electrons into the charge storage layer, a write voltage (0 [V]) is applied to the bit line BL. On the other hand, when injecting no electron, a write prohibiting voltage (e.g., VDD) is applied.

Further, the word line driver 13 associated with the selected word line WL31 transfers a voltage VPGM to the selected word line WL31. On the other hand, the word line drivers 13 associated with non-selected word lines WL0 to WL30 and non-selected word lines WL32 to WL63 transfer, e.g., a voltage VPASS to the non-selected word lines WL0 to WL30 and the non-selected word lines WL32 to WL63.

As a result, the memory cell transistors MT connected with the non-selected word lines WL0 to 30 and WL32 to 63 are turned on, thereby forming channels. That is, current paths are formed in the NAND strings 7, and they enter an electrically conductive state. Furthermore, the selective transistor ST1 enters the ON state or the cutoff state in accordance with the write data, and the selective transistor ST2 is in the OFF state.

Moreover, when the write voltage is applied to, e.g., the bit line BL, the selective transistor ST1 enters the ON state, and the write voltage is transferred to a channel of the memory cell transistor MT. Then, in the memory cell transistor MT connected with the selected word line WL31, a potential difference between the gate and the channel substantially becomes the voltage VPGM, and electric charges are injected into the charge storage layer. Consequently, a threshold voltage of the memory cell transistor MT increases.

On the other hand, when the write prohibiting voltage is applied to the bit line BL, the selective transistor ST1 enters the cutoff state. Therefore, a channel of the memory cell transistor MT in the NAND string 7 enters an electrically floating state. Then, a channel potential of the memory cell transistor MT increases due to coupling with a gate potential (the voltage VPGM or the voltage VPASS). Therefore, in the memory cell transistor MT connected with the selected word line WL31, since a potential difference between the gate and the channel is smaller than the voltage VPGM, electric charges are not injected into the charge storage layer (to cause transition of held data). As a result, a threshold value of the memory cell transistor MT does not change. As explained above, the data write operation is carried out.

Figure 17:
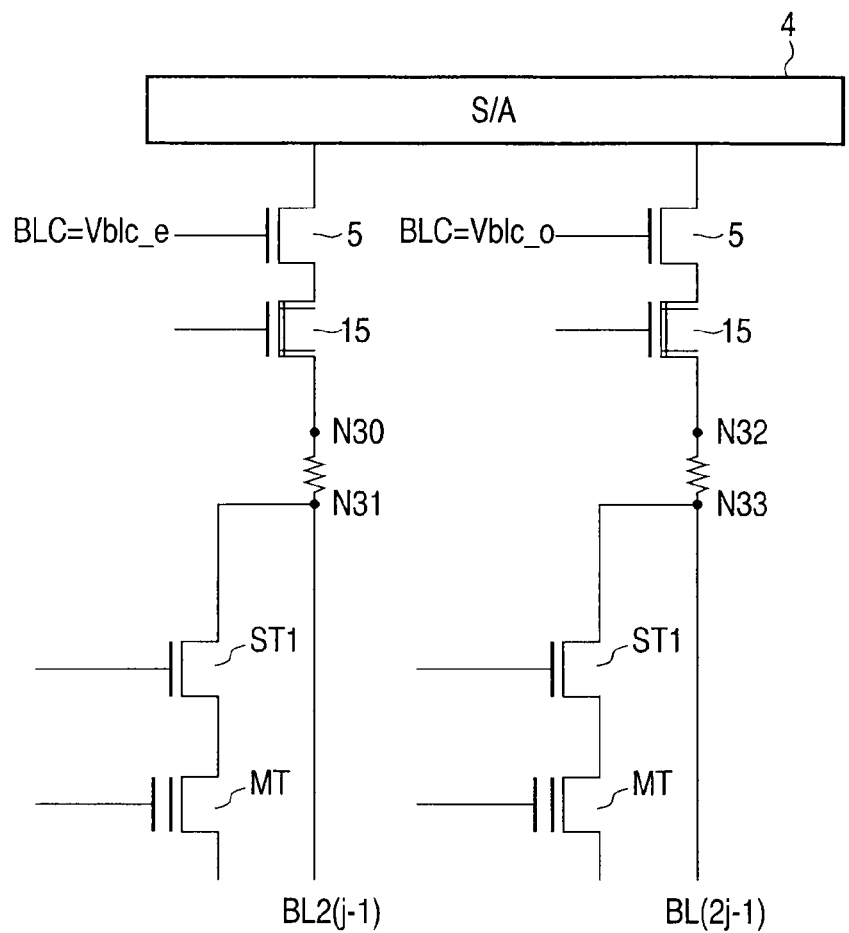
FIG. 17 is a circuit diagram of the semiconductor memory device according to the first embodiment.

In the semiconductor memory device according to this embodiment, as explained above with reference to FIG. 8, the voltage Vblc_e is supplied to the gate of the MOS transistor 5 electrically connected with the bit line BL2(j−1). Furthermore, the voltage Vblc_o is supplied to the gate of the MOS transistor 5 electrically connected with the bit line BL(2j−1). FIG. 17 shows this state. FIG. 17 is a circuit diagram in which attention is paid to the bit line BL2(j−1) and the bit line BL(2j−1) which are connected with the memory cell transistors MT, the sense amplifier 4 associated with the bit line BL2(j−1) and the bit line BL(2j−1), and the MOS transistors 5 which connect the sense amplifier 4 with the bit line BL2 (j−1) and the bit line BL(2j−1).

As shown in the drawing, FIG. 17 shows a configuration where a connection node at which the bit line BL2(j−1) is connected with one end of a current path of the MOS transistor 5 is a node N30 and a connection node at which the bit line BL2(j−1) is connected with a drain end of the memory cell transistor MT connected with the bit line BL2(j−1) is a node N31 in FIG. 1. Likewise, a connection node at which the bit line BL(2j−1) is connected with one end of a current path of the MOS transistor 5 is a node N32, and a connection node at which the bit line BL(2j−1) is connected with a drain end of the memory cell transistor MT connected with the bit line BL(2j−1) is a node N33.

Further, the voltage Vblc_e is supplied as the signal BLC_e from the non-illustrated BLC driver 6 to the gate of the MOS transistor 5 connected with the bit line BL2(j−1). Furthermore, the voltage Vblc_o is supplied as the signal BLC_o from the non-illustrated BLC driver 6 to the gate of the MOS transistor 5 connected with the bit line BL(2j−1). Moreover, as explained above, since the threshold value of the MOS transistor 5 is Vt2, a voltage 2·Iref·R_e obtained by subtracting the threshold value Vt2 from the signal BLC_e is applied to the node N30, and a voltage 2·Iref·R_o obtained by subtracting the threshold value Vt2 from the signal BLC_o is applied to the node N32. Additionally, wiring resistances are present between the nodes N30 and N31 and between the nodes N32 and N33. Therefore, voltages at the nodes N31 and N33 become lower than a potential 2I·ref·R_e or 2·Iref·R_o at the nodes N30 and N32 due to a voltage drop due to the wiring resistances.

Figure 18:
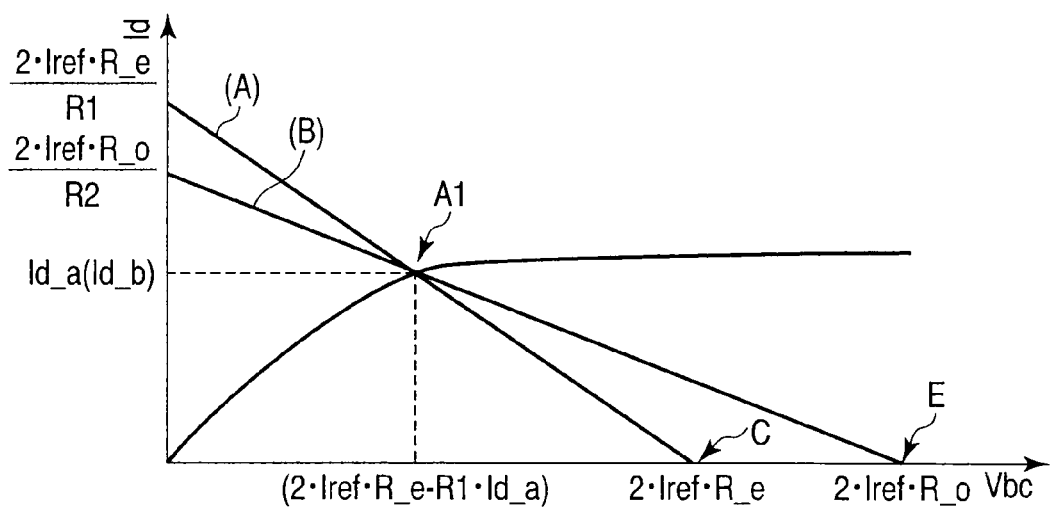
FIG. 18 is a graph of I-V characteristics of a memory cell transistor MT according to a first embodiment, wherein a line A indicates a load line of a bit line BL having a line width W1 and a line B indicates a load line of the bit line BL having a line width W2.

Further, a line width of the bit line BL(j−1) is W1, and a line width of the bit line BL(2j−1) is W2(<W1). That is, R2>R1 is achieved as explained above, a value of the wiring resistance in the bit line BL(2j−1) is larger than a value of the wiring resistance in the bit line BL2(j−1). That is, a value of a voltage drop between the nodes N32 and N33 is larger than a value of a voltage drop between the nodes N30 and N31. Thus, in this embodiment, resistance values that can achieve a relationship of resistance values R_o>R_e are selected in accordance with the line widths W of the bit lines BL, and Vblc_o>Vblc_e is attained, thereby equalizing the potentials at the nodes N31 and N33. As a result, an equipotential voltage is applied to the drain ends of the memory cell transistors MT connected with the nodes N31 and N33. It is to be noted that the voltage 2·Iref·R_o obtained by subtracting the threshold value of the MOS transistor 5 from the voltage Vblc_o is supplied as the signal BLC_o to the node N32 of the bit line BL(2j−1) having the width W2 and the resistance value R2 higher than the resistance value R1, and the voltage 2·Iref·R_e obtained by subtracting the threshold value of the MOS transistor 5 from the voltage Vblc_e is supplied as the signal BLC_e to the node N30 of the bit line BL2(j−1) having the width W1 and the resistance value R1. With the above-described configuration, a current Id_a and a current Id_b flowing through the bit line BL2(j−1) and the bit line BL(2j−1) having the different line widths W can take the same value. FIG. 18 shows this state.

FIG. 18 is a graph showing I-V characters of the memory cell transistor MT and load lines of the bit line BL2(j−1) and the bit line BL(2j−1). Further, an abscissa represents a voltage Vbc which is applied to a space between the drain and the source of the memory cell transistor MT, and an ordinate represents a drain current flowing through a channel region of the memory cell transistor MT.

As shown in the drawing, when the BLC driver 6 supplies the voltage Vblc_o larger than the voltage Vblc_e as the signal BLC_e to the gate of the MOS transistor 5 connected with the bit line BL(2j−1), the drain current Id_a flowing through the bit line BL(2j−1) can be approximated to the drain current Id_b flowing through the bit line BL2(j−1) as indicated by a line B. That is, as shown in the drawing, an I-V curve and a line A of the memory cell transistor MT and an operating point of I-V characteristics and a line B of the memory cell transistor MT can be approximated. This operating point is determined as A1. That is, assuming that a difference |Id_a−Id_b| between currents flowing through the node N31 and the node N33 is ΔIab=, ΔIab≈0 can be achieved. Moreover, at this time, potentials at the node N31 and the node N33 are equal potentials.

As a result, the sense amplifier 4 can suppress occurrence of erroneous reading of the current Id_a and the current Id_b flowing through the bit line BL2(j−1) and the bit line BL(2j−1) at the time of reading data.

It is to be noted that a point C indicates that the potential at the node N32 is equal to the potential at the node N33. That is, in this case, the current Id_b does not flow through the bit line BL(2j−1). Likewise, a point E indicates that a potential at the node N30 is equal to a potential at the node N31. That is, in this case, the current Id_a does not flow though the bit line BL2(j−1).

It is to be noted that, when the bit line BL2(j−1) has the line width W2 and the bit line BL(2j−1) has the line width W1, the voltage Vblc_o and the voltage Vblc_e can take inverse values.

Second Embodiment

A semiconductor memory device according to a second embodiment of the present invention will now be described. In this embodiment, an NAND type flash memory will be taken as an example and described like the first embodiment. According to this embodiment, the sense amplifier 4 functions as the voltage detection type in the first embodiment. As a result, as different from the first embodiment, a difference between the bit line BL capacities of the bit lines BL due to a variation in the line widths W of the bit lines BL becomes a problem. The bit line BL capacity when the bit line BL varies will now be described hereinafter with reference to FIG. 19. It is to be noted that the BLC driver 6 has the same configuration as that in the first embodiment, thereby omitting a description thereof.

<Bit Line BL Capacity>

Figure 19:
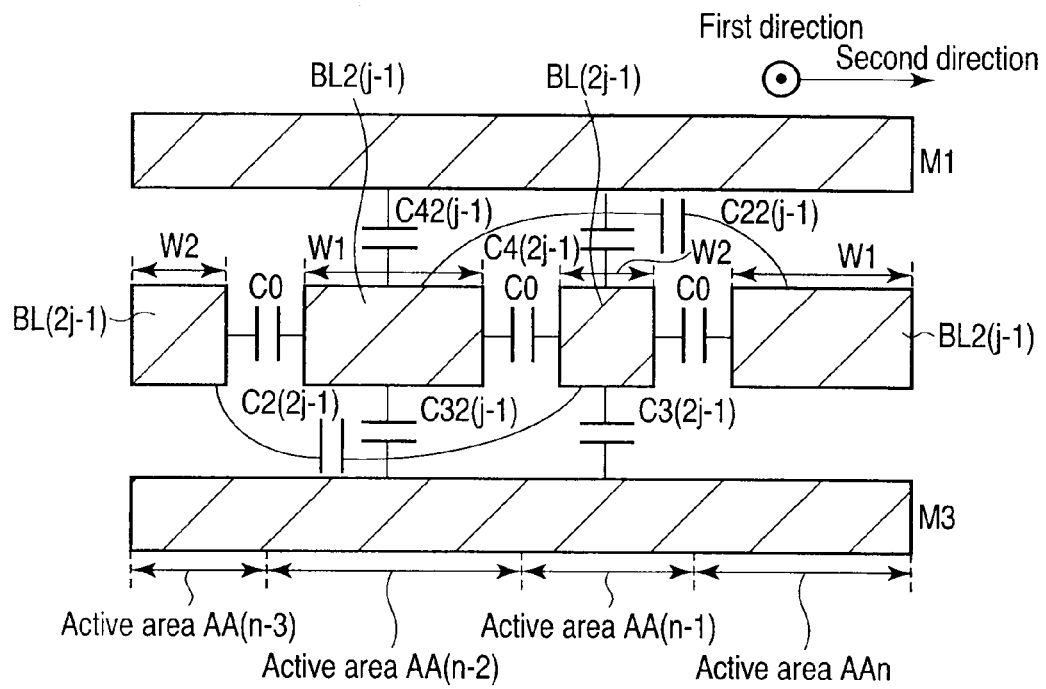
FIG. 19 is a cross-sectional view of the NAND type flash memory according to a second embodiment.

FIG. 19 is a cross-sectional view of a semiconductor memory device according to this embodiment depicted in FIG. 5, in which attention is paid to each bit line BL associated with an active area AA and a bit line BL capacity of the bit line BL. It is to be noted that a bit line BL(n−3) to a bit line BLn formed on active areas AA(n−3) to AAn are shown for the sake of convenience. That is, odd-numbered bit lines BL(2j−1) are provided in an active area AA(n−3) and an active area AA(n−1), and even-numbered bit lines BL2(j−1) are provided on an active area AA(n−2) and an active area AAn. Attention is paid to bit line BL capacities of the even-numbered bit line BL2(j−1) provided on the active area AA(n−2) and the odd-numbered bit line BL(2j−1) provided on the active area AA(n−1), and these bit line BL capacities will be described. Further, in FIG. 19, the bit line BL2(j−1) formed on the active area AA(n−2) has a line width W1, and the bit line BL(2j−1) formed on the active area AA(n−1) has a line width W2. It is to be noted that W2<W1 is achieved like the first embodiment. Furthermore, the bit line BL capacity of the bit line BL2(j−1) is a capacity $C_{2(j-1)}$, and the bit line BL capacity of the bit line BL(2j−1) is $C_{(2j-1)}$. The bit line BL capacity $C_{2(j-1)}$ and the bit line BL capacity $C_{(2j-1)}$ in this case are obtained. Additionally, element isolation regions formed between the active area AA(n−3) and the active area AAn will be omitted.

First, the bit line BL capacity $C_{2(j-1)}$ of the bit line BL2(j−1) can be represented as a sum of capacities of the bit lines BL(2j−1) formed on the active area AA(n−3) and the active area AA(n−1) adjacent to the bit line BL2(j−1) formed on the active area AA(n−2) in a second direction, the bit line BL2(j−1) formed on the active area AAn, a metal wiring layer M1, and a metal wiring layer M3 which functions as, e.g., a word line WL.

That is, assuming that a capacity of the bit line BL(2j−1) adjacent to the bit line BL2(j−1) formed on the active area AA(n−2) in the second direction is $C_0$, a capacity of the bit line BL2(j−1) formed on the active area AA(n−2) and the bit line BL2(j−1) formed on the active area AAn is $C2_{2(j-1)}$, a capacity of the bit line BL2(j−1) formed on the active area AA(n−2) and the metal wiring layer M1 is $C4_{2(j-1)}$, and a capacity of the bit line 2(j−1) formed on the active area AA(n−2) and the metal wiring layer M3 is $C3_{2(j-1)}$, the bit line BL capacitance $C_{2(j-1)}$ of the bit line BL2(j−1) formed on the active area AA(n−2) is represented by the following Expression (1).

$$C_{2(j-1)} = 2C_0 + C2_{2(j-1)} + C3_{2(j-1)} + C4_{2(j-1)} \tag{1}$$

Likewise, assuming that a capacity of the bit lines BL2(j−1) formed on the active area AA(n−3) and the active area AAn adjacent to the bit line BL(2j−1) formed on the active area AA(n−1) in the second direction is $C_0$, a capacity of the bit line BL(2j−1) formed on the active area AA(n−3) and the bit line BL(2j−1) formed on the active area AA(n−1) is $C2_{(2j-1)}$, a capacity of the bit line BL(2j−1) formed on the active area AA(n−1) and the metal wiring layer M1 is $C4_{(2j-1)}$, and a capacity of the bit line (2j−1) and the metal wiring layer M3 is $C3_{(2j-1)}$, the bit line BL capacity $C_{(2j-1)}$ of the bit line BL(2j−1) formed on the active area AA(n−1) can be presented by the following Expression (2).

$$C_{(2j-1)} = 2C_0 + C2_{(2j-1)} + C3_{(2j-1)} + C4_{(2j-1)} \tag{2}$$

Moreover, based on a relationship the line width W1 of the bit line BL2(j−1)>the line width W2 of the bit line BL(2j−1), $C2_{2(j-1)} > C2_{(2j-1)}$, $C3_{2(j-1)} > C3_{(2j-1)}$, and $C4_{2(j-1)} > C4_{(2j-1)}$ can be achieved. Therefore, the bit line BL capacity $C_{2(j-1)} >$ the bit line BL capacity $C_{(2j-1)}$ can be attained. Additionally, the bit line BL2(j−1) and the bit line BL(2j−1) store electric charges associated with the respective bit line BL capacities by using the sense amplifier 4 at the time of reading data. It is to be noted that a manufacturing process of the bit lines BL is the same as that in the first embodiment, thereby omitting a description thereof.

<Current Distribution of Memory Cell Transistor MT>

Each drain current Id flowing through the NAND string 7 connected with the bit line BL when the memory cell transistor MT in the NAND string 7 is in the ON state or the OFF state will now be described.

As explained in the first embodiment, the memory cell transistor MT takes either the ON state or the OFF state depending on a voltage supplied from the word line WL driver 13. Further, a drain current Id(on) flows through a channel region of the memory cell transistor MT in the ON state (which may be referred to as an ON cell hereinafter), and a drain current Id(off) flows through the channel region of the memory cell transistor MT in the OFF state (which may be referred to as an OFF cell hereinafter). As explained above, in the memory cell transistor MT, a value of the flowing current varies depending on the ON or OFF state, and a relationship Id(on)>Id(off) is achieved.

It is to be noted that each of the drain current Id(on) and the drain current Id(off) ranges with a fixed width. It is to be noted that the drain current Id(on) and the drain current Id(off) will be simply referred to as drain currents Id when they are not distinguished from each other.

<Read Operation of Sense Amplifier 4>

Figure 20:
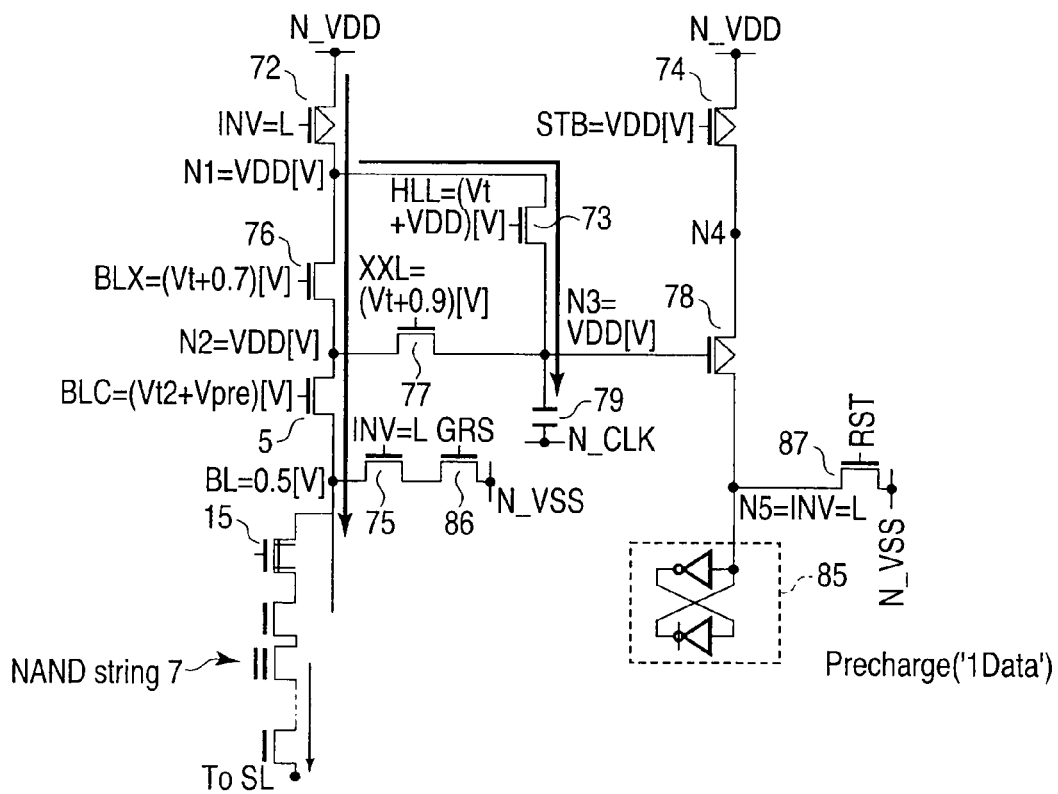

A data read operation by the sense amplifier 4 that functions as the voltage detection type will now be described with reference to FIGS. 20 to 22. Each of FIGS. 20 to 22 is a circuit diagram of the sense amplifier 4.

In data reading, when the memory cell transistor MT discharges the bit line BL and then the sense amplifier 4 senses a potential of the bit line BL, either data "1" or data "0" is judged. A criterion for the judgment by the sense amplifier 4 at this moment is determined based on a potential of the signal BLC. That is, a threshold value with which the MOS transistor 5 enters the ON state or the OFF state is determined based on the potential of the signal BLC.

The MOS transistor 5 enters the ON or OFF state based on the potential in the bit line BL. More specifically, when the memory cell transistor MT holds the data "1", a potential in the bit line BL is lowered, and the MOS transistor 5 enters the ON state. As a result, the sense amplifier 4 determines read data as the data "1". In this case, an electrically conductive state is achieved between the bit line BL and the source line SL, and the drain current Id(on) flows through the channel region of the memory cell transistor MT. On the other hand, when holding the data "0", a potential for precharge is maintained as the potential in the bit line BL, and the MOS transistor 5 enters the OFF state. That is, an electrically non-conductive state is achieved between the bit line BL and the source line SL. As a result, the sense amplifier 4 determines read data as the data "0". Further, in this case, the drain current Id(off) flows through the channel region of the memory cell transistor MT.

It is to be noted that XXL is, e.g., a voltage (Vt+0.9 V) during a read operation performed by the sense amplifier 4. Furthermore, the signal BLX takes, e.g., either a voltage (Vt+0.7 V) or 0 [V]. That is, a voltage (Vt+VDD) is supplied as the signal BLX at the time of precharging the bit line BL by the sense amplifier 4, and the signal BLX corresponds to 0 [V] at the time of sensing voltage data. The signal INV takes a value of either 0 [V] or the voltage VDD, for example. Moreover, as the signal INV, a signal when the voltage of 0 [V] is supplied is set to the "L" level, and a signal when the voltage VDD is supplied is set to the "H" level. The signal INV takes one of the signals "L" and "H" depending on a potential at the node N5. In other words, the signal INV takes either a status "L" or a status "H" in accordance with a state in a latch circuit 28 connected with the node N5. Additionally, the signal HLL has a value equal to or above the voltage (Vt+HDD). That is, the signal HLL corresponds to the voltage (Vt+VDD) or above when precharging the bit line BL by the sense amplifier 4, and the signal HLL corresponds to 0 [V] when sensing voltage data. Further, the signal GRS takes a value of either 0 [V] or VDD [V]. Furthermore, as the signal GRS, a signal when a voltage of 0 [V] is supplied is set to the "L" level, and a signal when VDD [V] is supplied is set to the "H" level. Vt is a threshold voltage of each of the MOS transistors 72 to 77, and Vt2 is a threshold voltage of the MOS transistor 5. Moreover, the signal STB takes a value of either 0 [V] or the voltage VDD. It is to be noted that the signals BLX, XXL, and HLL are supplied from the control unit 2, respectively.

A description will be first given as to CASE I which is an example where the sense amplifier 4 determines the data "1" in response to turning on the MOS transistor 5 by the signal BLC fed from the BLC driver 6 in accordance with a potential in the bit line BL in reading data by the sense amplifier 4.

(CASE I)

<Precharge>

As shown in FIG. 20, the sense amplifier 4 precharges the bit line BL. A situation where a precharge level Vpre of the bit line BL is 0.5 V is presumed in the following description.

At this time, the latch circuit 85 holds "0" by the MOS transistor 87. That is, in this case, since a voltage at the node N5 becomes 0 [V], the "L" level is supplied to the gate of the MOS transistor 72 as the signal INV. Moreover, a voltage (Vt+0.7 V) is supplied to the gate of the MOS transistor 76. As a result, each of the MOS transistor 72 and the MOS transistor 76 is turned on. Then, since the NAND string 7 is in the electrically conductive state, a drain current I(d) flows through the bit line BL through current paths of the MOS transistor 72, the node N1, the MOS transistor 76, the node N2, the MOS transistor 5, and the MOS transistor 15. As a result, a potential in the bit line BL becomes, e.g., approximately 0.5 V. Additionally, the voltage (Vt+VDD) is supplied to the gate of the MOS transistor 73, and the MOS transistor 73 is turned on. As a result, the capacitor element 79 is charged, and a potential at the node N3 becomes approximately VDD [V]. The MOS transistors 74 and 75 are in the OFF state. It is to be noted that the BLC driver 6 supplies a voltage (Vt2+Vpre) as the signal BLC to the gate of the MOS transistor 5.

<Discharge>

Then, as shown in FIG. 21, the MOS transistor 5 and the MOS transistor 76 are turned off. Therefore, each memory cell transistor MT included in the NAND string 7 is turned on, and the NAND string 7 is in the electrically conductive state, thereby discharging the bit line BL. That is, the bit line BL is discharged by the drain current Id(on) flowing through the memory cell transistor MT, and a potential in this bit line BL is lowered from 0.5 [V] to approximately 0.3 [V]. At this time, the voltage VDD is maintained as the voltage Vn3 at the node N3.

<Sensing>

Subsequently, as shown in FIG. 22, the sense amplifier 4 senses data. Further, since the MOS transistor 5 changes from the OFF state to the ON state based on the signal BLC, the node N3, the node N2, and the bit line BL are electrically connected. Furthermore, at this moment, since the bit line BL capacity is sufficiently larger than a capacity of the capacitor element 79, the potential at the node N3 becomes approximately 0.3 [V] equal to that in the bit line BL. This phenomenon is called charge transfer. It is to be noted that the detail of the potential at the node N3 which varies due to the charge transfer will be explained later.

Thereafter, since 0 [V] is supplied to the gate of the MOS transistor 77, the MOS transistor 77 is turned off. That is, the node N3 is electrically disconnected from the bit line BL. Then, when 0 [V] is supplied as the signal STB to the gate of the MOS transistor 74, the MOS transistor 74 is turned on, and a potential at the node N4 becomes the voltage VDD. As a result, a voltage between the gate and the source of the MOS transistor 78 becomes higher than a threshold voltage Vtp of the MOS transistor 78. Therefore, the MOS transistor 78 is turned on. In other words, since the voltage VDD is applied to the source of the MOS transistor 78 at the time of sensing, the MOS transistor 78 takes either the ON or OFF state (this value will be referred to as a voltage Vtrip) depending on whether a gate voltage is equal to or below (VDD−|Vtp|). Moreover, when reading the data "1", Vn3≦Vtrip is achieved. As a result, the potential at the node N5 increases to the voltage VDD from 0 [V]. That is, the signal INV is changed from the "L" level to the "H" level, data held in the latch circuit 85 changes from the voltage VDD to a voltage VSS.

Additionally, since the "H" level is supplied as the signal INV to the gate of the MOS transistor 72, the MOS transistor 72 is turned off, and the MOS transistor 75 is turned on. Further, a current flows through the node N_VSS from the bit line BL via the MOS transistors 75 and 86, and the potential in the bit line BL becomes 0 V.

As explained above, the data read operation is carried out by performing sensing and amplification with respect to the voltage of the bit line BL by the sense amplifier 4. In other words, the data read operation is effected by sensing the potential at the node N3.

That is, since the potential at the node N3 as a criterion for the judgment of determining the data "1" or the data "0" is the voltage Vn3 as explained above, when Vn3≦Vtrip is achieved, the MOS transistor 78 is turned on, and the latch circuit 85 stores the data "1".

(CASE II)

A description will now be given as to CASE II as an example where a current does not flow through the memory cell transistor MT and the sense amplifier 4 reads the data "0" at the time of sensing data.

In this case, the drain current Id flowing through the bit line BL is very small as compared with a counterpart at the time of reading the data "1", and approximately 0.5 V is maintained as the potential in the bit line BL, for example. That is, the potential in the bit line BL is fixed at, e.g., approximately 0.5 V while flowing the drain current Id(off) through the source line SL from the bit line BL. Further, then, even though the same voltage as that in CASE I is applied to BLC, 0.5 V is maintained in the bit line BL, and hence the MOS transistor 5 maintains the OFF state. That is, the bit line BL is not electrically connected with the node N3. As a result, VDD [V] is maintained as the voltage Vn3 at the node N3. Thereafter, the MOS transistor 77 is turned off, and then 0 [V] is supplied as the signal STB to the gate of the MOS transistor 74, thereby turning on the MOS transistor 74. As a result, the potential at the node N4 becomes the voltage VDD. Consequently, since a voltage between the gate and the source of the MOS transistor 78 becomes 0 [V], it is smaller than the threshold voltage Vtp of the MOS transistor 78. Therefore, the MOS transistor 78 is turned off. Accordingly, the latch circuit 28 maintains the potential 0 V. That is, at the time of reading the data "0", a value of the voltage Vn3 at the node N3 corresponds to the voltage VDD higher than the voltage Vtrip. In other words, Vn3>Vtrip is achieved.

<Charge Transfer by Sense Amplifier 4>

The voltage Vn3 at the node N3 that changes before and after sensing data by the sense amplifier 4 that functions as the voltage detection type will now be described. Thus, an intensity of a potential in the bit line BL after discharge will be first described, and an intensity of the potential in the bit line BL after the discharge and the detail of a value of the voltage Vn3 in comparison with the signal BLC output from the BLC driver 6 will be further explained. That is, there are provided two cases, i.e., a case where the signal BLC is higher than a potential obtained by adding the threshold value of the MOS transistor 5 to the potential in the bit line BL after the discharge (which will be referred to as A) and a case where the signal BLC is lower than the potential obtained by adding the threshold value of the MOS transistor 5 to the potential in the bit line BL after the discharge (which will be referred to as B hereinafter), and the voltage Vn3 in each case will be described. It is to be noted that the bit line BL2(j−1) and the bit line BL(2j−1) will be generically referred to as the bit lines BL for ease of explanation, and the detail of the signal BLC which is supplied to the gate of the MOS transistor 5 in accordance with the line width W of the bit line BL will be first described. The signals BLC associated with the bit line BL2(j−1) and the bit line BL(2j−1) will be then described, respectively. It is to be noted that the bit line BL capacity of the bit line BL is determined as C1.

As explained above, in data reading, the sense amplifier 4 first charges the bit line BL with the voltage Vpre. Thereafter, when the drain current Id flows through the channel region of the memory cell transistor MT in the NAND string 7, the bit line BL is discharged, and the voltage in the bit line BL after the discharge is determined as, e.g., Vdisc1.

Further, in the signal BLC output from the BLC driver 6, a value of the voltage Vn3 differs depending on a case where (A) BLC≧(Vt2+Vdisc1) and a case where (B) BLC<(Vt2+Vdisc1). The cases A and B will be separately explained hereinafter. It is to be noted that the threshold value of the MOS transistor 5 is Vt2 as explained above.

When (A) BLC>(Vt2+Vdisc1)

When the signal BLC output from the BLC driver 6 is compared with the potential in the bit line BL and BLC≧(Vt2+Vdisk1) is achieved, the MOS transistor 5 is turned on. That is, as exampled above, each memory cell transistor MT in the NAND string 7 is turned on, namely, the NAND string 7 enters the electrically conducive state. In other words, the sense amplifier 4 determines the data "1". Here, the drain current Id(on) flows through the channel region of the memory cell transistor MT. Furthermore, since the memory cell transistor MT is in the ON state, a time for which the voltage of the bit line BL is discharged due to the electrically conductive state of the NAND string is determined as a time T. Then, in the bit line BL having the bit line BL capacity, when the voltage Vpre changes to the voltage Vdisc1 during the discharge time T, an electric charge Q that has flowed through the bit line BL is equal to a value obtained when the drain current Id(on) is flowed through the memory cell transistor MT. It is to be noted that the drain current Id(on) takes a value associated with the voltage which changes during a given discharge time. Therefore, the drain current Id(on) during the discharge time T is determined as Id(on)avr for convenience sake. That is, it is represented by the following Expression (3).

$$C1(Vpre-Vdisc1)=T\cdot Id(\text{on})avr \qquad (3)$$

Organizing Expression (3) in regard to the voltage Vdisc1, this voltage can be represented by the following Expression (4).

$$Vdisc1=Vpre-T\cdot Id(\text{on})avr/C1 \qquad (4)$$

Here, since a voltage BLC≧(Vt2+Vdisc1) is supplied to the gate of the MOS transistor 5 as the signal BLC from the BLC driver 6, Expression (4) can be represented by the following Expression (5).

$$(Vt2+Vdisc1)=Vt2+(Vpre-T\cdot I(\text{on})davr/C1)\leq BLC \qquad (5)$$

That is, when the signal BLC satisfying Expression (5) is supplied to the MOS transistor 5 connected with the bit line BL having the bit line BL capacity C1, the MOS transistor 5 is turned on. It is to be noted that, since the bit line BL capacity of the bit line BL2(j−1) is a capacity $C_{2(j-1)}$, the signal BLC_e which should be applied to the gate of the MOS transistor 5 connected with the bit line BL2(j−1) is represented by the following Expression (6).

$$(Vt2+Vdisc1)=Vt2+(Vpre-T\cdot I(\text{on})davr/C_{2(j-1)})\leq BLC\_e \qquad (6)$$

That is, the following Expression (7) is provided in regard to the first driver circuit 172.

$$Vdisc1=(Vpre-T\cdot Id(\text{on})avr/C_{2(j-1)})\leq 2\cdot Iref\cdot R\_e \qquad (7)$$

That is, selecting the resistance R_e when Expression 7 is achieved causes the MOS transistor 5 to enter the ON state. As a result, the drain current Id(on) flows through the channel region of the memory cell transistor MT. Likewise, the signal BLC_o which should be applied to the gate of the MOS transistor 5 connected with the bit line BL(2j−1) is represented by the following Expression (8).

$$(Vt2+Vdisc1)=Vt2+(Vpre-T \cdot Id(\text{on})avr/C_{(2j-1)}) \leq BLC\_o \quad (8)$$

That is, the following Expression (9) is provided in regard to the second driver circuit 182.

$$Vdisc1=(Vpre-T \cdot Id(\text{on})avr/C_{(2j-1)}) \leq 2 \cdot Iref \cdot R\_o \quad (9)$$

That is, selecting the resistance R_o when Expression (9) is achieved causes the MOS transistor 5 to enter the ON state. That is, the drain current Id(on) flows through the channel region of the memory cell transistor MT.

A value of Vn3 will now be described. It is to be noted that attention is paid to one of the n bit lines BL and the sense amplifier 4 associated with this bit line BL in the following explanation.

It is assumed that an electric charge Q1 is stored in the bit line BL capacity C1 of the bit line BL as a result of discharge performed by the NAND string 7. At this time, a relationship between the voltage Vdisc1 and the capacity C1 of the bit line BL after discharge and an electric charge Q stored in the capacity C1 is represented by the following Expression (10).

$$Vdisc1=Q1/C1 \quad (10)$$

It is to be noted that the signal BLC supplied to the gate of the MOS transistor 5 is 0 [V] before sensing data by the sense amplifier 4 as explained above, and hence the voltage VDD is maintained as the voltage Vn3 at the node N3. Furthermore, when an electric charge Q2 is stored in the capacitor element 79, a voltage in the capacitor element 79 on the node N3 side is determined as a voltage Vq2. As explained above, since the capacity of the capacitor element 79 on the node N3 side is C2, the voltage Vq2 in the capacitor element 79 when the electric charge Q2 is stored is represented by the following Expression (11).

$$Vq2=Q2/C2 \quad (11)$$

Here, since the MOS transistor 5 is turned on at the time of sensing, the node N3 is electrically connected with the bit line BL, and the charge transfer occurs between the node N3 an the bit line BL. Moreover, the law of conservation of electric charge is achieved before and after the charge transfer. Therefore, a voltage V of the character element 79 and the bit line BL after the charge transfer is represented by the following Expression (12).

$$V=(Q1+Q2)/C=(C1Vdisc1+C2Vq2)/(C1+C2) \quad (12)$$

It is to be noted that a capacity C is a coupling capacitance of the capacitor element 79 and the bit line BL capacity. Additionally, organizing Expression (12), the voltage V can be represented by the following Expression (13).

$$V=C1Vdisc1/(C1+C2)+C2Vq2(C1+C2) \quad (13)$$

Further, since a value of C1 is approximately 100 times larger than C2, it can be considered that C1>>C2 is attained. That is, assuming that C2/C1≈0 is achieved in Expression (13), the following Expression (14) can be obtained.

$$V=Vdisc1 \quad (14)$$

That is, before and after sensing data by the sense amplifier 4 which functions as the voltage detection type, the voltage Vn3 changes from the voltage VDD to a value which is substantially equal to that in the bit line BL. That is, the voltage Vn3 at the node N3 is determined based on the voltage Vdisc1 in the bit line BL. In other words, determining a value of the signal BLC irrespective of the potential in the bit line BL after discharge enables determining a sensing level of the sense amplifier 4.

When (B) BLC<(Vt2+Vdisc1)

When the signal BLC output from the BLC driver 6 is compared with the potential in the bit line BL and BLC<(Vt+Vdisc1) is achieved, the MOS transistor 5 maintains the OFF state. Therefore, as explained above, the memory cell transistor MT in the NAND string 7 enters the OFF state, namely, the NAND string 7 enters the electrically non-conductive state. In other words, the sense amplifier 4 determines the data "0". Here, the drain current Id(off) flows through the channel region of the memory cell transistor MT.

Additionally, since the voltage BLC<(Vt2+Vdisc1) is supplied to the gate of the MOS transistor 5 as the signal BLC from the BLC driver 6, the drain current Id(on) is substituted by the drain current Id(off) in Expression (4), and the following Expression (15) is provided.

$$(Vt2+Vdisc1)=Vt2+(Vpre-T \cdot Id(\text{off})avr/C1)>BLC \quad (15)$$

Further, since the bit line BL capacity of the bit line BL2(j−1) is the capacity $C_{2(j-1)}$, the signal BLC_e which should be applied to the gate of the MOS transistor 5 connected with the bit line BL2(j−1) is represented by the following Expression (16).

$$(Vt2+Vdisc1)=Vt2+(Vpre-T \cdot ID(\text{off})avr/C_{2(j-1)})>BLC\_e \quad (16)$$

That is, the following Expression (17) can be provided in regard to the first driver circuit 172.

$$Vdisc1=(Vpre-T \cdot Id(\text{off})avr/C_{2(j-1)})>2 \cdot Iref \cdot R\_e \quad (17)$$

Likewise, the signal BLC_o which should be applied to the gate of the MOS transistor 5 connected with the bit line BL(2j−1) is represented by the following Expression (18).

$$(Vt2+Vdisc1)=Vt2+(Vpre-T \cdot Id(\text{off})avr/C_{(2j-1)})>BLC\_o \quad (18)$$

That is, the following Expression (19) can be provided in regard to the second driver circuit 182.

$$Vdisc1=(Vpre-T \cdot Id(\text{off})avr/C_{(2j-1)})>2 \cdot Iref \cdot R\_o \quad (19)$$

In this case, since the MOS transistor 5 is in the OFF state, the node N3 is electrically disconnected with the bit line BL. That is, the voltage VDD is maintained as the voltage Vn3 at the node N3.

It is to be noted that a relationship between the signal BLC_e and the signal BLC_o is represented by the following Expression (20) based on Expression (7) and Expression (9).

$$BLC\_e=BLC\_o+(1/C_{(2j-1)}-1/C_{2(j-1)})Id(\text{on})avr \cdot T \quad (20)$$

It is to be noted that since the memory cell transistors MT included in the NAND string 7 have the same characteristics in this embodiment, and hence the drain currents Id flowing through the channels of the memory cell transistors MT are equal.

<Read Operation of Semiconductor Memory Device>

Figure 23:
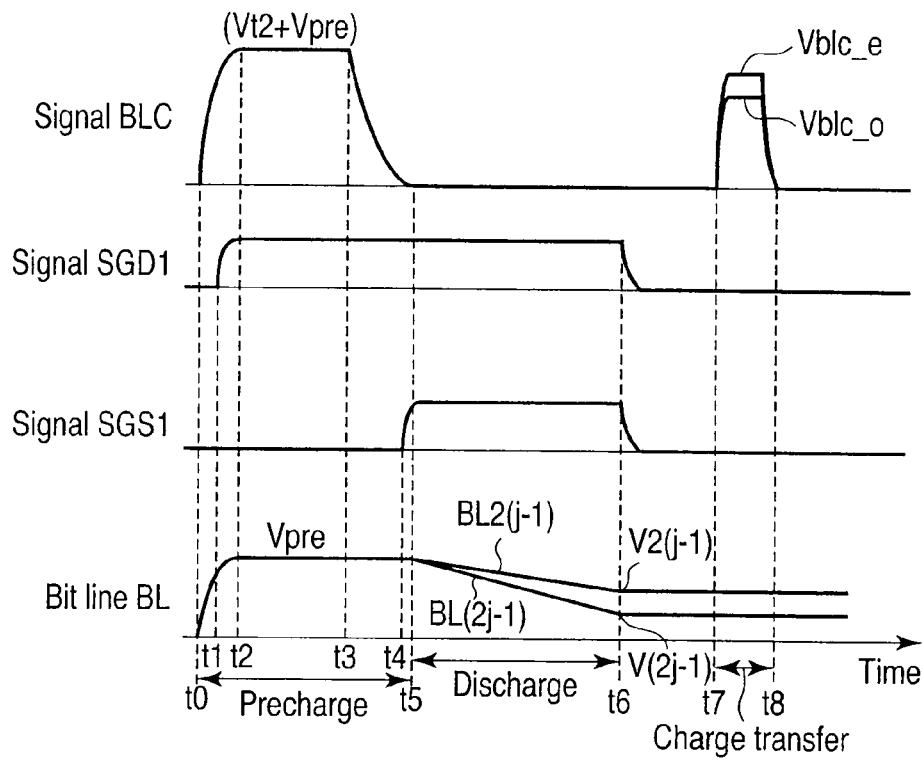
FIG. 23 is a time chart of each voltage at the time of a read operation in a semiconductor memory device according to the second embodiment.

A data read operation in the semiconductor memory device according to this embodiment will now be described with reference to FIG. 23. FIG. 23 is a time chart showing changes in potentials in the bit line BL2(j−1), the bit line BL(2j−1), the signal SGD, the signal SGS, and the signal BLC applied to the gate of the MOS transistor 5 at the time of reading data by the sense amplifier 4. Further, as shown in the drawing, an ordinate represents a potential of each signal line, and an abscissa represents a time. It is to be noted that the data "1" is read by the sense amplifier 4 in the following explanation. That is, assuming that voltages in the bit line BL2(j−1) and the bit line (2j−1) after the discharge are voltages V2(j−1) and V(2j−1), respectively, the signals BLC_e and BLC_o are represented by the following Expressions (21) and (22).

$$BLC\_e > (Vt2 + V2(j-1)) \quad (21)$$

$$BLC\_o > (Vt2 + V(2j-1)) \quad (22)$$

First, at a time t0, the sense amplifier 4 precharges the bit line BL to start reading data. Specifically, the BLC driver 6 supplies, e.g., the voltage (Vt2+Vpre) as the signal BLC to the gate of the MOS transistor 5 to charge the potential in the bit line BL to the voltage Vpre. As a result, at the time t0, the potential in the bit line BL starts to increase by the sense amplifier 4. Furthermore, at a time t1, the select gate line driver 11 supplies the voltage Vsc as the signal SGD1 to the gate of the selective transistor ST1. As a result, at the time t1, the voltage applied to the gate electrode of the selective transistor ST1 increases. Furthermore, at a time t2, the signal SGD1 reaches the voltage Vsc. The voltage Vsc is, e.g., 4 [V]. Moreover, at the time t2, the selective transistor ST1 is consequently turned on. Additionally, at the time t2, the signal BLC reaches the voltage (Vt2+Vpre), and the potential in the bit line BL reaches the voltage Vpre. Further, at a time t3, the BLC driver 6 outputs 0 [V] as the signal BLC to complete the precharge performed by the sense amplifier 4. As a result, the MOS transistor 5 is turned off. Further, at a time t5, the signal BLC supplied to the gate of the MOS transistor 5 is changed to 0 [V]. It is to be noted that the select gate line driver 12 raises the signal SGS1 supplied to the gate electrode of the selective transistor ST2 at a time t4. Furthermore, at the time t5, the signal SGS1 reaches the voltage Vsc. The voltage Vsc is, e.g., 4.0 [V]. As a result, at the time t5, the selective transistor ST2 is turned on. Then, since the selective transistor ST2 is in the ON state, the drain currents Id having the same intensity flow through the memory cell transistors MT connected with the bit line BL2(j−1) and the bit line BL(2j1), respectively. That is because the memory cell transistors MT connected with the bit line BL2(j−1) and the bit line BL(2j−1) have the same characteristics. Additionally, the drain current Id(on) flows into the source line SL. That is, the memory cell transistor MT starts the discharge of the bit line BL. A description will be separately given to the bit line BL2(j−1) having the line width W1 and the bit line BL(2j−1) having the line width W2 at the time t5 or later.

At the time t5, discharge in each of the bit line BL2(j−1) and the bit line BL(2j−1) starts. A discharge rate in the bit line BL differs depending on the bit line BL capacity of the bit line BL even though the same drain current Id flows through each memory cell transistor MT. That is because the bit line BL capacity $C_{2(j-1)}$ of the bit line BL2(j−1) is larger than the bit line BL capacity $C_{(2j-1)}$ of the bit line BL(2j−1) as explained above. Therefore, a gradient of the discharge in the bit line BL2(j−1) is smaller than a gradient of the discharge in the bit line BL(2j−1). That is, since the bit line BL capacity of the bit line BL(2j−1) is smaller than that of the bit line BL2(j−1), the voltage after the discharge becomes smaller than that in the bit line BL2(j−1) even though the discharge time T is unchanged. It is to be noted that the discharge time T is (t6-t5).

Moreover, at a time t6, the select gate line drivers 11 and 12 terminate outputting the signals SGD1 and SGS1 supplied to the gates of the selective transistors ST1 and ST2, respectively. As a result, the selective transistors ST1 and ST2 are turned off, respectively. Consequently, the discharge in the bit line BL by the memory cell transistor MT is terminated. It is to be noted that the potential in the bit line BL2(j−1) at the time t6 is determined as the voltage $V_{2(j-1)}$ and the potential in the bit line BL(2j−1) at the same time is determined as $V_{(2j-1)}$. Further, the voltage $V_{2(j-1)}$ > the voltage $V_{(2j-1)}$ is achieved.

Thereafter, at a time t7, to read data, the BLC driver 6 supplies the signals BLC_e and BLC_o that satisfy Expressions (22) and (23), i.e., the voltage Vblc_e and the voltage Vblc_e to the gates of the MOS transistors 5 connected with the bit line BL2(j−1) and the bit line BL(2j−1) as the signals BLC, respectively. Furthermore, at a time t8, to terminate reading the data, the BLC driver 6 finishes outputting the signals BLC.

In the semiconductor memory device according to this embodiment, at the time of sensing, the BLC driver 6 can generate the signals BLC associated with the bit line BL capacity $C_{2(j-1)}$ of the bit line $BL_{2(j-1)}$ and the bit line BL capacity $C_{(2j-1)}$ of the bit line BL(2j−1). Therefore, erroneous reading can be reduced. A data read operation in the semiconductor memory device according to this embodiment will now be described with reference to FIG. 23. Moreover, FIG. 23 shows changes in the signal BLC output from the BLC driver 6 in accordance with the line widths W of the bit line BL2(j−1) and the bit line BL(2j−1) at the time of sensing.

As shown in the drawing, in the semiconductor memory device according to this embodiment, at the time t7, the BLC driver 6 generates the signal BLC_e and the signal BLC_o associated with the line widths W of the bit line BL2(j−1) and the bit line BL(2j−1). Specifically, the BLC driver 6 supplies a voltage (Vt2+$V_{2(j-1)}$) as the signal BLC_e to the gate of the MOS transistor 5 connected with the bit line BL2(j−1) having the voltage $V_{2(j-1)}$ after the discharge. Additionally, the BLC driver 6 supplies a voltage (Vt2+$V_{(2j-1)}$) as the signal BLC_o to the gate of the MOS transistor 5 connected with the bit line BL(2j−1) having the voltage $V_{(2j-1)}$ after the discharge. As a result, even if the bit line BL capacity of the bit line BL differs depending on the line width of the bit line BL and the voltage in the bit line BL after the discharge thereby differs, erroneous data reading performed by the sense amplifier 4 can be reduced. That is, since the line width W1 is larger than the line width W2, the voltage after the discharge is high. Therefore, to electrically connect the bit line BL2(j−1) to the node N3 at the time of sensing, the signal BLC_e must be higher than the signal BLC_o which is applied to the gate of the MOS transistor 5 connected with the bit line BL(2j−1). That is, the BLC driver 6 supplies a voltage exceeding a voltage difference between the voltage in the bit line BL2(j−1) and the voltage at the gate of the MOS transistor 5 connected with the bit line BL2(j−1), e.g., the voltage (Vt2+$V_{2(j-1)}$) as the signal BLC_e.

<Modification>

Figure 24:
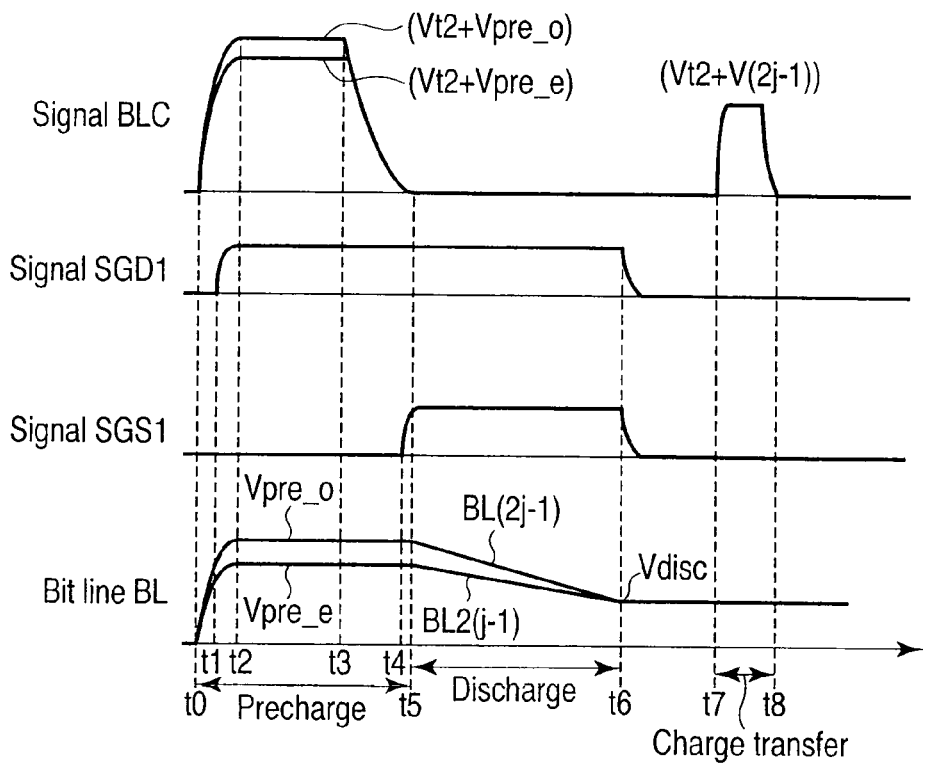
FIG. 24 is a time chart of each voltage at the time of the read operation in the semiconductor memory device according to a modification of the second embodiment of the present invention.

A data read operation according to a modification of the semiconductor memory device of this embodiment will now be described with reference to FIG. 24. FIG. 24 shows that the BLC driver 6 changes a voltage for precharge in accordance with the bit line BL2(j−1) and the bit line BL(2j−1) and the signal BLC at the time of sensing is set to a voltage (Vt2+V(2j−1)) irrespective of the line width W of each bit line BL in the time chart of FIG. 23. It is to be noted that a description on the same operation as that in the time chart described in conjunction with FIG. 23 will be omitted.

As shown in FIG. 24, in the data read operation according to the modification, the potentials in the bit line BL2(j−1) and the bit line BL(2j−1) are changed at the time of precharge while considering a difference between the potentials in the bit lines BL due to the line widths W of the bit lines BL after the discharge. A description will now be given hereinafter with reference to FIG. 24.

First, at a time t0, the BLC driver 6 supplies a voltage (Vt2+Vpre_e) to the gate of the MOS transistor 5 connected with the bit line BL2(j−1) as the signal BLC_e, for example. Additionally, the BLC driver 6 supplies a voltage (Vt2+Vpre_o) to the gate of the MOS transistor 5 connected with the bit line BL(2j−1) as the signal BLC_o, for example. That is, the following Expressions (23) and (24) can be provided.

$$V\text{pre\_}e = 2 \cdot Iref \cdot R\_e \quad (23)$$

$$V\text{pre\_}o = 2 \cdot Iref \cdot R\_o \quad (24)$$

That is, resistance elements R_e and R_o that satisfy the relationships in Expressions (23) and (24) are selected. It is to be noted that a relationship the voltage (Vt2+Vpre_o)>the voltage (Vt2+Vpre_e) is achieved. As a result, the bit line BL2(j−1) is charged to the voltage Vpre_e, and the bit line BL(2j−1) is charged to the voltage Vpre_o. That is, the potentials in the bit line 2(j−1) and the bit line BL(2j−1) at the time t5 that the discharge begins correspond to the voltage Vpre_e and the voltage Vpre_o, respectively.

Further, at the time t5, the signal BLC output from the BLC driver 6 has 0[V]. Furthermore, since the select gate line drivers 11 and 12 terminate the signals SGD1 and SGS1, respectively, at the time t6, the discharge in each of the bit line BL2(j−1) and the bit line (2j−1) is stopped. It is to be noted that the bit line BL2(j−1) and the bit line BL(2j−1) have the same voltage at the time t6. Moreover, the potential in each of the bit line BL2(j−1) and the bit line BL(2j−1) at the time t6 is determined as a voltage Vdisc.

It is to be noted that a relationship between the signal BLC_e and the signal BLC_o supplied to the gates of the MOS transistors 5 by the BLC driver 6 is represented by the following Expression (25).

$$BLC\_e = BLC\_o - (1/C_{(2j-1)} - 1/C_{2(j-1)})Id \cdot T \quad (25)$$

The semiconductor memory device according to the modification of this embodiment can reduce the erroneous reading performed by the sense amplifier 4 at the time of reading data. That is, in the modification, the BLC driver 6 outputs the voltage (Vt2+Vpre_e) and the voltage (Vt2+Vpre_o) considering a potential difference between the bit line BL2(j−1) and the bit line BL(2j−1) after the discharge at the time of precharge. As a result, for example, even though the bit line BL2(j−1) and the bit line BL(2j−1) have different bit line BL capacities, the erroneous reading performed by the sense amplifier 4 when reading data can be reduced.

Third Embodiment

A semiconductor memory device according to a third embodiment of the present invention will now be described. In this embodiment, an NAND type flash memory will be taken as an example and explained like the first and second embodiment. According to this embodiment, the sidewall processing technology is used to form trenches and then the Damascene method is applied to form the active areas AA in the first embodiment.

According to this method, the active areas AA having large and small different widths may be repeatedly formed in some cases. That is, memory cell transistors MT having different characteristics are repeatedly formed.

Further, according to this embodiment, characteristics of the different memory cell transistors MT are controlled by controlling a signal BLC. A control method for the signal BLC will be classified into CASE I to CASE III and explained. It is to be noted that this embodiment may have a situation where the bit lines BL described in the first embodiment may not vary. A manufacturing process in which the Damascene method is applied to the active areas AA when using the sidewall processing technology will now be described with reference to FIGS. 25A to 33A, and FIGS. 25B to 33B. FIGS. 25A to 33A, and FIGS. 25B to 33B are cross-sectional views sequentially showing a manufacturing process of each active area in which a memory cell transistor MT is formed, where each of FIGS. 25A to 33A shows a cross section of a memory cell transistor MT in a bit line BL direction and each of FIGS. 15B to 33B shows a cross-sectional configuration of the memory cell transistor in a word line WL direction.

<Manufacturing Process of Active Area AA>

Figure 25B:
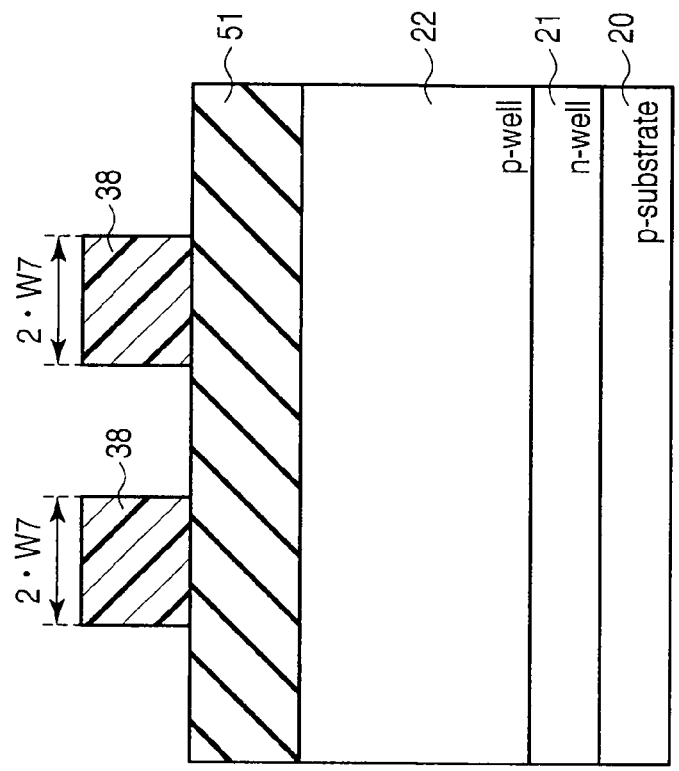
FIG. 25A and FIG. 25B are cross-sectional views showing a first manufacturing step of a semiconductor memory device according to a third embodiment of the present invention.
Figure 25A:
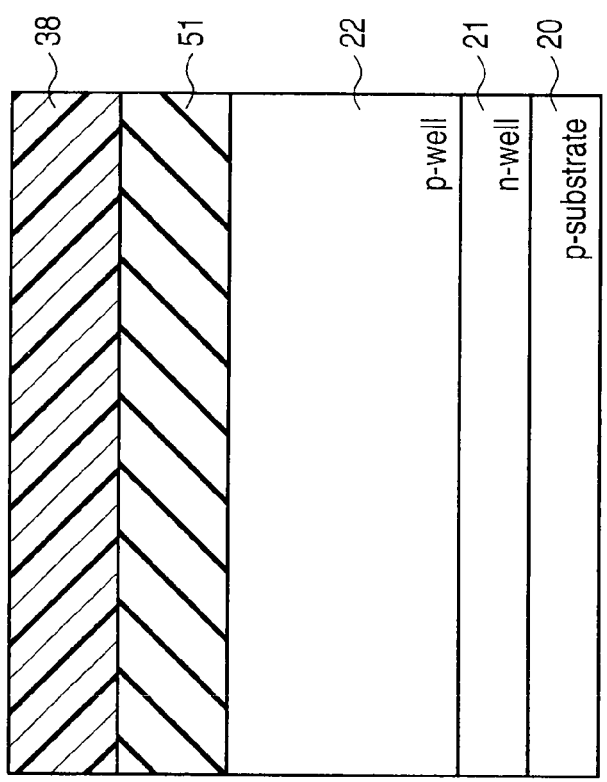
Figure 27B:
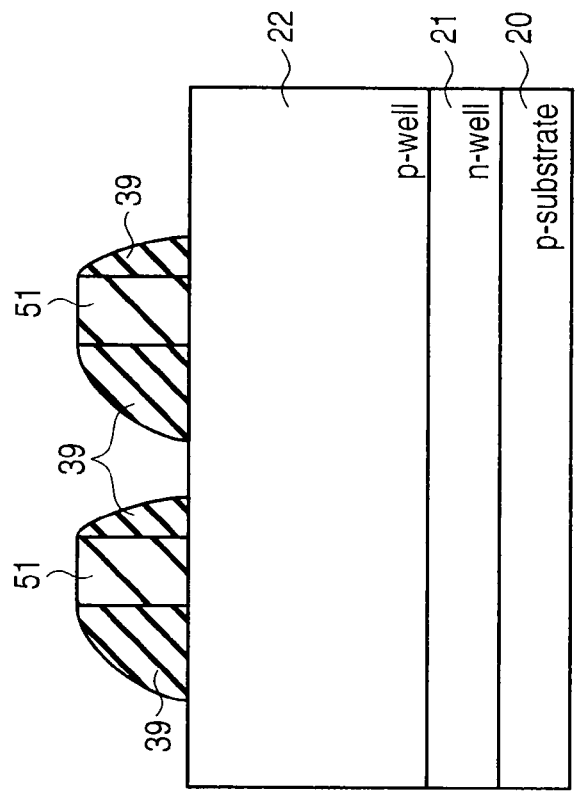
FIG. 27A and FIG. 27B are cross-sectional views showing a third manufacturing step of the semiconductor memory device according to the third embodiment.
Figure 27A:
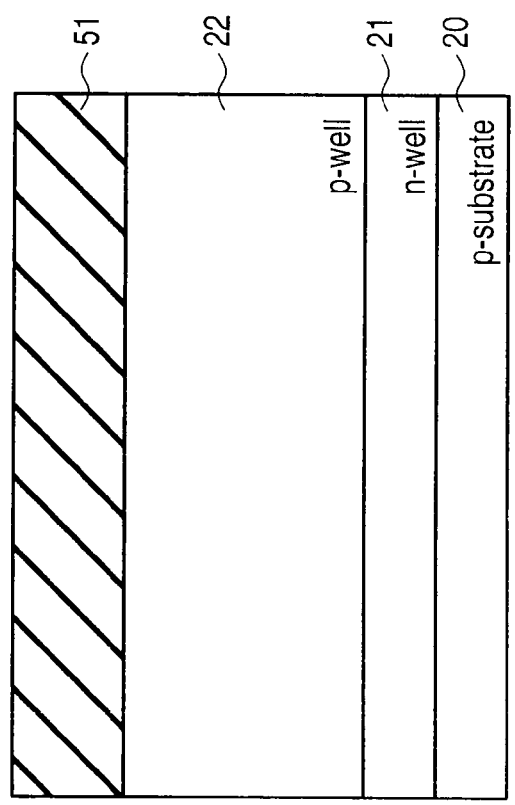

An n-type well region 21 is formed on a surface of a p-type semiconductor substrate 20 by implanting necessary ions, and a p-type well region 22 is formed on the n-type well region 21. Subsequently, an insulating film 51 is formed on the p-type well region 22 by using, e.g., a silicon nitride film as a material, and then a photoresist 38 is formed on the insulating film 51. Further, the photoresist 38 is developed into a desired pattern based on a photolithography method to obtain the photoresist 38 having the desired pattern shape depicted in FIGS. 25A and 25B. At this time, the photoresist 38 has a line width which is double a minimum processing dimension. That is, assuming that the minimum processing dimension of the photoresist is W7, a line width depicted in FIG. 25B is 2·W7. Furthermore, when a region where the photoresist 38 is formed is determined as a line, and a region where the photoresist 38 is not formed is determined as a space, a ratio of the line and the space is 1:1, which means that the space is 2·W7.

Then, the photoresist 38 is subjected to slimming processing based on anisotropic etching as shown in FIGS. 26A and 26B to thin the photoresist 38 until a width equal to or below a resolution limit of the photolithography is obtained. As a result, the line width of the photoresist 38 becomes W7. Consequently, the space is widened to have a width of 3·W7. That is, the ratio of the line and the space becomes 1:3.

Figure 28B:
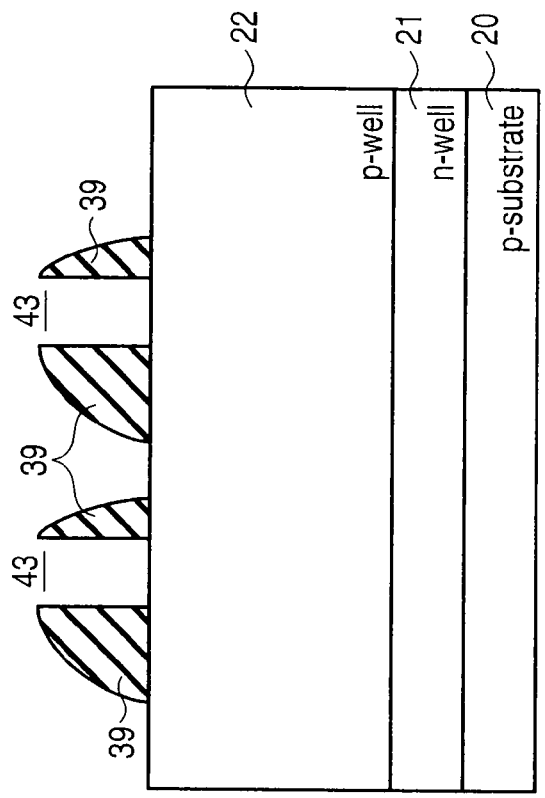
FIG. 28A and FIG. 28B are cross-sectional views showing a fourth manufacturing step of the semiconductor memory device according to the third embodiment.
Figure 28A:
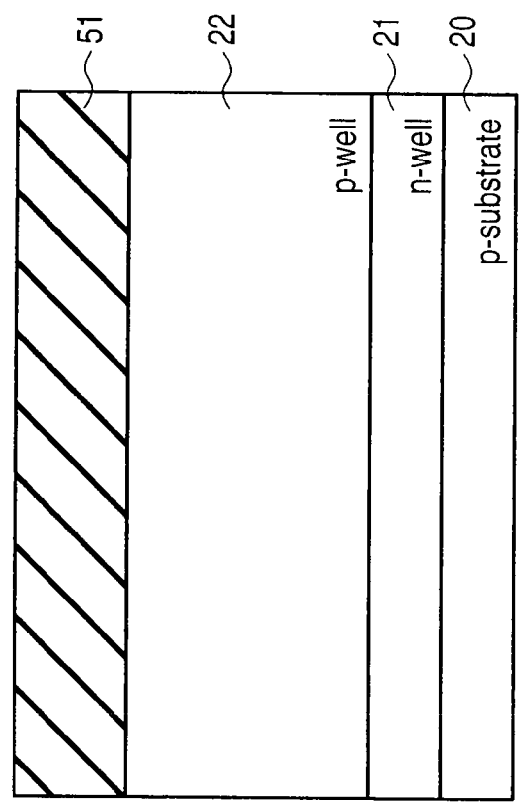
Figure 29B:
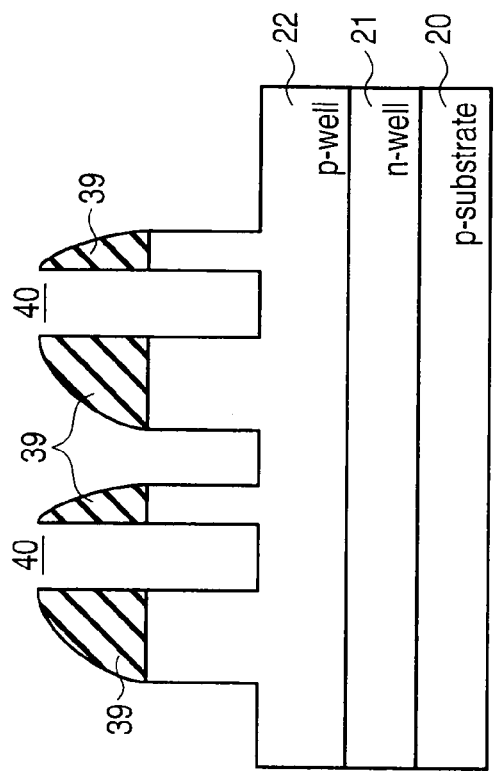
FIG. 29A and FIG. 29B are cross-sectional views showing a fifth manufacturing step of the semiconductor memory device according to the third embodiment.
Figure 29A:
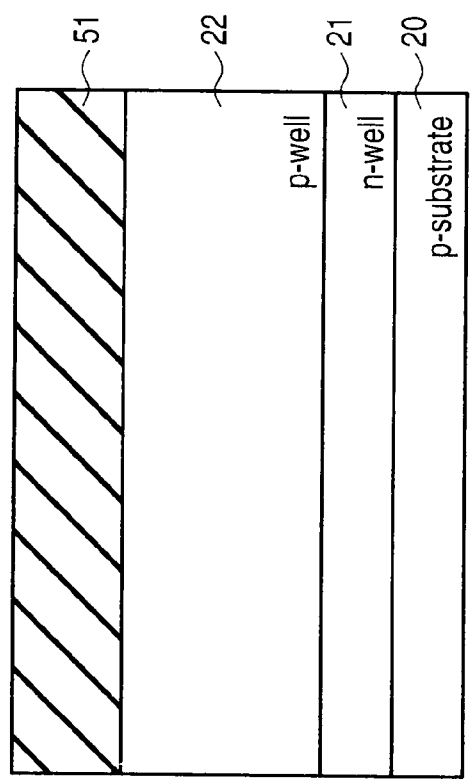

Moreover, the photoresist 38 is used as a mask to etch the insulating film 51, and then the photoresist 38 is removed. Subsequently, an insulating film 39 consisting of, e.g., a silicon oxide film is deposited to cover the insulating film 51 by a CVD method or the like, and then the insulating film 51 is used as a stopper to polish the insulating film 39 based on, e.g., a CMP method, thereby obtaining a configuration shown in FIG. 27. As shown in the drawing, as a result of depositing the insulating film 39 on the insulating film 51, the insulating film 39 may be biased in a given direction rather than providing the isotropic insulating film 39. In the semiconductor memory device according to this embodiment, a configuration where a width of the insulating film 39 deposited on a left side surface is larger than that on a right side surface of the insulating film 51 is taken as an example Then, as shown in FIGS. 28A and 28B, the insulating film 51 alone is removed by using, e.g., wet etching to form trenches 43. Subsequently, the insulating film 39 is used as a mask to etch the p-type well region 22 based on, e.g., an anisotropic etching technology such as RIE. As a result, trenches 40 are obtained as shown in FIG. 29B.

Figure 30B:
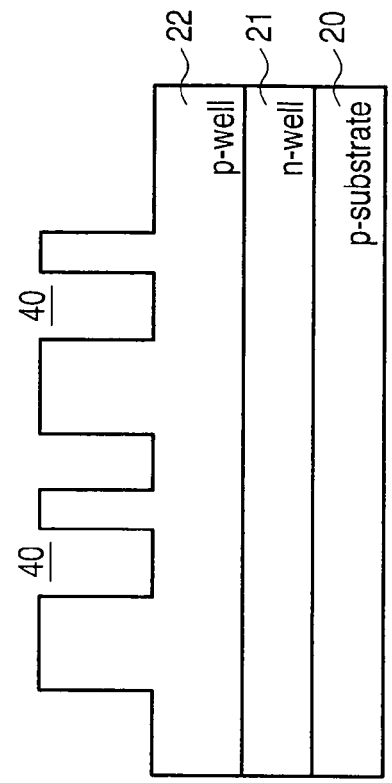
FIG. 30A and FIG. 30B are cross-sectional views showing a sixth manufacturing step of the semiconductor memory device according to the third embodiment.
Figure 30A:
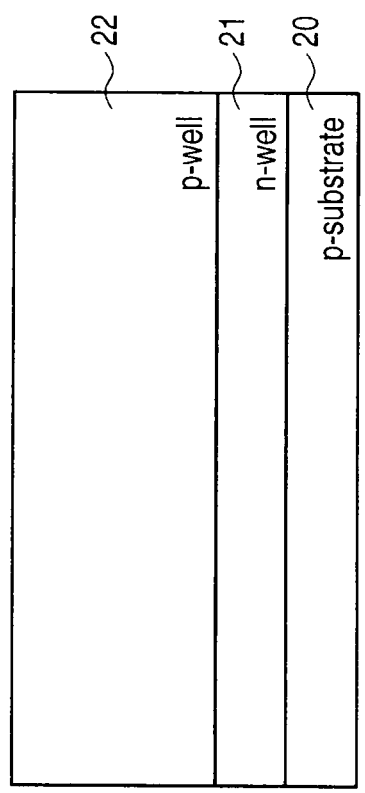

Then, as shown in FIGS. 30A and 30B, the insulating film 39 is removed by, e.g., wet etching. Thereafter, an insulating film 41 is formed in the trenches 40 to fill the p-type well region 22, thereby obtaining a configuration depicted in FIGS. 31A and 31B.

Figure 32B:
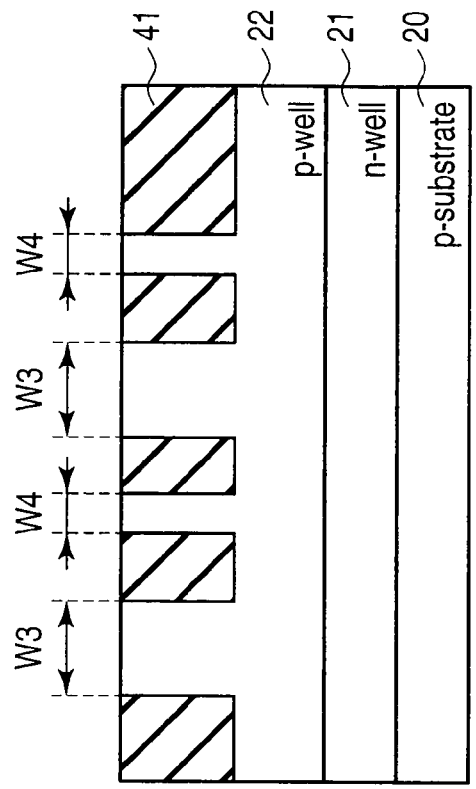
FIG. 32A and FIG. 32B are cross-sectional views showing an eighth manufacturing step of the semiconductor memory device according to the third embodiment.
Figure 32A:
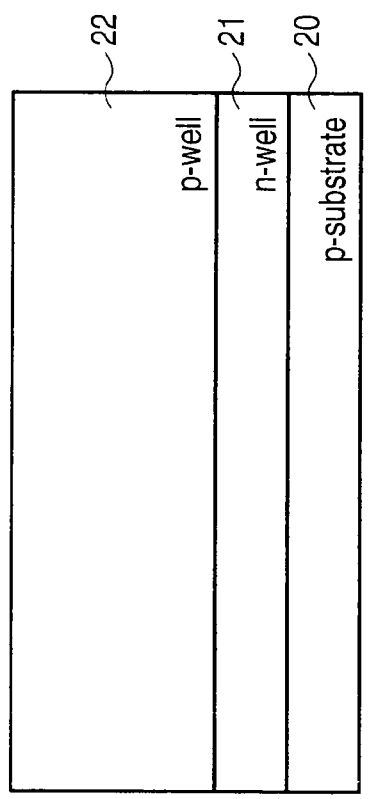
Figure 33B:
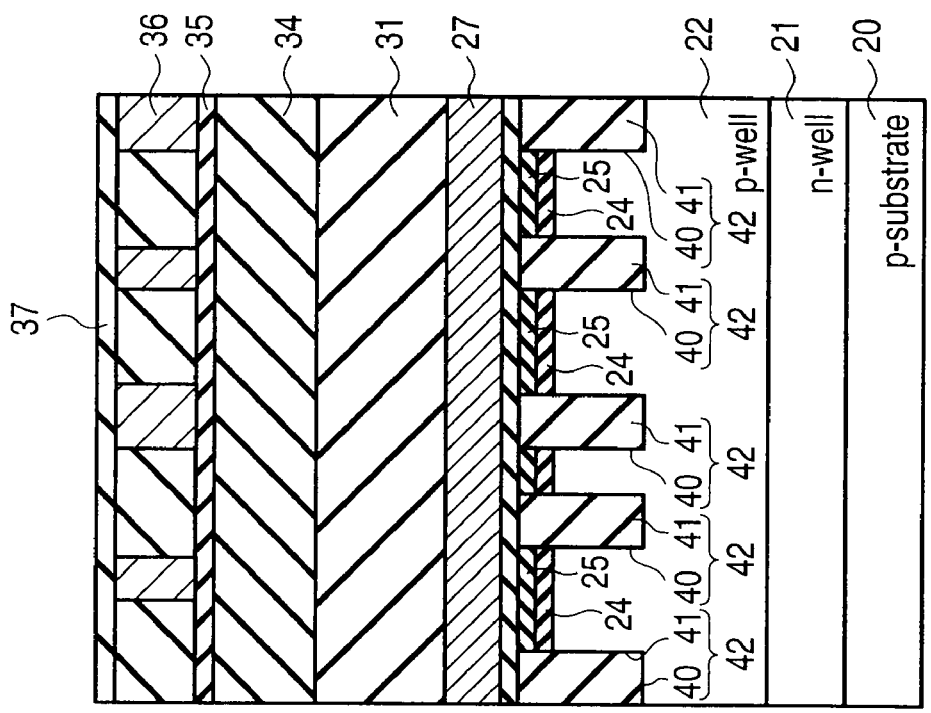
FIG. 33A and FIG. 33B are cross-sectional views showing a ninth manufacturing step of the semiconductor memory device according to the third embodiment.
Figure 33A:
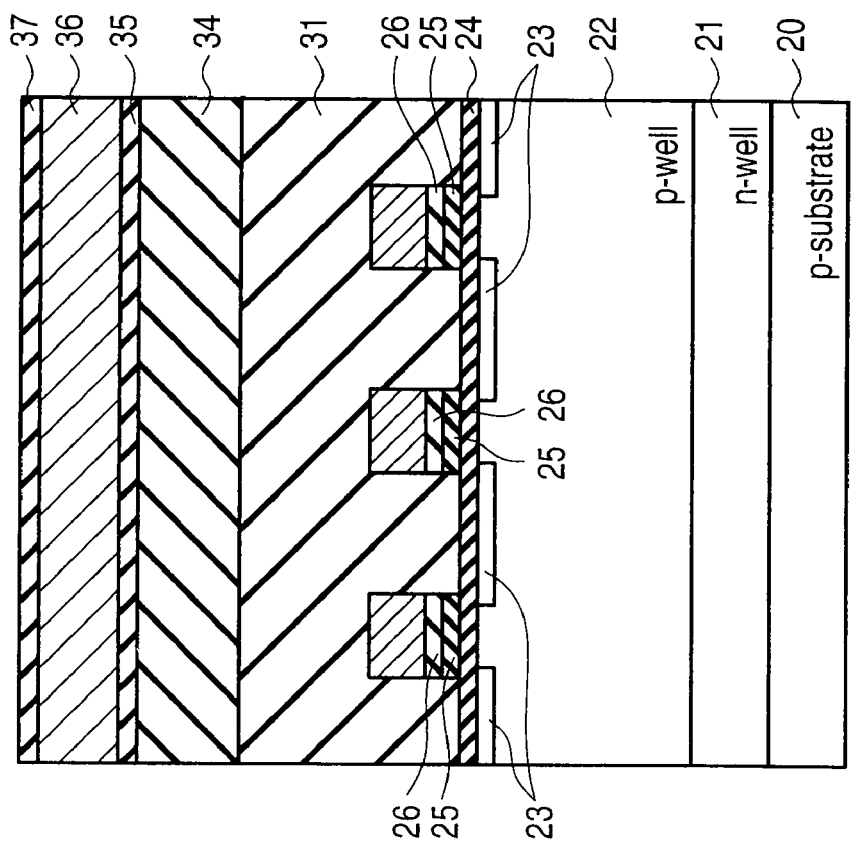

Further, as shown in FIGS. 32A and 32B, the insulating film 41 is polished and an upper surface thereof is flattened by, e.g., the CMP method using the p-type well region 22 as a stopper, and the insulating film 41 is left in the trenches 40 alone to form element isolation regions 42. Furthermore, each region surrounded by the element isolation regions 42 becomes an active area AA. At this time, the active areas AA having widths W3 and W4 are alternately formed. It is to be noted that W3>W4 is achieved. This is because the insulating film 39 is deposited while being biased on the left or right side with respect to the photoresist 38 in FIG. 27. Thereafter, a gate insulating film 24, insulating films 25 and 26, a polysilicon layer 27, interlayer insulating films 31 and 34, an insulating film 35, a metal wiring layer 36, and an interlayer insulating film 37 are sequentially formed on the active areas AA and the element isolation regions 42 to obtain a configuration depicted in FIGS. 33A and 33B. That is, as shown in FIG. 33B, since the active areas AA having the different widths are alternately formed, the memory cell transistors MT which are formed on the active areas AA and have channel widths W3 and W4 are alternately formed.

A case where the active areas AA having the different widths are alternately provided and bit lines BL described in the first embodiment have no variations of line widths is determined as CASE I. Additionally, in CASE I, it is assumed that an even-numbered active area AA2(j-1) has the width W3 (which may be simply referred to as an active area AA2(j-1) hereinafter) and an odd-numbered active area AA(2j-1) has the width W4 (which may be simply referred to as an active area AA(2j-1) hereinafter). That is, the active area AA2(j-1) and the bit line BL(2j-1) have different line widths. That is, the active areas AA having the width W3 and the width W4 are repeatedly formed.

Further, a case where the active areas AA and the bit lines BL have different line widths is classified into two patterns, i.e., CASE II and CASE III in regard to the widths of the active areas AA and the line widths of the bit lines BL.

That is, CASE II corresponds to a case where the active area AA2(j-1) has the width W3 and the bit line BL2(j-1) associated with the active area AA2(j-1) has the line width W1 and to a case where the active area AA(2j-1) adjacent to the active area AA2(j-1) has the width W4 and the bit line BL(2j-1) associated with an upper side of the active area AA(2j-1) has the line width W2.

CASE III corresponds to a case where the active area AA2(j-1) has the width W4 and the bit line BL2(j-1) associated with the active area AA2(j-1) has the line width W1 and to a case where the active area AA(2j-1) adjacent to the active area AA2(j-1) has the width W3 and the bit line BL(2j-1) associated with the active area AA(2j-1) has the line width W2. It is to be noted that points different from the first embodiment alone will be described hereinafter.

(CASE I)

Figure 34:
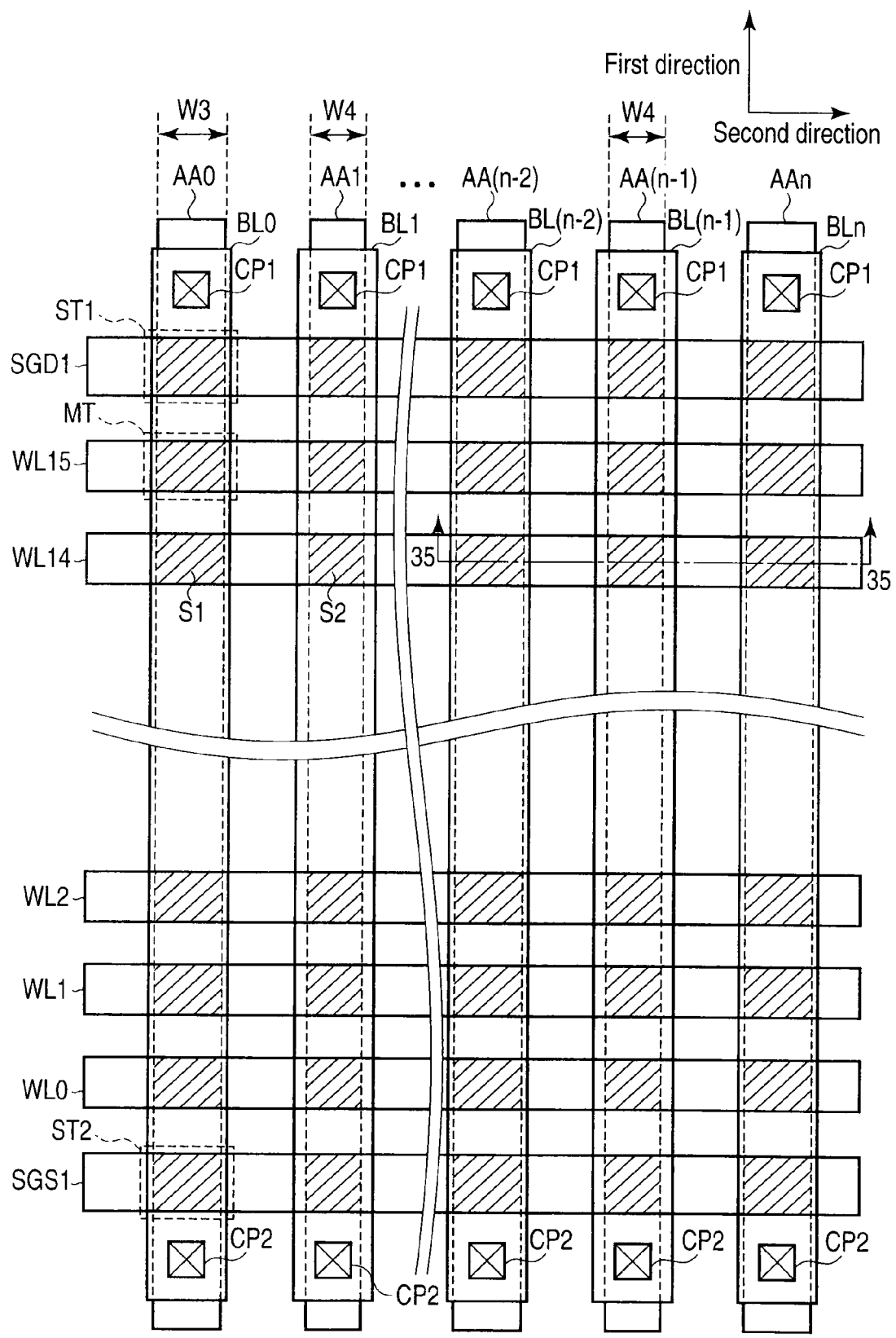
FIG. 34 is a plan view of a memory cell array included in an NAND type flash memory according to a third embodiment.

CASE I will now be explained with reference to FIGS. 34 and 35. FIG. 34 is a plan view of a memory cell array. Furthermore, FIG. 35 is a cross-sectional view taken along a line 35-35 in FIG. 34.

As shown in the drawings, in the memory cell array according to CASE I, the active areas AA having the widths W3 and W4 are alternately formed in the second direction in FIG. 3 explained in the first embodiment. That is, the active area AA2(j-1) has the width W3, and the active area AA(2j-1) has the width W4. Moreover, when a size of a charge storage layer in each region where a word line WL crosses the active area AA2(j-1) is determined as S1 and a size of the charge storage layer in each region where the word line WL crosses the active area AA(2j-1) is determined as S2, a relationship S1>S2 is achieved.

Additionally, this configuration can be also applied to selective transistors ST1 and ST2, a gate width W3 of the selective transistor ST1 or ST2 on the active area AA2(j-1) is larger than a gate width W4 of the selective transistor ST1 or ST2 on the active area AA(2j-1).

As explained above, a memory cell transistor MT formed on the active area AA2(j-1) and a memory cell transistor MT formed on the active area AA(2j-1) have different characteristics. It is to be noted that a bit line BL has a line width W0.

Characteristics of the memory cell transistors MT will now be described with reference to FIG. 36. FIG. 36 is a graph of a drain current Id that flows when a voltage Vbc is applied to a part between a drain and a source of the memory cell transistor MT, and it shows operation curves of the memory cell transistor MT. As shown in this graph, (a) in the drawing indicates characteristics of the memory cell transistor MT formed on the active area AA2(j-1), and (b) in the drawing indicates characteristics of the memory cell transistor MT formed on the active area AA(2j-1). Additionally, an abscissa represents Vbc which is applied to the part between the drain and the source of the memory cell transistor MT, and an ordinate represents the drain current Id.

As shown in the drawing, the drain current flowing through the memory cell transistor MT on the active area AA2(j-1) is larger than the drain current Id flowing through the memory cell transistor MT on the active area AA(2j-1). That is because the memory cell transistor MT on the active area AA2(j-1) has the gate width larger than that of the memory cell transistor MT on the active area AA(2j-1), whereby it has a large current driving force.

A voltage of a signal BLC generated by a control unit 2 will now be described with reference to FIG. 37. FIG. 37 is a graph showing a voltage of the signal BLC. As shown in the drawing, an abscissa represents a bit line BL, and an ordinate represents a voltage of the signal BLC applied to a gate of each MOS transistor 5 connected with the bit line BL. As shown in the drawing, the control unit 2 determines a voltage of a signal BLC_e which is applied to the gate of the MOS transistor 5 connected with a bit line BL2(j-1) as a voltage V1. On the other hand, the control unit 2 determines a voltage of a signal BLC_o which is applied to a gate of the MOS transistor 5 associated with a bit line BL(2j-1) as a voltage V2 larger than the voltage V1.

(CASE II)

CASE II will now be described with reference to FIGS. 38 and 39. FIG. 38 is a plan view of the memory cell array 1. Furthermore, FIG. 39 is a cross-sectional view taken along a line 39-39 in FIG. 38.

As shown in the drawing, in the memory cell array according to CASE II, the large and small line widths W of the bit lines BL are alternately repeatedly formed in addition to the active areas AA in FIG. 34. That is, as explained in the first embodiment, trenches are formed by using the sidewall processing technology, and then the Damascene method is used to form the bit lines BL. Moreover, the width of the bit line BL2(j-1) associated with the active area AA2(j-1) having the width W3 is W1, and the width of the bit line BL(2j-1) associated with the active area AA(2j-1) having the width W4 is W2. That is, both the active area AA2(j-1) and the bit line BL2(j-1) have the large widths, and both the active area AA(2j-1) and the bit line BL(2j-1) have the small widths.

That is, when a size of the charge storage layer in each region where a word line WL crosses the active area AA2(j-1) is determined as S3 and a size of the charge storage layer in each region where the word line WL crosses the active area AA(2j-1) is determined as S4, a relationship S3>S4 is achieved.

Furthermore, this configuration can be also applied to the selective transistors ST1 and ST2, and the gate width W3 of the selective transistor ST1 or ST2 on the active area AA2(j-

1) is larger than the gate width W4 of the selective transistor ST1 or ST2 on the active area AA(2j−1).

As explained above, since the widths of the active area AA2(j−1) and the active area AA(2j−1) are the same as those in CASE I, characteristics of the memory cell transistors MT in CASE II are the same I-V characteristics as those of the memory cell transistors MT in FIG. 36, thereby omitting an explanation thereof.

A voltage of the signal BLC generated by the control unit 2 will now be described with reference to FIG. 40. FIG. 40 is a graph showing a voltage of the signal BLC. As shown in the drawing, an abscissa represents a bit line BL, and an ordinate represents a voltage of the signal BLC which is applied to a gate of each MOS transistor 5 connected with the bit line BL. As shown in the drawing, the control unit 2 determines a voltage of the signal BLC_e which is applied to the gate of the MOS transistor 5 connected with the bit line BL2(j−1) as a voltage V3. On the other hand, the control unit 2 determines a voltage of the signal BLC_o which is applied to the gate of the MOS transistor 5 associated with the bit line BL(2j−1) as a voltage V4 larger than the voltage V3. It is to be noted that a potential difference between the voltage V1 and the voltage V2 in CASE I, i.e., |V1−V2| and a potential difference between the voltage V3 and the voltage V4 in CASE II, i.e., |V3−V4| may have a relationship |V1−V3|>|V3−V4| or |V1−V2|<|V3−V4|. Additionally, they may have a relationship of |V4|>|V2| or |V4|<|V2|. Further, they may have a relationship of |V1|>|V3| or |V1|<|V3|.

(CASE III)

CASE III will now be described hereinafter with reference to FIGS. 41 and 42. FIG. 41 is a plan view of the memory cell array. Moreover, FIG. 42 is a cross-sectional view taken along a line 42-42 in FIG. 41.

As shown in the drawing, the memory cell array according to CASE III, the bit lines BL2(j−1) and the bit lines BL(2j−1) formed along the second direction have counterchanged line width sizes. That is, the bit line BL2(j−1) associated with the active area AA2(j−1) having the line width W3 has the line width W2. Additionally, the bit line BL(2j−1) associated with the active area AA(2j−1) having the line width W4 has the line width W1.

That is, when a size of the charge storage layer in each region where a word line WL crosses the active area AA2(j−1) is determined as 5S and a size of the charge storage layer in each region where the word line WL crosses the active area AA(2j−1) is determined as S6, a relationship of S5>S6 is achieved.

Further, this configuration is also applied to the selective transistors ST1 and ST2, and the gate width W3 of the selective transistor ST1 or ST2 on the active area AA(2j−1) is larger than the gate width W4 of the selective transistor ST1 or ST2 on the active area AA2(j−1).

As explained above, since the widths of the active area AA2(j−1) and the active area (2j−1) are the same as those in CASE I and CASE II, characteristics of the memory cell transistors MT in CASE III are the same I-V characteristics as those of the memory cell transistors MT in FIG. 36, thereby omitting an explanation thereof.

A voltage which is applied as the signal BLC generated by the control unit 2 will now be described with reference to FIG. 43.

FIG. 43 is a graph showing a voltage of the signal BLC. As shown in the drawing, an abscissa represents a bit line BL, and an ordinate represents a voltage of the signal BLC which is applied to a gate of each MOS transistor 5 connected with the bit line BL. As shown in the drawing, the control unit 2 determines a voltage of the signal BLC_e which is applied to the gate of the MOS transistor 5 connected with the bit line BL2(j−1) as a voltage VS. On the other hand, the control unit 2 determines a voltage of the signal BLC_o which is applied to the gate of the MOS transistor 5 associated with the bit line BL(2j−1) as a voltage V6 higher than the voltage Vs. Furthermore, when the line width W2 of the bit line BL2(j−1) and the line width W1 of the bit line BL(2j−1) have a relationship of W1>>W2, the voltage V5 and the voltage V6 in FIG. 43 have a relationship of V6<V5. It is to be noted that an example where W1>W2 is attained alone will be explained in the semiconductor memory device according to CASE III.

It is to be noted that each of the voltage V1, the voltage V3, and the voltage V5 may be the voltage Vblc_e output from the BLC_e driver described in the first embodiment. Moreover, each of the voltage V2, the voltage V4, and the voltage V6 may be the voltage Vblc_o output from the BLC_o driver 182 explained in the first embodiment.

Additionally, when |V1−V2|>|V3−V4| is achieved, a potential difference between the voltage V5 and the voltage V6, i.e., |V5−V6| may have a relationship of |V5−V6|>|V1−V2|, |V3−V4|<|V5−V6|<|V1−V2|, or |V5−V6|<|V3−V4|. Additionally, when |V1−V2|<|V3−V4| is achieved, |V5−V6| may have a relationship of |V5−V6|>|V3−V4|, |V1−V2|<|V5−V6|<|V3−V4|, or |V1−V2|<|V5−V6|.

In the semiconductor memory device according to this embodiment, even if the large and small active areas AA are alternately formed in addition to the line widths of the bit lines BL described in the first embodiment, erroneous reading by the sense amplifier can be improved when reading data. A description will now be given as to CASE I' to CASE III' of a drain current Id flowing through a channel region of a memory cell transistor MT adjacent to the MOS transistor 5 when such a signal BLC as depicted in FIGS. 37, 40, and 43 is supplied to the gate of the MOS transistor 5 in the semiconductor memory device in each of CASE 1 to CASE III.

(CASE I')

Figure 44:
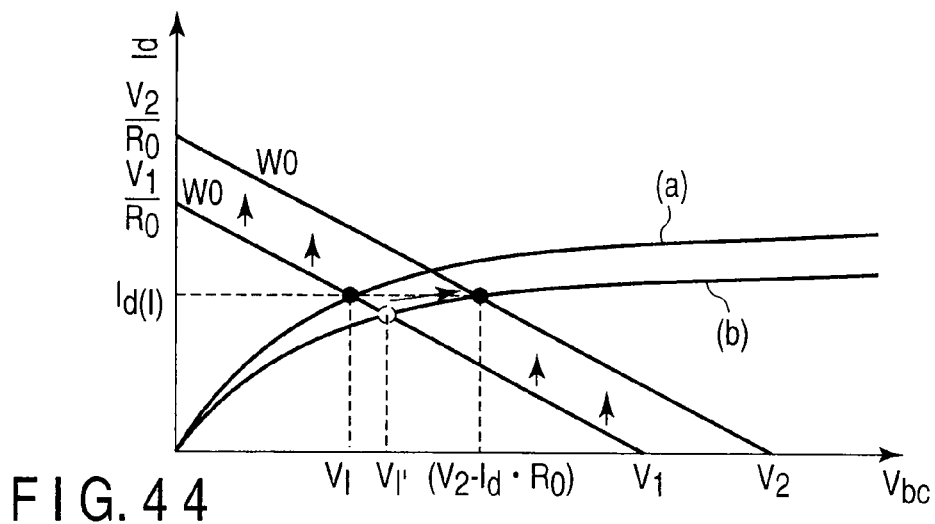
FIG. 44 is a graph of the I-V characteristics of the memory cell transistor MT depicted in FIG. 36, showing a load line of a bit line BL having a line width W0.

First, FIG. 44 is a graph showing a load line of each bit line BL in the I-V characteristics in FIG. 36. Furthermore, as shown in the drawing, an abscissa represents Vbc which is applied to a part between the drain and the source of the memory cell transistor MI, and an ordinate represents the drain current Id.

As explained above, in CASE I, the bit line BL has the line width W0. Therefore, the respective bit lines BL have the same resistance value. Moreover, the resistance value of the bit line BL per unit length is determined as R0. That is, as shown in FIG. 44, the respective load lines of all the bit lines BL have the same inclination. Therefore, an equipotential voltage is applied to a drain end of each memory cell transistor MT connected with the bit line BL. However, the memory cell transistors MT associated with the bit lines BL adjacent to each other have different characteristics. That is, the different drain currents Id flow through the channel regions of the respective memory cell transistors MT associated with the bit lines BL adjacent to each other.

Thus, in the I-V characteristics in CASE I, the BLC driver 6 applies the voltage V2 (>the voltage V1) described in conjunction with FIG. 37 as the signal BLC_o to the gate of the MOS transistor 5 associated with the memory cell transistor MT formed on the active area AA(2j−1). At this time, an intersection of the bit line BL(2j−1) and the ordinate or the abscissa is V2/R0 or V2. Further, an intersection of the bit line BL2(j−1) and the ordinate or the abscissa is V1/R0 or V1.

As a result, since the voltage Vbc at an intersection of the load line of the bit line BL2(j−1) and a line A becomes a voltage $V_I$ and the voltage Vbc at an intersection of the load line of the bit line BL(2j−1) and a line B becomes a voltage (V2-Id·R0) (>the voltage $V_I$), the drain currents Id flowing through the bit line BL2(j−1) and the bit line BL(2j−1) can be currents Id$_{(I)}$, respectively. That is, substantially the same drain currents Id flow through the channel regions of the memory cell transistors MT formed on the active areas AA(2j−1) and AA2(j−1). Furthermore, in this case, erroneous data reading by the sense amplifier 4 is reduced as compared with a case where, e.g., the voltage V1 alone is supplied as the signal BLC to the gate of the MOS transistor 5 connected with the bit line BL. That is because, when the semiconductor memory device that applies the voltage V1 as the signal BLC_o to the gate of the MOS transistor 5 connected with the bit line BL(2j−1) having the line width W2 is used, the voltage Vbc at the intersection of the load line of the bit line BL(2j−1) and the line B becomes the voltage $V_I$, and a current smaller than the drain current ID(I), e.g., a drain current Id(I') flows through the channel region of the memory cell transistor MT connected with the bit line BL(2j−1) (not shown). Therefore, the sense amplifier 4 erroneously reads data. In this regard, when the semiconductor memory device according to this embodiment is used, erroneous data reading by the sense amplifier 4 can be reduced.

(CASE II')

Figure 45:
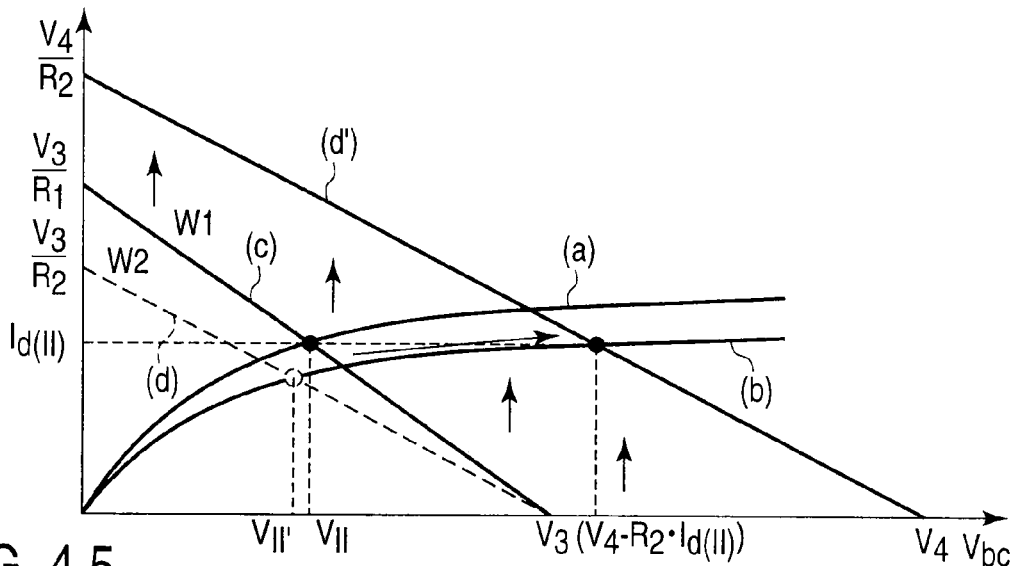
FIG. 45 is a graph of the I-V characteristics of the memory cell transistor MT depicted in FIG. 36, where a line (c) indicates a load line of the bit line BL having a line width W1 and a line (d) indicates a load line of the bit line BL having a line width W2.

As CASE II', FIG. 45 is a graph showing load lines of the respective bit lines BL in the I-V characteristics in FIG. 36. Further, as shown in the drawing, an abscissa represents Vbc which is applied to a part between the drain and the source of the memory cell transistor MT, and an ordinate represents the drain current Id.

As explained above, in CASE II, since the bit lines BL have the various line widths W, there are load lines of the bit line BL2(j−1) having the line width W1 (which will be referred to as a line (c) hereinafter) and the bit line BL(2j−1)having the line width W2 (which will be referred to as a line (d) or a line (d') hereinafter) as shown in the drawing. Further, as depicted in FIG. 45, the load lines of the bit line BL2(j−1) an the bit line BL(2j−1)have different inclinations. Therefore, different voltages are applied to drain ends of the memory cell transistors MT connected with the bit lines BL. Moreover, the memory cell transistors MT associated with the bit lines BL adjacent to each other have different characteristics. As a result, different drain currents Id flow through the channel regions of the memory cell transistors MT associated with the bit lines BL adjacent to each other.

Thus, in the I-V characteristics in CASE II, the BLC driver 6 applies the voltage V4 (>the voltage V3) explained in conjunction with FIG. 40 as the signal BLC_o to the gate of the MOS transistor 5 associated with the memory cell transistor MT formed on the active area AA(2j−1). At this time, an intersection of the line (d') and the ordinate or the abscissa is V4/R2 or V4. Additionally, an intersection of the line (c) and the ordinate or the abscissa is V3/R1 or V3.

Consequently, the voltage Vbc at the intersection of the line (c) and the line A becomes a voltage $V_{II}$, and the voltage Vbc at the intersection of the line (d') and the line B becomes a voltage (V4-Id(II)·R2) (>a voltage $V_{II}$), and hence the drain currents Id flowing through the bit line BL2(j−1) and the bit line BL(2j−1) can be currents Id$_{(II)}$, respectively. That is, substantially the same drain currents Id$_{(II)}$ flow through the channel regions of the memory cell transistors MT formed on the active areas AA(2j−1)and AA2(j−1). Further, in this case, erroneous data reading by the sense amplifier 4 is reduced as compared with a case where, e.g., the voltage V3 alone is supplied as the signal BLC to the gates of the MOS transistors 5 connected with the bit line BL2(j−1) and the bit line BL(2j−1). That is because, when the semiconductor memory device that applies the voltage V3 as the signal BLC_o to the gate of the MOS transistor 5 connected with the bit line BL(2j−1) having the line width W2 is used, a voltage V(II') is applied to the drain end of the memory cell transistor MT connected with the bit line BL(2j−1), and a current which is smaller than the drain current Id(II), e.g., a drain current Id(II') flows through the channel region of the memory cell transistor MT (an intersection of the line (d) and the line B). Therefore, the sense amplifier 4 erroneously reads data. In this regard, using the semiconductor memory device according to this embodiment enables reducing erroneous data reading performed by the sense amplifier 4.

(CASE III')

Figure 46:
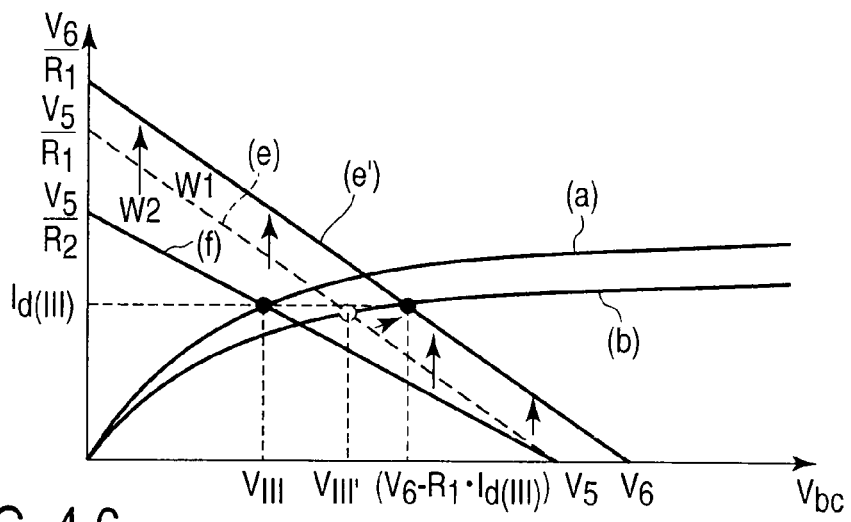
FIG. 46 is a graph of I-V characteristics of the memory cell transistor MT depicted in FIG. 36, where a line (e) indicates a load line of the bit line BL having a line width W1 and a line (f) indicates a load line of the bit line BL having a line width W2.

Furthermore, as CASE III', FIG. 46 is a graph showing load lines of the respective bit lines BL in the I-V characteristics in FIG. 36 like CASE II' mentioned above. Moreover, as shown in the drawing, an abscissa represents Vbc which is applied to a part between the drain and the source of the memory cell transistor MT, and an ordinate represents the drain current Id.

As explained above, in CASE III, the bit lines BL are formed with line widths counterchanged from those in CASE II. That is, as depicted in the drawing, there are load lines of the bit line BL2(j−1) having the line width W2 (which will be referred to as a line (f) hereinafter) and the bit line BL(2j−1) having the line width W1 (which will be referred to as a line (e) or a line (e') hereinafter). Further, as shown in FIG. 46, the load lines of the bit line BL2(j−1) and the bit line BL(2j−1) have different inclinations. Therefore, different voltages are applied to the drain ends of the memory cell transistors MT connected with the bit lines BL. Furthermore, the memory cell transistors MT associated with the bit lines BL adjacent to each other have different characteristics. As a result, different drain currents Id flow through the channel regions of the memory cell transistors MT associated with the bit lines BL which are adjacent to each other.

Thus, in the I-V characteristics in CASE III, the BLC driver 6 applies the voltage V6 (>the voltage V5) explained in conjunction with FIG. 43 as the signal BLC_o to the gate of the MOS transistor 5 associated with the memory cell transistor MT formed on the active area AA(2j−1). At this time, an intersection of (e') and the ordinate or the abscissa is V6/R1 or V6. Moreover, an intersection of the line (f) and the ordinate or the abscissa is V5/R2 or V5.

As a result, the voltage Vbc at the intersection of the line (f) and the line A becomes a voltage $V_{III}$ and the voltage Vbc at the intersection of the line (e') and the line B becomes a voltage (V6-Id(III)·R1) (>the voltage $V_{III}$), and hence the drain currents flowing through the bit line BL2(j−1) and the bit line BL(2j−1)can be currents Id$_{(III)}$. That is, substantially the same drain currents Id$_{(III)}$ flow through the channel regions of the memory cell transistors MT formed on the active areas AA(2j−1)and AA2(j−1). Additionally, in this case, erroneous data reading by the sense amplifier 4 is reduced as compared with a case where, e.g., the voltage V5 alone is supplied as the signal BLC_o to the gates of the MOS transistors 5 connected with the bit line BL2(j−1) and the bit line BL(2j−1). That is because, when the semiconductor memory device that applies the voltage V5 as the signal BLC to the gate of the MOS transistor 5 connected with the bit line BL(2j−1)having the line width W2 is used, a voltage V(III') is applied to the drain end of the memory cell transistor MT connected with the bit line BL(2j−1), and a current smaller than the drain current Id(III), e.g., a drain current Id(III') flows through the channel region of the memory cell transistor MT (the intersection of the line (e) and the line B). Therefore, the sense amplifier 4 erroneously reads data. In this regard, using the semiconductor memory device according to this embodiment enables reducing erroneous data reading performed by the sense amplifier 4.

Fourth Embodiment

A semiconductor memory device according to a fourth embodiment of the present invention will now be described. In this embodiment, an NAND type flash memory will be taken as an example and explained like the first to third embodiments. In this embodiment, a control method for a write voltage VPGM when word lines WL have various line widths L and a configuration that generates the write voltage VPGM will be described. It is to be noted that each word line WL is a metal wiring line formed by the Damascene method after forming trenches by using the sidewall processing technology like the first to third embodiments. That is, the word lines WL are formed with the large and small line widths L being alternately repeated.

<Planar Configuration of Memory Cell Array 1>

FIG. 47 is a plan view of blocks BLK0 to BLKs according to this embodiment. As shown in the drawing, in memory cell transistors MT according to this embodiment, the word lines WL having a line width L1 and a line width L2 are alternately formed in FIG. 3. That is, in this embodiment, a channel length L of the memory cell transistor MT, i.e., a control gate length is either L1 or L2. It is to be noted that the bit lines BL and the active areas AA in the first to third embodiments do not have various sizes for ease of explanation in this embodiment. Further, as shown in the drawing, in a semiconductor memory device according to this embodiment, even-numbered word lines WL (which may be referred to as word lines WL(2l) hereinafter) (1: actual numbers of 0 to 7) have the line width L1, and word lines WL(2l+1) (which may be referred to as word lines WL(2l+1) hereinafter) have the line width L2. Furthermore, an intersecting portion of the word line WL(2l) and the active area AA0 where the memory cell transistor MT having the channel length L1 is provided is determined as a region 1 and an area of the region 1 is determined as S7. Moreover, it is assumed that an intersecting portion of the word line WL(2l+1) and the active area AA0 where the memory cell transistor MT having the channel length L2 is provided is determined as a region 2, and an area of the region 2 is determined as S8. Additionally, in this embodiment, L1>L2 is achieved. That is, a relationship S7>S8 is provided. That is, two types of different characteristics are present in accordance with each area where a gate electrode is formed. It is to be noted that structures other than those described above are the same as those in FIG. 3, thereby omitting an explanation thereof.

<Cross-Sectional Configuration of Memory Cell Array 1>

Figure 48:
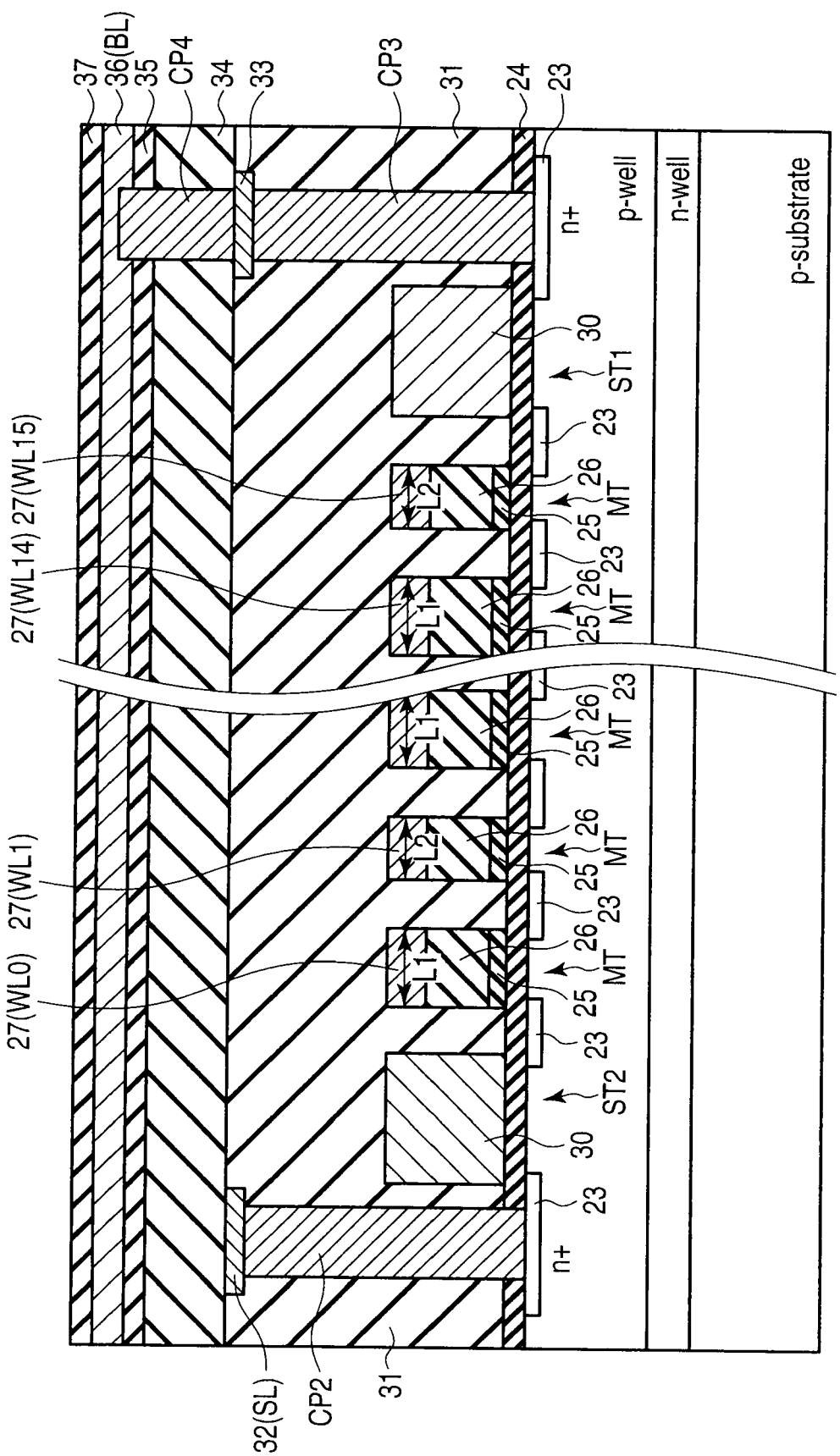
FIG. 48 is a cross-sectional view taken along a line 48-48 in FIG. 47.

A description will now be given as to a cross section of the memory cell array 1 by using FIG. 48. FIG. 48 is a cross-sectional view of the memory cell array 1 taken along a line 48-48 depicted in FIG. 47. As shown in the drawing, gate electrodes alternately having with the large and small line widths L are formed on a semiconductor substrate 20 in accordance with channel lengths L of control gates that function as the word lines WL. It is to be noted that structures other than those explained above are the same as those in the first and third embodiments, thereby omitting a description thereof. Further, in this embodiment, a manufacturing method of the word lines WL using the sidewall processing technology and the Damascene process is the same as the manufacturing method of the bit lines BL described in the first embodiment, thereby omitting a description thereof.

<Configuration Example of High-Voltage Generation Circuit 9>

The detail of a configuration of a high-voltage generation circuit 9 according to this embodiment, especially a configuration that generates the write voltage VPGM will now be described with reference to FIG. 49. FIG. 49 is a circuit diagram of the high-voltage generation circuit 9 included in the control unit 2. As shown in the drawing, the high-voltage generation circuit 9 includes a charge pump 80, a comparator 81, a resistance element 82, a resistance group 83, and a generation unit 84.

The charge pump 80 generates the voltage VPGM and outputs it to a node N40. Further, an output voltage from the node N40 is supplied to a non-illustrated row decoder 3. Furthermore, a voltage at the node N40 is divided by the resistance element 82 and the resistance group 83. That is, one end of the resistance element 82 is connected with the node N40, the other end of the resistance element 82 is connected with one end of the resistance group 83, and the other end of the resistance group 83 is grounded. Moreover, a resistance value of the resistance element 82 is RL, and a resistance value of the resistance group 83 is RD. It is to be noted that the resistance group 83 includes a plurality of resistance elements and it is a variable resistance in which a resistance value between one end and the other end thereof is variable.

A reference voltage VREF generated by, e.g., a BGR circuit is supplied to an inverting input terminal of the comparator 81. Additionally, a voltage VMON at a node N41 between the resistance element 82 and the resistance group 83 is supplied to a regular input terminal of the comparator 81. That is, the comparator 81 controls the voltage VPGM output from the charge pump 80 in such a manner that the reference voltage Vref supplied to the comparator 81 coincides with the voltage VMON at the node N41. Namely, the comparator 81 compares the reference voltage Vref with the voltage VMON, and outputs "L" as a signal EN_CP to the charge pump 80 when Vref≦VMON. As a result, the charge pump 80 stops pumping. Further, when Vref>VMON, the comparator 81 outputs "H" as the signal EN_CP to the charge pump 80. Consequently, the charge pump 80 performs pumping to increase an output voltage.

It is to be noted that, since the resistance group 83 is a variable resistance, the voltage VMON at the node N41 changes depending on a resistance value RD of the resistance group 83. That is, an intensity of the write voltage VPGM changes in accordance with the voltage VMON. For example, since a voltage difference between the voltage VMON and the reference voltage Vref increases as the resistance value RD of the resistance group 83 is reduced, the comparator 81 outputs the "H" level as the signal EN_CP to the charge pump 80 to eliminate the voltage difference between the voltage VMON and the reference voltage Vref. Therefore, the write voltage VPGM at the node N40 further increases. Contrary, since the voltage difference between the voltage VMON and the reference voltage Vref becomes small as the resistance value RD of the resistance group 83 increases, the write voltage VPGM at the node N40 is reduced even when the comparator 81 outputs the "H" level as the signal EN_CP to the charge pump 80 to eliminate the voltage difference between the voltage VMON and the reference voltage Vref. That is, the high-voltage generation circuit 9 can generate the write voltage VPGM associated with the resistance value RD of the resistance group 83 in a stepwise manner.

Further, the resistance value RD of the resistance group 83 which determines the voltage VMON is determined based on a signal supplied from the generation unit 84. It is to be noted that the detail of a configuration of the generation unit 84 that determines the resistance value RD of the resistance group 83 will be described later.

<Configuration Example of Resistance Group 83>

A configuration of the resistance group 83 will now be described in detail with reference to FIG. 50. FIG. 50 is a circuit diagram of the resistance group 83. As shown in the drawing, the resistance group 83 includes resistance elements 90 to 97 and MOS transistors 108 to 114. Furthermore, resistance values of the resistance elements 90 to 97 are RD0 to RD7, respectively.

Moreover, the resistance elements 90 to 97 are connected in series. Additionally, a connection node between the other end of the resistance element 90 and one end of the resistance element 91 is determined as N50. A connection node between the other end of the resistance element 91 and one end of the resistance element 92 is determined as N51. A connection node between the other end of the resistance element 92 and one end of the resistance element 93 is determined as N52. Although not shown in the drawing, a connection node between the other end of the resistance element 93 and one end of the resistance element 94 is determined as N53, a connection node between the other end of the resistance element 94 and one end of the resistance element 95 is determined as N54, and a connection node between the other end of the resistance element 95 and one end of the resistance element 96 is determined as N55, and a connection node between the other end of the resistance element 96 and one end of the resistance element 97 is determined as N56. A resistance value of the resistance element 9t is determined as RDt (t=one of 0 to 7), and a connection node between the other end of the resistance element 9t and the resistance element 9(t+1) is determined as N5t.

Additionally, in the MOS transistor 108, one end of a current path is connected with the node N50, the other end of the current path is grounded, and a signal PARAM_VPGM[0] output from the later-explained generation unit is supplied to a gate. In the MOS transistor 109, one end of a current path is connected with the node N51, the other end of the current path is grounded, and a signal PARAM_VPGM[1] output from the generation unit is supplied to a gate. In the MOS transistor 100, one end of a current path is connected with the node N52, the other end of the current path is grounded, and a signal PARAM_VPGM[2] output from the generation unit is supplied to a gate. Further, although not shown in the drawing, in the MOS transistor 101, one end of a current path is connected with the node N53, the other end of the current path is grounded, and a signal PARAM_VPGM[3] output from the generation unit is supplied to a gate. In the MOS transistor 102, one end of a current path is connected with the node N54, the other end of the current path is grounded, and a signal PARAM_VPGM[4] output from the generation unit is supplied to a gate. In the MOS transistor 103, one end of a current path is connected with the node N55, the other end of the current path is grounded, and a signal PARAM_VPGM[6] output from the generation unit is supplied to a gate. Furthermore, in the MOS transistor 104, one end of a current path is connected with the node N56, the other end of the current path is grounded, and a signal PARAM_VPGM[7] output from the generation unit is supplied to a gate.

Moreover, for example, the generation unit outputs one of the signals PARAM_VPGM[t] as the "H" level and outputs the other signals as the "L" level. That is, one of the MOS transistors 108 to 114 that has received the "H" level as the signal PARAM_VPGM[t] is turned on, and the other MOS transistors maintain the OFF state. Additionally, when the generation unit outputs any one "H" level as the signal PARAM_VPGM[t], the MOS transistor having one end connected with the node N5t between the resistance element RDt and the resistance element RDt+1 is turned on, and hence the resistance value RD of the resistance group 83 is represented by the following Expression (26).

$$\sum_{k=0}^{t} RDk \quad (t = 0 \sim 7) \tag{26}$$

<Configuration Example of Generation Unit>

Figure 51:
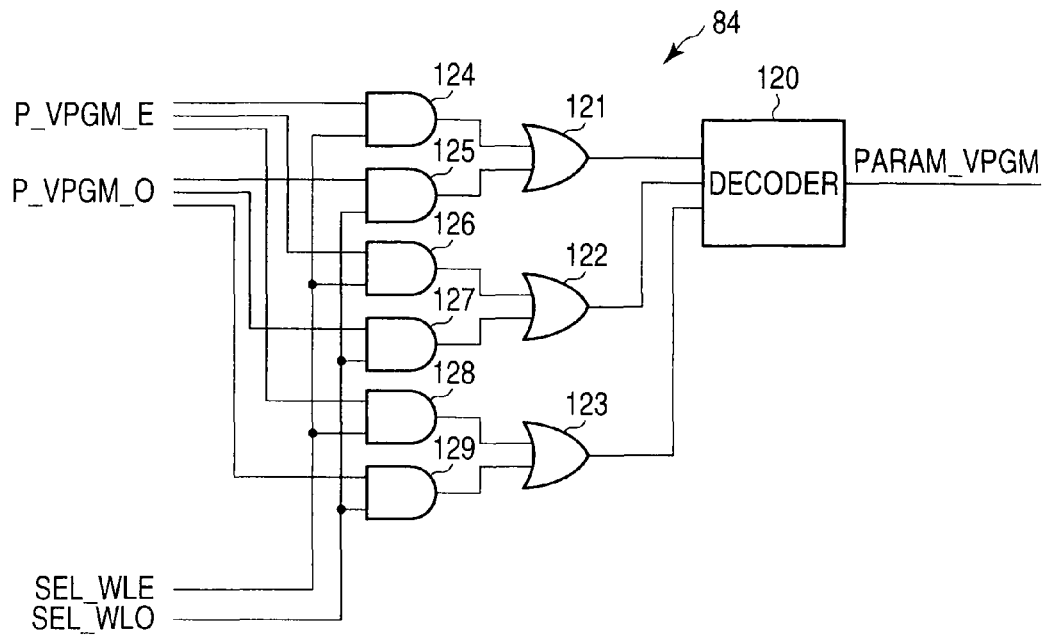
FIG. 51 is a circuit diagram of a generation unit included in the high-voltage generation circuit in the semiconductor memory device according to the fourth embodiment.

A configuration of the generation unit 84 will now be described in detail with reference to FIG. 51. FIG. 51 is a circuit diagram of the generation unit 84 which determines the resistance value RD of the resistance group 83. As shown in the drawing, the generation unit 84 includes a decoder 120, OR circuits 121 to 123, and AND circuits 124 to 129.

Each signal that is calculated in the generation unit 84 to determine a resistance value of the resistance element RD will now be explained in detail. First, each of a signal P_VPGM_E and a signal P_VPGM_O is a three-bit signal. That is, each of the signal P_VPGM_E and the signal P_VPGM_O includes one of signals [000], [001], [010], [011], [100], [101], [110], and [111]. Further, this signal is determined as any one signal in accordance with the resistance value RD to be selected. It is to be noted that the pieces of information [001], [011], [101], and [111] are provided as the signal P_VPGM_E, and the pieces of information [000], [010], [100], and [110] are provided as the signal P_VPGM_O.

Furthermore, each of a signal SEL_WLE and a signal SEL_WL0 includes 1-bit information. That is, a bit signal output as the signal SEL_WLO or the signal SEL_WLE is a bit signal "0" or "1". Moreover, for example, the signal SEL_WLE outputs "1" when the word line WL(2l) is selected as a selected word line, and the signal SEL_WLO outputs "1" when the word line WL(2l+1) is selected as the same.

Additionally, each of the AND circuits 124, 126, and 128 executes an AND arithmetic operation of the signal P_VPGM_E and the signal SEL_WLE. Further, each of the AND circuits 125, 127, and 129 executes an AND arithmetic operation of the signal P_VPGM_O and the signal SEL_WLO. That is, the AND circuit 124 executes the AND arithmetic operation of the most significant bit of the signal P_VPGM_E and the signal SEL_WLE. The AND circuit 126 executes the AND arithmetic operation of an medium-order bit of the signal P_VPGM_E and the signal SEL_WLE. The AND circuit 128 executes the AND arithmetic operation of the least significant bit of the signal P_VPGM_E and the signal SEL_WLE.

The AND circuit 125 executes the AND arithmetic operation of the most significant bit of the signal P_VPGM_O and the signal SEL_WLO. The AND circuit 127 executes the AND arithmetic operation of a medium-order bit of the signal P_VPGM_O and the signal SEL_WLO. The AND circuit 129 executes the AND arithmetic operation of the least significant bit of the signal P_VPGM_O and the signal SEL_WLO.

The OR circuit 121 executes an OR arithmetic operation of an arithmetic operation result supplied from the AND circuit 124 and an arithmetic operation result fed from the AND circuit 125. The OR circuit 122 executes an OR arithmetic operation of an arithmetic operation result supplied from the AND circuit 126 and an arithmetic operation result fed from the AND circuit 127. The OR circuit 123 executes an OR arithmetic operation of an arithmetic operation result supplied from the AND circuit 128 and an arithmetic operation result fed from the AND circuit 129. The decoder 120 decodes the respective signals supplied from the OR circuits 121 to 123. Additionally, the decoder 120 outputs a signal PARAM_VPGM based on a result of this decoding.

In the above-described configuration, when a selected word line WL is an odd-numbered word line and bit signals supplied from the OR circuit 121 to 123 have [000], the decoder 120 outputs "0" as a decoding result. That is, PARAM_VPGM[0] is provided, and the resistance value RD of the resistance group 83 becomes RD0.

Likewise, when a selected word line WL is an even-numbered word line and bit signals supplied from the OR circuits 121 to 123 include [001], "1" is output as a decoding result. Therefore, PARAM_VPGM[1]="H" is provided, and the resistance value RD of the resistance group 83 is (RD0+RD1).

Likewise, the resistance value RD when the selected word line WL is an odd-numbered word line is as follows. That is, when [010] is output as the bit signals supplied from the OR circuits 121 to 123, an output from the decoder 120 as a decoding result is "2". Therefore, PARAM_VPGM[2]="H" is provided, and the resistance value RD of the resistance group 83 is (RD0+RD1+RD2). When [100] is output as the bit signals supplied from the OR circuits 121 to 123, an output from the decoder 120 as a decoding result is "4". Therefore, PARAM_VPGM[4]="H" is provided, and the resistance value RD of the resistance group 83 is (RD0+RD1+RD2+RD3+RD4).

When the bit signals supplied from the OR circuits 121 to 123 correspond to [110], an output from the decoder 90 as a decoding result is "6". Therefore, PARAM_VPGM[6]="H" is provided, and the resistance value RD of the resistance group 83 is (RD0+RD1+RD2+RD3+RD4+RD5+RD6).

Further, the resistance value RD when the selected word line WL is an even-numbered word line is as follows. That is, when [011] is output as the bit signals supplied from the OR circuit 121 to 123, an output from the decoder 120 as a decoding result is "3". Therefore, PARAM_VPGM[3]="H" is provided, and the resistance value RD of the resistance group 123 is (RD0+RD1+RD2+RD3).

When the bit signals supplied from the OR circuits 121 to 123 correspond to [101], the decoder 120 outputs "5" as a decoding result. Therefore, PARAM_VPGM[5]="H" is provided, and the resistance value RD of the resistance group 83 is (RD0+RD1+RD2+RD3+RD4+RD5). Furthermore, when the bit signals supplied from the OR circuits 121 to 123 correspond to [111], the decoder 120 outputs "7" as a decoding result. Therefore, PARAM_VPGM[7]="H" is provided, and the resistance value RD of the resistance group 83 is (RD0+RD1+RD2+RD3+RD4+RD5+RD6+RD7). That is, when the selected word line WL is the word line WL(2l+1), i.e., when the word line WL has the line width L2, any one of the signals PARAM_VPGM[0], [2], [4], and [6] is set to the "H" level, and the resistance value RD is fixed based on the determined PARAM_VPGM. Furthermore, when the selected word line WL is the word line WL(2l), i.e., when the word line WL has the line width L1, any one of the signals PARAM_VPGM[1], [3], [5], and [7] is set to the "H" level, and the resistance value RD is fixed based on the determined PARAM_VPGM.

<Flow of Operation of High-Voltage Generation Circuit 9>

An operation of the high-voltage generation circuit 9 including the generation unit 84 will now be described with reference to FIG. 52. FIG. 52 is a flowchart showing a flow of generating the write voltage VPGM at the time of a data write operation by the high-voltage generation circuit 9 and the generation unit 84 included in the high-voltage generation circuit 9.

First, the generation unit 84 sets m=3 to perform generation starting from the lowest write voltage VPGM at the time of the data write operation (a step S0). Then, the generation unit 84 judges whether the word line WL to which the write voltage VPGM is applied is an even-numbered word line or an odd-numbered word line based on an address signal supplied from a non-illustrated address circuit.

As a result, when it is determined that the address signal supplied from the address circuit is a signal indicating that the selected word line WL is an odd-numbered word line (YES, S1), the generation unit 84 generates the signal PARAM_VPGM[t] where t=(2m+1). If m=3, t=2·3+1=7 is achieved, PARAM[7] is output. That is, the generation unit 84 executes the AND arithmetic operation and the OR arithmetic operation with respect to "1" output as the signal SEL_WL0 and [111] output as the signal P_VPGM_O and decodes the arithmetic operation results by using the decoder 120, thereby outputting an "H" level signal to the gate of the MOS transistor 114. As a result, the resistance value RD of the resistance group 83 is determined as (RD0+RD1+RD2+RD3+RD4+RD5+RD6+RD7).

As a result of the step S2, the comparator 81 compares the voltage VMON at the node N41 based on a voltage drop caused due to the resistance value RD with the reference voltage Vref, and outputs the "H" level as the signal EN_CP to the charge pump 80 in such a manner that the voltage VMON coincides with the reference voltage Vref. As a result, the write voltage VPGM at the node N40 is set to a voltage Vprg2. Further, the high-voltage generation circuit 9 transfers the write voltage VPGM set to the voltage Vprg2 to the row decoder 3 (S3).

Thereafter, the control unit 2 confirms whether data has been written in the memory cell transistor MT including the control gate connected with the selected word line WL. When writing has been completed (YES, S4), the high-voltage generation circuit 9 terminates transfer of the write voltage VPGM to the selected word line WL.

Further, when the control unit 2 determines that data has not been written with the write voltage Vprg2 at a step S4 (NO, S4), it instructs the generation unit 84 to confirm m=0. As a result, when m=0 (YES, S5), the high-voltage generation circuit 9 terminates transfer of the write voltage VPGM to the selected word line WL.

When m=0 is not set (NO, S5) at a step S5, the generation unit 84 determines the new m by setting a value obtained by subtracting 1 from a value of the maintained m, i.e., m=(m−1), and the generation unit 84 repeats the operations at the steps S2 and S3 to generate the voltage VPGM higher than V2.

Moreover, when the generation unit 84 determines that the selected word line WL is an even-numbered word line based on the address signal fed from the address circuit (NO, S1), the generation unit 84 determines t=(2m−1) and generates the signal PARAM_VPGM. Since m=3 is provided at the step S, t=2·3=6 is achieved, and hence PARAM[6] is output. That is, the generation unit 64 executes the AND arithmetic operation and the OR arithmetic operation with respect to "1" output as the signal SEL_WLE and [110] output as the signal P_VPGM_E and decodes arithmetic operation results by using the decoder 120, thereby outputting the "H" level signal to the gate of the MOS transistor 113. As a result, the resistance value RD of the resistance group 83 is determined as (RD0+RD1+RD2+RD3+RD4+RD5+RD6) (S6).

As a result of the step S6, the comparator 81 compares the voltage VMON at the node N41 based on a voltage drop caused due to the resistance value D with the reference voltage Vref and outputs the "H" level as the signal EN_CP to the charge pump 80 in such a manner that the voltage VMON coincides with the reference voltage Vref. As a result, the write voltage VPGM at the node N40 is set to a voltage Vprg1. Furthermore, the high-voltage generation circuit 9 transfers the write voltage VPGM set to the voltage Vprg1 to the row decoder 3 (S3).

Thereafter, the control unit 2 including the high-voltage generation circuit 9 repeats the operations of the steps S4 to S6 until m=0 is reached, and confirms whether data has been written in the memory cell transistor MT including the control gate connected with the selected word line WL. That is, when writing is terminated (YES, S4), the high-voltage generation circuit 9 terminates transfer of the write voltage VPGM to the selected word line WL.

<Voltage VPGM Output from High-Voltage Generation Circuit 9>

Figure 53:
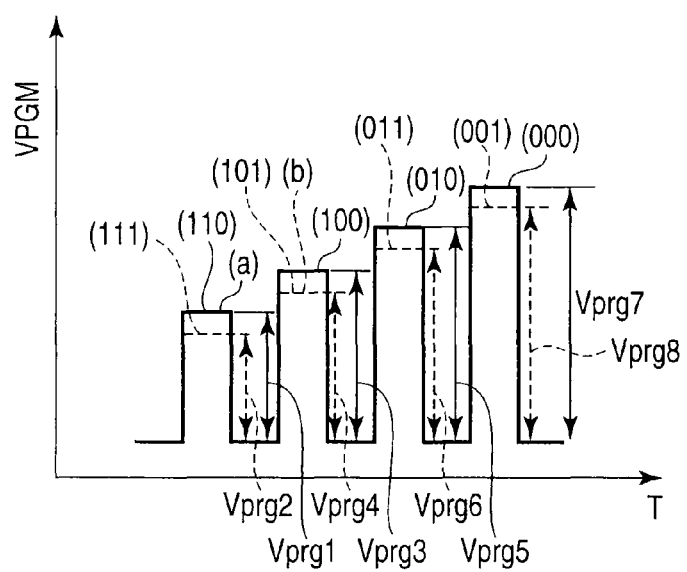
FIG. 53 is a time chart showing a write voltage output from the high-voltage generation circuit included in the semiconductor memory device according to the fourth embodiment.

FIG. 53 shows a time chart of the write voltage VPGM output from the high-voltage generation circuit 9 when the generation unit 84 changes the resistance value RD of the resistance group 83. FIG. 53 is a graph in which a solid line indicates a write voltage VPGM_O (A in the drawing) which is applied to the odd-numbered word line WL(2l+1) and a broken line indicates a write voltage VPGM_E (B in the drawing) which is applied to an even-numbered word line WL(2l).

As indicated by A, the write voltage applied to the word line WL(2l+1) takes values of a voltage Vprg1, a voltage Vprg3, a voltage Vprg5, and a voltage Vprg7 in ascending order. That is, when the bit signal supplied to the decoder 120 corresponds to [110], the write voltage VPGM at the node N40 is the voltage Vprg1. Likewise, when the bit signal corresponds to [100], the write voltage VPGM at the node N40 is the voltage Vprg3. When the bit signal corresponds to [010], the write voltage VPGM at the node N40 is the voltage Vprg5. Moreover, when the bit signal corresponds to [000], the write voltage VPGM at the node N40 is the voltage Vprg7.

Additionally, as indicated by B, the write voltage which is applied to the word line WL(2l) takes values of a voltage Vprg2, a voltage Vprg4, a voltage Vprg6, and a voltage Vprg8 in ascending order. That is, when the bit signal supplied to the decoder 120 corresponds to [111], the write voltage VPGM at the node N40 is the voltage Vprg2. Likewise, when the bit signal corresponds to [101], the write voltage VPGM at the node N40 is the voltage V4. When the bit signal corresponds to [011], the write voltage VPGM at the node N40 is the voltage Vprg6. Further, when the bit signal corresponds to [001], the write voltage VPGM at the node N40 is the voltage Vprg8. That is, as the resistance value RD of the resistance group 83 increases, it is possible to reduce a pumping amount which is required for the charge pump 80 to increase the write voltage with respect the connection node 40 in such a manner that a voltage difference between the voltage VMON at the node N41 and the reference voltage Vref can be eliminated. That is, a value of the write voltage VPGM is lowered.

Contrary, as the resistance value RD of the resistance group 83 is reduced, a pumping amount of the charge pump 30 required to increase the write voltage VPGM with respect to the connection node 40 in such a manner that a voltage difference between the voltage VMON at the node N41 and the reference voltage Vref is increased. That is, a value of the write voltage VPGM increases.

In the semiconductor memory device according to this embodiment, the high-voltage generation circuit 9 having such a configuration as depicted in each of FIGS. 48 to 50 can generate the write voltages VPGM associated with the small and large line widths L of the word lines WL. That is, such an appropriate write voltage VPGM as shown in the graph of A in FIG. 53 can be applied to the control gate 27 of the memory cell transistor MT having the channel length L2 smaller than the channel length L1 in accordance with the word line WL.

As a result, even if the gate electrode having the line width L2 smaller than the gate electrode having the line width L1 is used, the write voltage VPGM applied to the control gate 27 of this gate electrode can be sufficiently supplied to the gate insulating film 24. That is, at the time of writing data, a sufficient ON/OFF ratio of the memory cell transistor MT can be assured. Further, the ON/OFF ratio in this example is, e.g., a ratio of a minimum current value (which will be referred to as Imin hereinafter) which flows when the bit line BL connected with the memory cell transistor MT and the source line SL enter an electrically conductive state when the voltage is applied to the control gate 27 of the gate electrode of the memory cell transistor MT and a maximum current value (which may be referred to as Imax hereinafter) which flows even in an electrically non-conductive state. That is, cell characteristics become excellent as a value of this ratio (Imin/Imax) increases. Furthermore, in the semiconductor memory device according to this embodiment, since a value of (Imin/Imax) increases, erroneous reading by the sense amplifier 4 can be avoided at the time of reading. Moreover, it is possible to prevent an electric field applied to the gate insulating film 24 from being weakened toward an end portion as compared with a central portion of the gate insulating film.

It is to be noted that the description has been given as to the example where the bit lines BL and the active areas AA do not have various sizes but the word lines WL alone have various sizes in the semiconductor memory device according to this embodiment, but applying the voltage generation circuit 9 enables suppressing a fluctuation in writing due to a variation in characteristics of the memory cell transistors MT at the time of writing data even if the following combinations are adopted. Combinations of the small and large bit lines BL and active areas when the word line WL(2l) has the line width L1 and the word line WL(2l+1) has the line width L2 will now be described hereinafter. It is to be noted that the combinations remain the same even if the word line WL(2l) has the line width L2 and the word line WL(2l+1) has the line width L1, thereby omitting an explanation thereof.

<Combinations of Bit Lines BL and Active Areas AA>

(i) The bit lines BL having the line widths W1 and W2 alone vary.

(ii) The active areas AA having the line widths W3 and W4 alone vary.

(iii) The bit line BL(2j−1)associated with the active area AA2(j−1) having the line width W3 has the line width W1, and the bit line BL(2j−1)associated with the active area AA(2j−1)having the line width W4 has the line width W2.

(iv) The bit line BL2(j−1) associated with the active area AA2(j−1) having the line width W4 has the line width W2, and the bit line BL(2j−1)associated with the active area AA(2j−1)having the line width W3 has the line width W1.

(v) The bit line BL2(j−1) associated with the active area AA2(j−1) having the line width W3 has the line width W2, and the bit line BL(2j−1)associated with the active area AA(2j−1)having the line width W4 has the line width W1.

(vi) The bit line BL2(j−1) associated with the active area AA2(j−1) having the line width W4 has the line width W1, and the bit line BL(2j−1)associated with the active area AA(2j−1)having the line width W3 has the line width W2.

It is to be noted that the description has been given as to the case where the word line WL(2l) has the line width L1 and the word line WL(2l+1) has the line width L2 smaller than the line width L1 in the semiconductor memory device according to this embodiment. However, even if the word line WL(2l) has the line width L2 and the word line WL(2l+1) has the line width L1, applying the high-voltage generation circuit 9 according to this embodiment is effective. That is, [001], [011], [101], or [111] is set as the signal P_VPGM_E described in conjunction with FIG. 51 so that the resistance value RD of the resistance group 83 is set to any one of PARAM_VPGM[1], [3], [5], and [7] when the word line WL(2l+1) is selected. Contrary, [000], [010], [100], or [110] can be set as the signal P_VPCM_E described in conjunction with FIG. 51 so that the resistance value RD of the resistance group 63 is set to any one of PARAM_VPGM[0], [2], [4], and [6] when the word line WL(2l) is selected.

It is to be noted that the high-voltage generation circuit 9 according to this embodiment can be applied to not only a technique that uses the Damascene method after forming trenches by the sidewall processing technology but a case where the bit lines BL, the active areas AA, and the word lines WL have various large and small line widths. Moreover, the high-voltage generation circuit 9 according to this embodiment can be applied to a case where the plurality of word lines WL are present and small and large intervals between the word lines WL adjacent to each other are repeated.

It is to be noted that the high-voltage generation circuit 9 according to this embodiment can be applied to generation of not only the voltage VPGM which is supplied to a selected word line WL but also the voltage VPASS which is supplied to a non-selected word line WL at the time of writing data. Additionally, it can be likewise applied to VCGR which is supplied to a selected word line WL and the voltage VREAD which is supplied to a non-selected word line WL at the time of reading data.

An example where the high-voltage generation circuit 9 generates the voltage VPASS in place of the voltage VPGM will be first explained. The voltage VPASS is a voltage that turns on the memory cell transistor MT irrespective of data held in the memory cell transistor MT. That is, the voltage VPASS must be a fixed high voltage as different from the step-up voltage VPGM depicted in FIG. 53. That is, the generation unit 84 selects a resistance value of the resistance group 83 to increase the voltage VPASS. That is, when a selected word line WL is the word line WL(2l), the generation unit 84 determines the resistance value RD of the resistance group 83 as, e.g., (RD0+RD1). Further, when a selected word line WL is the word line WL(2l+1), the generation unit 84 determines the resistance value RD of the resistance group 83 as, e.g., RD0. Furthermore, the reference voltage Vref supplied to the regular input terminal of the comparator 81 has an intensity associated with the voltage VPASS.

Incidentally, in regard to the selection method for the resistance value RD, the example where the word line WL(2l) has the line width W1 and the word line WL(2l+1) has the line width W2 has been explained, but the resistance values can be counterchanged when the word lines are formed with the counterchanged line widths. Incidentally, it is good enough for the voltage VPASS output from the high-voltage generation circuit 9 to be a sufficiently high voltage that can turn on the memory cell transistor MT, and hence the resistance value RD selected by the generation unit 84 is not restricted to RD0 or (RD0+RD1) alone.

As explained above, the semiconductor memory device including the NAND type flash memory and the control method thereof according to the fourth embodiment can be applied to the voltage VPASS lower than the voltage VPGM.

Moreover, a description will be given as to a case where the high-voltage generation circuit 9 generates the voltage VCGR and the voltage VREAD in place of the voltage VPGM. As explained above, since the voltage VREAD is a voltage that turns on the memory cell transistor MT irrespective of data held in the memory cell transistor MT, it must be a fixed high voltage like the voltage VPASS. That is, the generation unit 84 selects a resistance value of the resistance group 83 to increase the voltage BREAD. Namely, when a selected word line WL is the word line WL(2l), the generation unit 84 determines the resistance value RD of the resistance group 83 as, e.g., (RD0+RD1). Furthermore, when a selected word line WL is the word line (2l+1), the generation unit 84 determines the resistance value RD of the resistance group 83 as, e.g., RD0. Moreover, when a selected word line WL is the word line (2l+1), the generation unit 84 determines the resistance value RD of the resistance group 83 as, e.g., RD0. The reference voltage Vref supplied to the regular input terminal of the comparator 81 has an intensity associated with the voltage VREAD.

Additionally, the voltage VCGR varies in accordance with data which should be read from the memory cell transistor MT. That is, when a selected word line WL is the word line WL(2l), the generation unit 84 sets the resistance value RD of the resistance group 83 to an appropriate value to first generate the low voltage VCGR. Further, when a selected word line WL is the word line (2l+1), the generation unit 84 sets the resistance value RD of the resistance group 83 to an appropriate value, for example. A case where reading data "1" by the memory cell transistor MT associated with, e.g., the word line WL(2l) or the word line WL(2l+1) is desired will now be described with reference to a threshold distribution of the memory cell transistor MT depicted in FIG. 2.

When a selected word line WL is the word line WL(2l), the generation unit 84 determines the resistance value RD as (RD0+RD1+RD2+RD3+RD4+RD5+RD6+RD7) to generate V01 as the voltage VCGR. At this time, when the memory cell transistor MT holds the data "1", the memory cell transistor MT is turned off, and no current flows through the channel region of the memory cell transistor MT. Thus, the generation unit 84 determines the resistance value RD as (RD0+RD1+RD2+RD3+RD4+RD5) in order to generate V12. As a result, the voltage V12 is generated as the voltage VCGR. In this case, when the memory cell transistor MT is turned on, it can be understood that data held in the memory cell transistor MT is the data "1".

Moreover, when a selected word line WL is the word line WL(2l+1), the generation unit 84 determines the resistance value RD as (RD0+RD1+RD2+RD3+RD4+RD5+RD6) to generate V01' higher than V01 as the voltage VCGR. At this time, when the memory cell transistor MT holds the data "1", the memory cell transistor MT is turned off, and no current flows through the channel region of the memory cell transistor MT. Thus, the generation unit 84 determines the resistance value RD as (RD0+RD1+RD2+RD3+RD4) in order to generate V12' higher than V12. As a result, the voltage V12' is generated as the voltage VCGR. In this case, when the memory cell transistor MT is turned on, it can be understood that the data held in the memory cell transistor MT is the data "1". Moreover, the reference voltage Vref supplied to the regular input terminal of the comparator 81 has an intensity associated with the voltage VCGR.

Incidentally, in regard to the selection method for the resistance value RD, the case where the word line WL(2l) has the line width W1 and the word line (2l+1) has the line width W2 has been explained, but the resistance values can be counterchanged when the word lines are formed with the counterchanged line widths.

It is to be noted that the variable resistance elements 70 and 71 connected with the node N4 and the node N10 have been explained in the first embodiment, but resistance elements other than the resistance elements 70 and 71 may be used as long as the resistance values are R_e and R_o, respectively.

It is to be noted that the setting unit includes the logic circuit and the decoder connected with an output end of the logic circuit, and the setting unit sets a value of the second resistance element based on a result obtained from the decoder that has decoded an arithmetic operation result of a first signal input to the logic circuit and a third signal that outputs the H level when the first word line is selected by the row decoder and an arithmetic operation result of a second signal and a fourth signal that outputs the H level when the second word line is selected by the row decoder in order to generate the first voltage or the second voltage in the charge pump.

It is to be noted that the MONOS structure has been described, but a memory cell having an FG type configuration may be used. When the FG type configuration is adopted, a stacked gate includes a floating gate (a conductive layer) formed on a p-type semiconductor substrate through a gate insulating film and a control gate formed on the floating gate through an inter-gate insulating film.

It is to be noted that the configuration where the even-numbered bit line BL2(j−1) has the line width W1 (>W2) and the odd-numbered bit line BL(2j−1) has the line width W2 has been explained as an example in this embodiment, the line widths may be counterchanged. That is, W1<W2 can be achieved. Namely, as the resistance values R_e and R_o of the resistance element 70 and the resistance element 71, appropriate values can be selected in accordance with the line widths W of the bit lines BL.

It is to be noted that the bit line BLn may be assumed to be an odd-numbered bit line and the bit line BL(n−1) may be assumed to be an even-numbered bit line. In this case, the bit line BLn has the line width W2, and the bit line BL(n−1) has the line width W1. It is to be noted that this configuration can be likewise applied to the active areas AAn and AA(n−1).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cells each of which includes a charge storage layer and a control gate and is configured to hold two-or-higher-level data;
signal lines each of which is electrically connected to a gate or one end of a current path of an associated one of the memory cells, the signal lines being provided as pairs of signals lines, the signal lines of each of the pairs being located adjacent to each other and having different line widths; and
a control unit which transfers a voltage applied to each of the signal lines, the voltage varying in accordance with the line width of said each of the signal lines.

2. The device according to claim 1, further including:
a sense amplifier which amplifies and senses data read from each of the memory cells at the time of a read operation; and
wherein the memory cells include: a first memory cell formed on a first active area which is formed in a semiconductor substrate; and a second memory cell formed on a second active area which is adjacent to the first active area,
the signal lines include: a first bit line which is connected with a drain end of the first memory cell and the sense amplifier; and a second bit line which is connected with a drain end of the second memory cell adjacent to the first bit line and the sense amplifier,
a plurality of the first bit line and the second bit line are formed, and
the control unit includes: a first driver circuit which generates a first voltage and transfers a voltage according to the first voltage to the first bit line; and a second driver circuit which generates a second voltage higher than the first voltage and transfers a voltage according to the second voltage to the second bit line.

3. The device according to claim 2, wherein:
the first active area has a first width in a gate width direction, and the second active area has a second width greater than the first width in the gate width direction;
the first bit line has a first line width, and the second bit line has a second line width; and
the first and second driver circuits generate the first voltage and the second voltage without being dependent on the first line width and the second line width, respectively.

4. The device according to claim 2, wherein:
the first active area has a first width in a gate width direction, and the second active area has a second width in the gate width direction, the first width being equal to the second width;
the first bit line has a first line width, and the second bit line has a second line width; and
the first and second driver circuits generate the first voltage and the second voltage in dependence upon the first and second line widths.

5. The device according to claim 4, wherein the first line width is larger than the second line width.

6. The device according to claim 2, wherein the first driver circuit includes: a first current mirror circuit which generates a first current; and a first resistance element which produces a voltage drop associated with the first current and outputs a voltage associated with the voltage drop as the first voltage, and
the second driver circuit includes: a second current mirror circuit which generates a second current; and a second resistance element which has a resistance value different from a resistance value of the first resistance element, produces a voltage drop associated with the second current, and outputs a voltage associated with the voltage drop as the second voltage.

7. The device according to claim 1, further including a row decoder which selects the signal line,
wherein the control unit includes: a generation unit which includes a resistance group, generates as the voltage a first voltage associated with a resistance value of the resistance group or a second voltage higher than the first voltage, and outputs the voltage to the row decoder; and a setting unit which sets a value of the voltage to the first voltage or the second voltage,
the memory cells include: a first memory cell formed on an active area provided in the semiconductor substrate; and a second memory cell having a drain end connected with a source end of the first memory cell,
the signal lines include: a first word line which is connected with a gate of the first memory cell; and a second word line which is connected with a gate of the second memory cell, and the row decoder selects the first word line or the second word line, applies the first voltage to the first word line when the first word line is selected, and applies the second voltage to the second word line when the second word line is selected.

8. The device according to claim 7, wherein the generation unit includes:

a first resistance element which has one end connected with a first node and the other end connected with a second node;

a second resistance element which has one end connected with the second node, the other end connected with a third node, and a variable resistance value;

a comparator which compares a potential at the second node with a reference potential; and a charge pump which generates in the first node a voltage associated with a voltage drop in the second resistance element as the first voltage or the second voltage based on a comparison result obtained from the comparator, wherein the setting unit controls a resistance value of the second resistance element to generate the first voltage or the second voltage in the charge pump.

9. The device according to claim 8, wherein the second resistance element includes: a plurality of resistance elements which are connected in series; and switch elements each of which is connected with either the one end or the other end of the resistance element and configured to be grounded, and the setting unit includes:

an arithmetic operation unit which executes an arithmetic operation with respect to a first signal that is used to generate the first voltage and a second signal that is used to generate the second voltage, and outputs a result of the arithmetic operation; and a decoder which decodes the result of the arithmetic operation and is configured to turn on any one of the switch elements in accordance with a result of the decoding.

10. The device according to claim 9, wherein, when the switch elements are sequentially turned on, the charge pump changes the first voltage and the second voltage in a step-up pattern.

11. The device according to claim 2, further comprising:

a first MOS transistor and a second MOS transistor each of which includes a current path having ends one of which is connected with the sense amplifier and the other of which is connected with any one of the signal lines, wherein:

the first driver circuit supplies the first voltage to a gate of the first MOS transistor; and the second driver circuit supplies the second voltage to a gate of the second MOS transistor.

12. The device according to claim 7, wherein the first word line has a first line width and the second word line has a second line width larger than the first line width.

13. A semiconductor memory device comprising:

a first memory cell which is formed on a semiconductor substrate in a first active area and includes a charge storage layer and a control gate;

a second memory cell which is formed on a second active area adjacent to the first active area and includes a charge storage layer and a control gate;

a first bit line which has one end connected with one end of a current path of the first memory cell, and is configured to transfer data;

a second bit line which is adjacent to the first bit line, has one end connected with one end of a current path of the second memory cell, and is configured to transfer the data;

a sense amplifier which is configured to transfer the data to the first and second memory cells through the first and second bit lines or configured to read the data held in the first and second memory cells;

a first driver circuit which generates a first voltage and transfers a voltage according to the first voltage to the first bit line; and a second driver circuit which generates a second voltage higher than the first voltage and transfers a voltage according to the second voltage to the second bit line.

14. The device according to claim 13, wherein:

the first active area has a first width in a gate width direction, and the second active area has a second width larger than the first width in the gate width direction;

the first bit line has a first line width, and the second bit line has a second line width; and the first and the second driver circuits generate the first voltage and the second voltage without being dependent on the first line width and the second line width, respectively.

15. The device according to claim 13, wherein:

the first active area has a first width in a gate width direction, and the second active area has a second width in the gate width direction, the first width being equal to the second width;

the first bit line has a first line width, and the second bit line has a second line width; and the first and second driver circuits generate the first voltage and the second voltage in dependence upon the first and second line widths.

16. The device according to claim 15, wherein the first line width is larger than the second line width.

17. The device according to claim 13, wherein the first driver circuit includes: a first current mirror circuit which generates a first current; and a first resistance element which produces a voltage drop associated with the first current and outputs a voltage associated with the voltage drop as the first voltage, and the second driver circuit includes: a second current mirror circuit which generates a second current; and a second resistance element which has a resistance value different from that of the first resistance element, produces a voltage drop associated with the second current, and outputs a voltage associated with the voltage drop as the second voltage.

18. The device according to claim 13, wherein a first MOS transistor has a current path having ends one of which is connected with the other end of the current path of the first bit line and the other of which is connected with the sense amplifier, and a second MOS transistor has a current path having ends one of which is connected with the other end of the current path of the second bit line and the other of which is connected with the sense amplifier.

19. A semiconductor memory device comprising:

a first memory cell which includes a charge storage layer and a first control gate and is configured to hold 2 or more levels in accordance with a threshold value;

a second memory cell which has a current path connected with the first memory cell in series, includes a charge storage layer and a second control gate and is configured to hold two-or-more-levels in accordance with a threshold value;

a first word line connected with the first control gate;

a second word line connected with the second control gate;

a row decoder which selects the first word line and the second word line, transfers a first voltage to the first word line when the first word line is selected, and transfers a second voltage higher than the first voltage when the second word line is selected; and a control unit which generates the first voltage and the second voltage and transfers the first voltage and the second voltage to the row decoder.

20. The device according to claim 19, wherein the control unit includes: a generation unit which includes a resistance group, generates as a voltage the first voltage associated with a resistance value of the resistance group or the second voltage higher than the first voltage, and outputs the voltage to the row decoder; and a setting unit which sets a value of the voltage to the first voltage or the second voltage.

21. The device according to claim 20, wherein the generation unit includes:

a first resistance element which has one end connected with a first node and the other end connected with a second node;

a second resistance element which has one end connected with the second node, the other end connected with a third node, and a variable resistance value;

a comparator which compares a potential at the second node with a reference potential; and a charge pump which generates in the first node a voltage associated with a voltage drop in the second resistance element as the first voltage or the second voltage based on a comparison result from the comparator, wherein the setting unit controls a resistance value of the second resistance element to generate the first voltage or the second voltage in the charge pump.

22. The device according to claim 21, wherein the second resistance element includes: a plurality of resistance elements each having one end and the other end connected in series; and switch elements each of which is connected with either the one end or the other end of the resistance element and configured to be grounded, and the setting unit includes:

an arithmetic operation unit which executes an arithmetic operation with respect to a first signal that is used to generate the first voltage and a second signal that is used to generate the second voltage, and outputs a result of the arithmetic operation; and a decoder which decodes the result of the arithmetic operation and is configured to turn on any one of the switch elements in accordance with a result of the decoding.

23. The device according to claim 22, wherein, when the switch elements are sequentially turned on, the charge pump changes the first voltage and the second voltage in a step-up pattern.

24. The device according to claim 19, wherein the storage layer and first control gate included in the first memory cell each have a first width in a gate width direction, and the charge storage layer and the second control gate included in the second memory cell each have a second width greater than the first width in the gate width direction.

* * * * *